(12) United States Patent
Badizadegan

(10) Patent No.: US 11,329,655 B1
(45) Date of Patent: *May 10, 2022

(54) FIELD PROGRAMMABLE GATE ARRAY WITH INTERNAL PHASE-LOCKED LOOP

(71) Applicant: HFT Solutions, LLC, New Cannan, CT (US)

(72) Inventor: Nima Badizadegan, Salem, NH (US)

(73) Assignee: HFT Solutions, LLC, New Canaan, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/236,577

(22) Filed: Apr. 21, 2021

Related U.S. Application Data

(63) Continuation of application No. 16/937,309, filed on Jul. 23, 2020, now Pat. No. 11,018,678, which is a continuation of application No. 16/888,218, filed on May 29, 2020, now Pat. No. 10,763,865, which is a continuation of application No. 16/670,702, filed on Oct. 31, 2019, now Pat. No. 10,771,069.

(60) Provisional application No. 62/808,404, filed on Feb. 21, 2019.

(51) Int. Cl.
| | |
|---|---|
| *H03L 7/08* | (2006.01) |
| *H03L 7/085* | (2006.01) |
| *H03M 9/00* | (2006.01) |
| *H03K 19/17736* | (2020.01) |
| *G06F 13/42* | (2006.01) |
| *H04B 1/40* | (2015.01) |

(52) U.S. Cl.
CPC .......... *H03L 7/085* (2013.01); *G06F 13/4291* (2013.01); *H03K 19/1774* (2013.01); *H03M 9/00* (2013.01); *H04B 1/40* (2013.01)

(58) Field of Classification Search
CPC ............. H03L 7/085; H03M 9/00; H04B 1/40
USPC ........................................................ 375/219
See application file for complete search history.

(56) References Cited

U.S. PATENT DOCUMENTS

| | | | |
|---|---|---|---|
| 4,068,188 | A | 1/1978 | Yokoyama |
| 4,745,372 | A | 5/1988 | Miwa |
| 6,675,306 | B1 | 1/2004 | Baxter |
| 7,080,345 | B1 | 7/2006 | Iotov |
| 7,084,709 | B1 | 8/2006 | Leong et al. |
| 7,333,570 | B2 | 2/2008 | Aung et al. |
| 8,467,418 | B2 | 6/2013 | Aweya et al. |
| 9,001,951 | B1 | 4/2015 | Kumpulainen |
| 9,330,740 | B1 | 5/2016 | Baeckler et al. |
| 10,037,568 | B2 | 7/2018 | Taylor et al. |
| 10,169,814 | B2 | 1/2019 | Parsons et al. |
| 10,411,720 | B2 | 9/2019 | Lenzen et al. |
| 10,763,865 | B1 * | 9/2020 | Badizadegan .......... H03L 7/085 |
| 10,826,502 | B1 * | 11/2020 | Badizadegan ........ H03L 7/0812 |

(Continued)

OTHER PUBLICATIONS

Xilinx, "7 Series FPGAs GTX/GTH Transceivers—User Guide," p. 26, available at https://www.xilinx.com/support/documentation/user_guides/ug476_7Series_Transceivers.pdf (Aug. 14, 2018).

(Continued)

*Primary Examiner* — Kevin M Burd
(74) *Attorney, Agent, or Firm* — Amster, Rothstein & Ebenstein LLP

(57) ABSTRACT

The present invention relates to a field programmable gate array system that provides phase control with minimal latency.

30 Claims, 47 Drawing Sheets

(56) References Cited

U.S. PATENT DOCUMENTS

| | | |
|---|---|---|
| 11,128,305 B1 * | 9/2021 | Badizadegan ............ G06F 1/08 |
| 2019/0025413 A1 | 1/2019 | Liu et al. |

OTHER PUBLICATIONS

Sarah Harris, "Timing & Synchronization," Harvey Mudd College Engineering Deparlmnent, p. 24, available at https://cseweb.ucsd.edu/classes/wi06/cse291-b/slide/let4/timingint.pdf (Jan. 31, 2006).

Sam Palermo, "ECEN 720 High-Speed Links: Circuits and Systems—Lab 5," Texas A&M University, p. 5, available at: http://ece.tamu.edu/~spalermo/ecen689/ECEN720_lab5_2017.pdf (2017).

Altera, "Stratix V Device Handbook," vol. 2: Transceivers, Intel, p. 13, available at: https://www.intel.com/content/dam/www/programmable/us/en/pdfs/literature/hb/stralix-v/stx5_xcvr.pdf (Feb. 15, 2017).

Stackexchange, "Phase Frequency Detector in PLL," StackExchange, available at: https://electronics.stackexchange.com/questions/301402/phase-frequency-detector-in-pll (Apr. 24, 2017).

IEEE Standards Association, "IEEE Standards for Ethernet," IEEE 802.3-2018, Section 4, Clauses 49 and 51, Section 6, Clauses 82 and 83, available at: https://standards.ieee.org/standard/802_3-2018.html (Aug. 31, 2018).

Slobodan Milijevic, "The basics of synchronized Ethernet," EE Times-Asia, available at: https://www.microsemi.com/document-portal/doc_view/126475-the-basics-of-synchronized-ethernet-synce.

Maciej Lipinski, et al., "White Rabbit: a PTP Application for Robust Sub-nanosecond Synchronization," 2011 IEEE International Symposium on Precision Clock Synchronization for Measurement, Control and Communication, Munich, pp. 25-30, available at: http://white-rabbit.web.cem.ch/documents/White_Rabbit-a_PTP_application_for_robust_sub-nanosecond_synchronization.pdf (2011).

Floyd M. Gardner, "Phaselock Techniques," Third Edition, Wiley-Interscience, Chapters 1, 4, 9, 10, 11, 13, and 17 (2005).

Jens Twiefel, et al., "Digital signal processing for an adaptive phase-locked loop controller," Proceedings of SPIE—The International Society for Optical Engineering, vol. 6926 (Apr. 2008).

Chen Yao, "Time to Digital Converter used in ALL digital PLL," Master of Science Thesis in System-on-Chip Design, Stockholm (Aug. 2011).

Behzad Razavi, "A Circuit for All Seasons: The StrongARM Latch," IEEE Solid-State Circuits Magazine (Spring 2015).

Ping Lu, et al., "A 2-D GRO Vernier Time-to-Digital Converter with Large Input Range and Small Latency," Lund University—EIT Department, University of Toronto, IEEE Radio Frequency Integrated Circuits Symposium (2013).

Christian Leber, et al. "High Frequency Trading Acceleration using FPGAs," University of Heidelberg, International Conference on Field Programmable Logic and Applications, Germany (2011).

International Telecommunication Union, "Timing and synchronization aspects in packet networks," ITU-T, G.8261/Y.1361, International Telecommunication Union (May 2006).

International Telecommunication Union, "Distribution of timing information through packet networks," ITU-T, G.8264/Y.1364, International Telecommunication Union (Aug. 2017).

IEEE Standards Association, "IEEE Standards for Ethernet," IEEE 802.3-2018, Section 4, Figure 52-4, p. 634 (2018).

\* cited by examiner

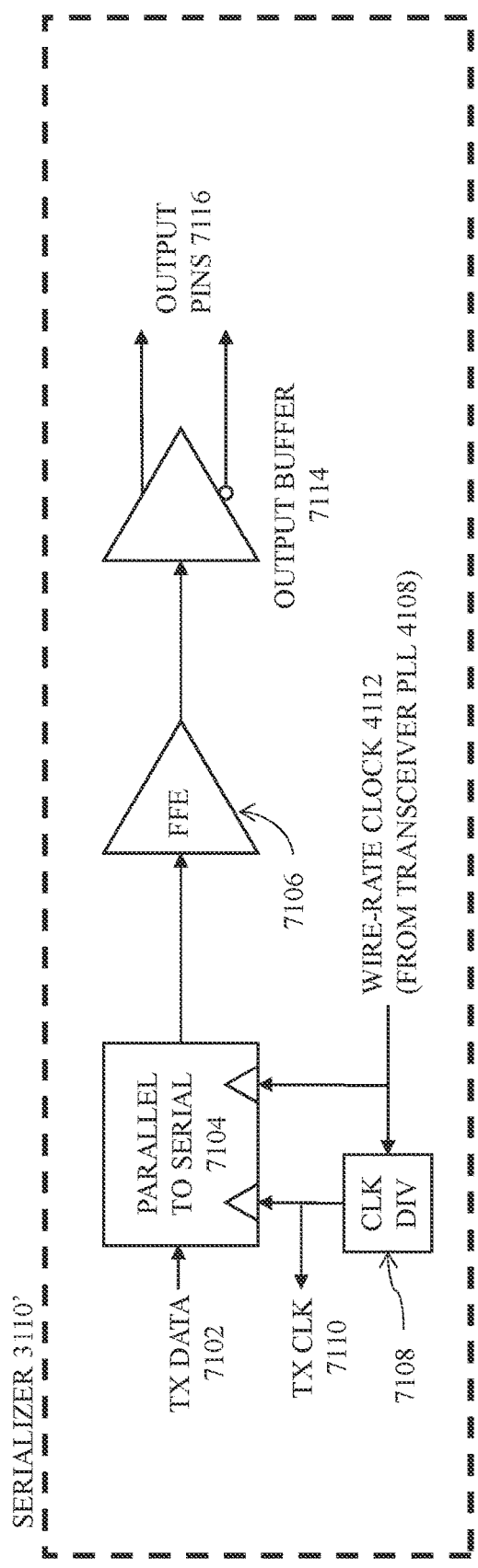
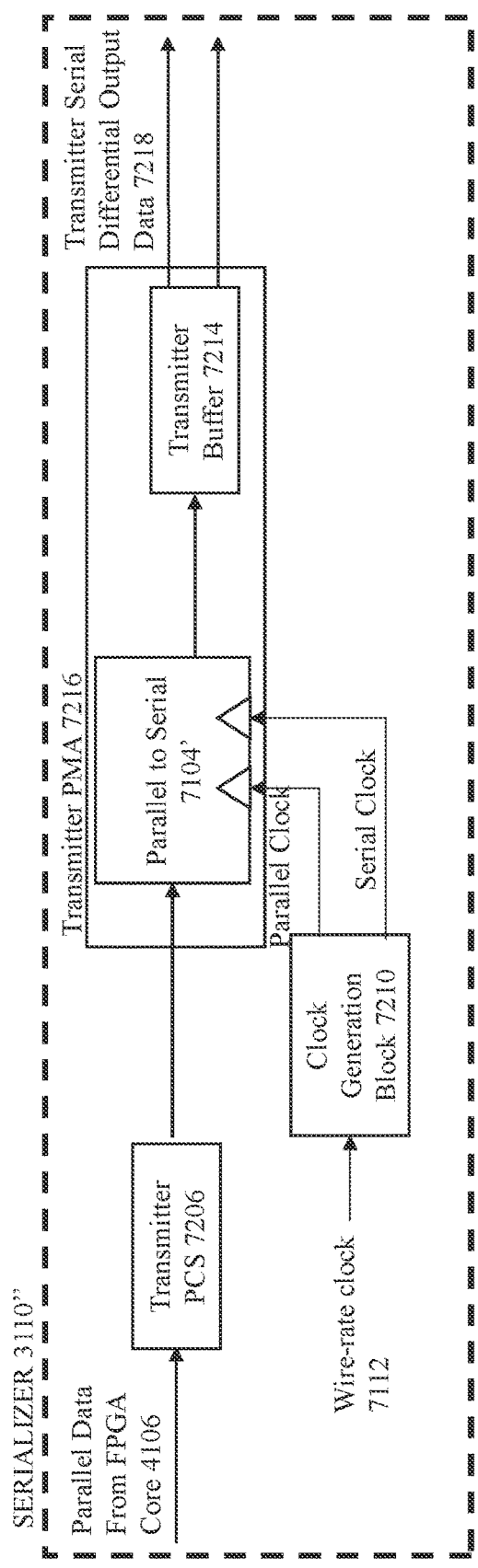
FIG. 7A
FIG. 7B

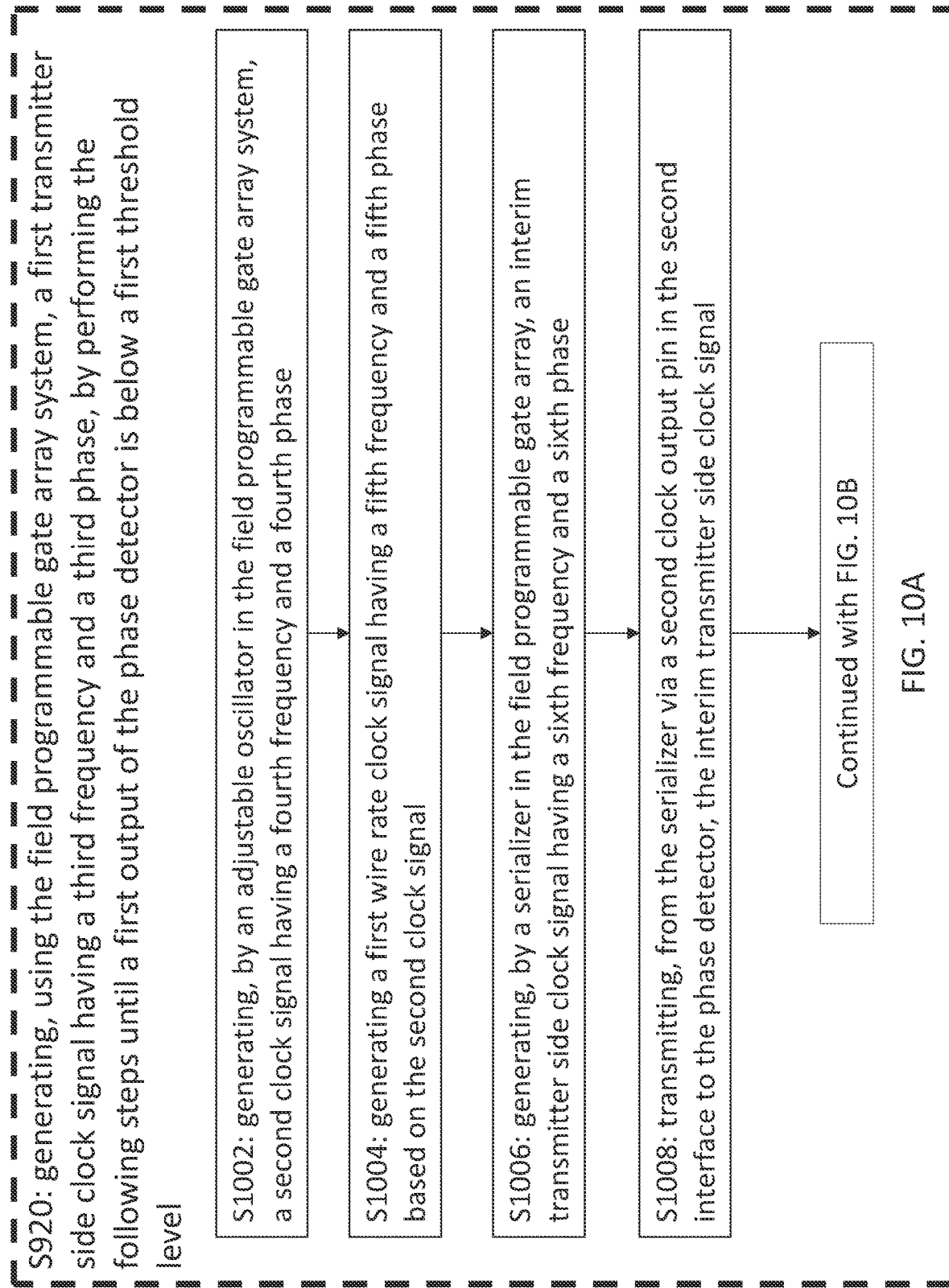

Continued From FIG. 10A

S1010: generating, by the phase detector, the first output based on a comparison of the first receiver side clock signal and the interim transmitter side clock signal S1012: transmit, from the phase detector to a phase controller of the field programmable gate array system, which is placed within the field programmable gate array, the first output S1014: determining, by the phase controller, interim adjustment information based on the first output S1016: transmitting, from the phase controller to the adjustable oscillator, the interim adjustment information, wherein the adjustable oscillator adjusts the second clock signal based on the interim adjustment information and steps S1002 through S1016 are repeated until the first output of the phase detector is below the first threshold level

FIG. 10B

Continued From FIG. 13A

S1310: generating, by the phase detector, the first output based on a comparison of the first receiver side clock signal and the interim transmitter side clock signal S1312: transmit, from the phase detector to a phase controller of the field programmable gate array system, which is placed within the field programmable gate array, the first output S1314: determining, by the phase controller, interim adjustment information based on the first output S1316: transmitting, from the phase controller to the phase lock loop with phase adjustment, the interim adjustment information, wherein the phase lock loop with phase adjustment adjusts the second clock signal based on the interim adjustment information and steps S1302 through S1316 are repeated until the first output of the phase detector is below the first threshold level

FIG. 13B

Continued From FIG. 15A

S1516: transmitting, from the deserializer to the computational circuitry, the first plurality of data streams comprising a first plurality of data items S1518: transmitting, from the deserializer to a phase detector of the field programmable gate array system which is on the field programmable gate array, the first receiver side clock signal, or if the phase detector is not on the field programmable gate array, transmitting, from the deserializer to the phase detector via a first clock output pin on a second interface of the field programmable gate array, the first receiver side clock signal S1520: generating, using the field programmable gate array system, a first transmitter side clock signal having a third frequency and a third phase S1522: transmitting, from the serializer to the computational circuitry, the first transmitter side clock signal S1524: performing, by the computational circuitry, a first set of operations on at least a portion of the first plurality of data items to generate a second plurality of parallel data streams Continued with FIG. 15C

FIG. 15B

Continued From FIG. 16A

S1610: generating, by the phase detector, the first output based on a comparison of the first receiver side clock signal and the interim transmitter side clock signal S1612: transmit, from the phase detector to a phase controller of the field programmable gate array system, which is placed within the field programmable gate array, the first output S1614: determining, by the phase controller, interim adjustment information based on the first output S1616: transmitting, from the phase controller to the adjustable transceiver phase lock loop, the interim adjustment information, wherein the adjustable transceiver phase lock loop adjusts the second clock signal based on the interim adjustment information and steps S1602 through S1616 are repeated until the first output of the phase detector is below the first threshold level

FIG. 16B

FIELD PROGRAMMABLE GATE ARRAY WITH INTERNAL PHASE-LOCKED LOOP

REFERENCE TO RELATED APPLICATIONS

This application is a continuation of U.S. patent application Ser. No. 16/937,309, filed on Jul. 23, 2020 and entitled FIELD PROGRAMMABLE GATE ARRAY WITH INTERNAL PHASE-LOCKED LOOP, which is a continuation of U.S. patent applicant Ser. No. 16/888,218, filed on May 29, 2020 and entitled "FIELD PROGRAMMABLE GATE ARRAY WITH INTERNAL PHASE-LOCKED LOOP," which in turn is a continuation of U.S. patent application Ser. No. 16/670,702, filed on Oct. 31, 2019 and entitled "FIELD PROGRAMMABLE GATE ARRAY WITH INTERNAL PHASE-LOCKED LOOP," which claims the benefit of and priority to U.S. Provisional Patent Application No. 62/808,404, filed on Feb. 21, 2019 and entitled FIELD PROGRAMMABLE GATE ARRAY WITH INTERNAL PHASE-LOCKED LOOP, the contents of all of which are incorporated by reference herein in their entirety.

FIELD

The present invention generally relates to a field programmable gate array system. In embodiments, the present invention generally relates to a field programmable gate array and an external or internal phase controller providing phase matching between a receiver clock and a transmitter clock used in the field programmable gate array.

BACKGROUND

Field programmable gate arrays (FPGAs) may be used in applications that require fast processing since FPGAs allow for all computations to occur on a single chip that has massive fine-grained parallelism. For example, FPGAs are used in the financial industry in high frequency trading where the rapid processing of the FPGA is desired. One technological problem with FPGAs is that there is a need to synchronize receiving side and transmitting side clock signals within the FPGA.

The prior art sought to address this problem by including a clock domain crossing circuit in the FPGA. However, these circuits inherently add a delay to the processing that takes place in the FPGA, which is not desirable since high frequency trading may include timestamps that are accurate to the microsecond such that even small delays may present a large problem.

Synchronous Ethernet systems were designed with the similar goal of synchronizing a transmitter to a receiver. However, since phase alignment in synchronous Ethernet is not necessary, synchronous Ethernet FPGA systems usually do not phase-align the receiver and transmitter sides of a link. The received clock is output from the transceiver to an external clock generation circuit to be used as its frequency reference. As a result, there is no measurement of the internal transmit clock at all by the Ethernet FPGA system.

While a synchronous Ethernet system with an internal PLL compares the transmit clock to the receive clock, its phase-frequency detector in the internal PLL is configured to measure accurately only the frequency but does not have to measure the phase of the two clocks accurately. In addition, synchronized protocols of the synchronous Ethernet system use simpler control loops that do not have to compensate for a lot of wander or jitter. Accordingly, the phase of the clocks is not treated as important as frequency by the synchronous Ethernet FPGA system. Based on these reasons, synchronous Ethernet FPGA systems do not provide a desirable solution to a technological problem of synchronizing receiving side and transmitting side clock signals within the FPGA.

Accordingly, a technical problem is presented in FPGAs in that phase synchronization between the receiver side clock and the transmitter side clock will introduce unwanted latency that results in delay of processing. Accordingly, it would be beneficial to provide an FPGA system that avoids these problems and provides sub-microsecond processing with throughput of at least 10 Gbps. In embodiments, the sub-microsecond processing throughput may be: 10-25 Gbps, 22-33 Gbps, 33-45 Gbps, 45-60 Gbps, 60-80 Gbps, 80-120 Gbps, to name a few.

SUMMARY

An object of the present invention is to address technological challenges that currently exist in phase matching receiver side and transmitter side clocks of a FPGA without introducing unnecessary delay in processing.

This and other objects shall be addressed by embodiments of the present invention as set forth herein.

The present invention generally relates to a field programmable gate array system and a method for processing a data stream using a field programmable gate array system. In embodiments, the present invention generally relates to a field programmable gate array and an external or internal phase controller providing phase matching between a receiver clock and a transmitter clock used in the field programmable gate array.

More particularly, the present invention relates to a field programmable gate array system includes (a) a field programmable gate array comprising (1) a first interface including: (A) a first reference clock pin, wherein said first reference clock pin is configured to receive a first clock signal having a first frequency and a first phase; (B) a second reference clock pin, wherein said second reference clock pin is configured to receive a second clock signal having a second frequency and a second phase; (C) a first plurality of data pins, wherein said first plurality of data pins is configured to receive a first serial data stream; (D) a second plurality of data pins, wherein said second plurality of data pins is configured to transmit a second serial data stream; (2) a deserializer operationally connected to: (x) the first reference clock pin to receive as a first input the first clock signal and (y) the first plurality of data pins to receive as a second input the first serial data stream, and wherein the deserializer is configured to: (A) convert the first serial data stream into a first plurality of parallel data streams having a first amount of data streams, and (B) generate a first receiver side clock signal based on the first clock signal, wherein the first receiver side clock signal has a third frequency and a third phase; and (C) transmit the first plurality of parallel data streams and the first receiver side clock signal within the field programmable gate array; (3) computational circuitry operationally connected to the deserializer to receive the first plurality of parallel data streams and the first receiver side clock signal, wherein the computational circuitry is configured to perform a first set of operations on the first plurality of parallel data streams to generate a second plurality of parallel processed data streams having a second amount of data streams; (4) a serializer operationally connected to: (x) the second reference clock pin to receive as a third input a first wire rate clock signal based on the second clock signal, wherein the first wire rate clock signal has a fourth frequency and a fourth phase; (y) the second plurality of data pins to transmit as a first output the second serial data stream; (z) the computational circuitry, wherein the serializer receives the second plurality of parallel processed data streams from the computational circuitry and the serializer transmits to the computational circuitry a first transmitter side clock signal including a fifth frequency and a fifth phase; and wherein the serializer is configured to: (A) convert the second plurality of parallel processed data streams into the second serial data stream; (B) generate the first transmitter side clock signal based on the first wire rate signal, wherein the first transmitter side clock signal has the fifth frequency and the fifth phase, wherein the fifth frequency is different than and less than the fourth frequency; and (C) transmit the second serial data stream to the second plurality of data pins for transmission off the field programmable gate array; (5) a second interface including: (A) a first clock output pin configured to transmit the first receiver side clock signal, wherein the first clock output pin is operationally connected to the deserializer; and (B) a second clock output pin configured to transmit the first transmitter side clock signal, wherein the second clock output pin is operationally connected to the serializer; and (b) a phase control circuit, provided at least partially on the field programmable gate array, wherein the phase control circuit includes: (1) a phase detector operationally connected to the first clock output pin and the second clock output pin of the second interface of the field programmable gate array, and wherein the phase detector is configured to compare the third phase of the first receiver side clock signal to the fifth phase of the transmitter side clock signal and to generate a phase difference indicator signal based on a difference between the third phase of the first receiver side clock signal and the fifth phase of the transmitter side clock signal; (2) a phase controller operationally connected to the phase detector and configured to receive the phase difference indicator signal, and wherein the phase controller is configured to determine adjustment information based on the phase difference indicator signal; and (3) an adjustable oscillator operationally connected to the phase controller and configured to receive the adjustment information as well as operationally connected to the second reference clock pin of the first interface of the field programmable gate array, wherein the adjustable oscillator is configured to generate the second clock signal including the second frequency and the second phase based on the adjustment information and transmit the second clock signal to the second reference clock pin of the first interface of the field programmable gate array; wherein the transmitter side clock signal and the first receiver side clock signal are phase aligned so that there is a fixed phase difference between the third phase and the fifth phase.

In embodiments, the third frequency corresponds to the first frequency.

In embodiments, the third phase is not aligned with the first phase.

In embodiments, the third frequency is different than the first frequency.

In embodiments, the first set of operations does not include clock domain crossing operations that delays processing of the first set of parallel data streams. In embodiments, the adjustment information is used to do at least one of the following (i) set a bias to an oscillator; (ii) to set a divider ratio; and (iii) to set a delay.

In embodiments, the first set of operations includes an arithmetic operation. In embodiments, the first set of operations includes a logical operation. In embodiments, the first set of operations includes a pipeline operation. In embodiments, the first set of operations includes a memory access operation.

In embodiments, the first amount of data streams is the same as the second amount of data streams.

In embodiments, the first amount of data streams and the second amount of data streams are equal to eight (8) data streams. In embodiments, the first amount of data streams and the second amount of data streams are equal to ten (10) data streams. In embodiments, the first amount of data streams and the second amount of data streams are equal to sixteen (16) data streams. In embodiments, the first amount of data streams and the second amount of data streams are equal to twenty (20) data streams. In embodiments, the first amount of data streams and the second amount of data streams are equal to thirty-two (32) data streams. In embodiments, the first amount of data streams and the second amount of data streams are equal to forty (40) data streams. In embodiments, the first amount of data streams and the second amount of data streams are equal to sixty-four (64) data streams. In embodiments, the first amount of data streams and the second amount of data streams are equal to eighty (80) data streams. In embodiments, the first amount of data streams and the second amount of data streams are equal to one hundred twenty-eight (128) data streams. In embodiments, the first amount of data streams and the second amount of data streams are equal to one hundred sixty (160) data streams.

In embodiments, the first amount of data streams and the second amount of data streams are equal to two (2) to the power of N, where N is an integer. In embodiments, the first amount of data streams and the second amount of data streams are equal to ten (10) times two (2) to the power of N, where N is an integer. In embodiments the first amount of data streams and the second amount of data streams are equal to thirty-three (33) times two (2) to the power of N, where N is an integer.

In embodiments, the field programmable gate array further includes a phase lock loop configured to: receive the second clock signal, as a fourth input, to generate the first wire rate clock signal; and (B) transmit the first wire rate clock signal as the third input, to the serializer.

In embodiments, the fourth frequency is equal to x times the fifth frequency, where x is the second amount of data streams.

In embodiments, the fourth frequency is equal to x times the fifth frequency, where x is half of the second amount of data streams.

In embodiments, the fourth frequency is a rational multiple of the second frequency.

In embodiments, the phase difference indicator signal is a pulse signal.

In embodiments, the adjustment information indicates a desired phase. In embodiments, the adjustment information indicates a desired frequency. In embodiments, the adjustment information indicates a change in phase. In embodiments, the adjustment information indicates a change in frequency. In embodiments, adjustment information comprises a voltage. In embodiments, adjustment information comprises a digital transmission. In embodiments adjustment information further comprises a digital transmission.

In some embodiments, the first serial data stream comprises market data, the second serial data stream comprises order entry data, and the first operation comprises a trading algorithm.

In embodiments, the trading algorithm includes the steps of: (a) parsing market data; (b) performing mathematical operations at a portion of the market data; and (c) generating order packets using at least an output of (b).

In embodiments, the first serial data stream includes market data and the second serial stream includes trading data.

In embodiments, the field programmable gate array includes a transceiver phase locked loop operatively connected between the to the serializer and the first reference clock pin.

In embodiments, the transceiver phase locked loop operatively connected between the serializer and the first reference clock pin includes a second adjustable oscillator to provide the first wire rate signal.

In embodiments, a second adjustable oscillator is provided outside of the transceiver phase locked loop and operatively connected to the serializer.

In embodiments, the second adjustable oscillator is programmable with a desired delay.

In embodiments, the desired delay is a constant value

In embodiments, the constant value is zero.

In embodiments, the adjustment information is provided to the second adjustable oscillator to provide the first wire rate signal.

The present invention also relates to a field programmable gate array system comprising (a) a field programmable gate array comprising (1) a first interface comprising (A) a first reference clock pin, wherein said first reference clock pin is configured to receive a first clock signal having a first frequency and a first phase; (B) a second reference clock pin, wherein said second reference clock pin is configured to receive a second clock signal having a second frequency and a second phase; (C) a first plurality of data pins, wherein said first plurality of data pins is configured to receive a first serial data stream; (D) a second plurality of data pins, wherein said second plurality of data pins is configured to transmit a second serial data stream; (2) a deserializer operationally connected to (A) the first reference clock pin to receive as a first input the first clock signal and (B) the first plurality of data pins to receive as a second input the first serial data stream, and wherein the deserializer is configured to (A) convert the first serial data stream into a first plurality of parallel data streams having a first amount of data streams, and (B) generate a first receiver side clock signal based on the first clock signal, wherein the first receiver side clock signal has a third frequency and a third phase; and (C) transmit the first plurality of parallel data streams and the first receiver side clock signal within the field programmable gate array; (3) computational circuitry operationally connected to the deserializer to receive the first plurality of parallel data streams and the first receiver side clock signal, wherein the computational circuitry is configured to perform a first set of operations on the first plurality of parallel data streams to generate a second plurality of parallel processed data streams having a second amount of data streams; (4) a serializer operationally connected to (A) a transceiver phase lock loop to receive as a third input a first wire rate clock signal based on the second clock signal, wherein the first wire rate clock signal has a fourth frequency and a fourth phase; (B) the second plurality of data pins to transmit as a first output the second serial data stream; (C) the computational circuitry, wherein the serializer receives the second plurality of parallel processed data streams from the computational circuitry and the serializer transmits to the computational circuitry a first transmitter side clock signal including a fifth frequency and a fifth phase; and wherein the serializer is configured to (A) convert the second plurality of parallel processed data streams into the second serial data stream; (B) generate the first transmitter side clock signal based on the first wire rate signal, wherein the first transmitter side clock signal has the fifth frequency and the fifth phase, wherein the fifth frequency is different than and less than the fourth frequency; and (C) transmit the second serial data stream to the second plurality of data pins for transmission off the field programmable gate array; (5) a second interface comprising (A) a first clock output pin configured to transmit the first receiver side clock signal, wherein the first clock output pin is operationally connected to the deserializer; and (B) a second clock output pin configured to transmit the first transmitter side clock signal, wherein the second clock output pin is operationally connected to the serializer; and (b) a phase control circuit, provided at least partially on the field programmable gate array, wherein the phase control circuit comprises (1) a phase detector operationally connected to the first clock output pin and the second clock output pin of the second interface of the field programmable gate array, and wherein the phase detector is configured to compare the third phase of the first receiver side clock signal to the fifth phase of the transmitter side clock signal and to generate a phase difference indicator signal based on a difference between the third phase of the first receiver side clock signal and the fifth phase of the transmitter side clock signal; (2) a phase controller operationally connected to the phase detector and configured to receive the phase difference indicator signal, and wherein the phase controller is configured to determine adjustment information based on the phase difference indicator signal; and (3) an adjustable oscillator operationally connected to the phase controller and configured to receive the adjustment information as well as operationally connected to the second reference clock pin of the first interface of the field programmable gate array, wherein the adjustable oscillator is configured to generate the second clock signal including the second frequency and the second phase based on the adjustment information and transmit the second clock signal to the second reference clock pin of the first interface of the field programmable gate array, wherein the transmitter side clock signal and the first receiver side clock signal are phase aligned so that there is a fixed phase difference between the third phase and the fifth phase.

In embodiments, the third frequency corresponds to the first frequency.

In embodiments, the third phase is not aligned with the first phase.

In embodiments, the third frequency is different than the first frequency.

In embodiments, the first set of operations does not include clock domain crossing operations that delays processing of the first set of parallel data streams.

In embodiments, the first set of operations includes at least one of the following: (i) an arithmetic operation; (ii) a logical operation; (iii) a pipeline operation; and (iv) a memory access operation.

In embodiments, the first amount of data streams is the same as the second amount of data streams.

In embodiments, the first amount of data streams and the second amount of data streams are equal to one of the following: (i) eight (8) data streams; (ii) ten (10) data streams; (iii) sixteen (16) data streams; (iv) twenty (20) data streams; (v) thirty-two (32) data streams; (vi) forty (40) data streams; (vii) sixty-four (64) data streams; (viii) eighty (80) data streams; (ix) one hundred twenty-eight (128) data streams; and (x) one hundred sixty (160) data streams.

In embodiments, the first amount of data streams and the second amount of data streams are equal to two (2) to the power of N, where N is an integer.

In embodiments, the first amount of data streams and the second amount of data streams are equal to ten (10) times two (2) to the power of N, where N is an integer.

In embodiments, the first amount of data streams and the second amount of data streams are equal to thirty-three (33) times two (2) to the power of N, where N is an integer.

In embodiments, the transceiver phase lock loop is operationally connected to the second reference clock pin and is configured to: (A) receive the second clock signal, as a fourth input, to generate the first wire rate clock signal; and (B) transmit the first wire rate clock signal as the third input, to the serializer.

In embodiments, the fourth frequency is equal to x times the fifth frequency, where x is the second amount of data streams.

In embodiments, the fourth frequency is equal to x times the fifth frequency, where x is half of the second amount of data streams.

In embodiments, the fourth frequency is a rational multiple of the second frequency.

In embodiments, the phase difference indicator signal is a pulse signal.

In embodiments, adjustment information indicates at least one of the following: (A) a desired phase; (B) a desired frequency; (C) a change in phase; and (D) a change in frequency.

In embodiments, adjustment information comprises a voltage.

In embodiments, adjustment information comprise a digital transmission.

In embodiments, the adjustment information is used to do at least one of the following: (i) set a bias to an oscillator; (ii) set a divider ratio; and (iii) set a delay.

In embodiments, the first serial data stream comprises market data, the second serial data stream comprises order entry data, and the first operation comprises a trading algorithm.

In embodiments, the first serial data stream includes market data and the second serial data stream includes trading data.

In embodiments, the field programmable gate array system further comprises (a) a fourth plurality of data pins of the first interface, wherein the fourth plurality of data pins is configured to transmit a fourth serial data stream; (b) a second deserializer operationally connected to (i) the first reference clock pin to receive the first clock signal as a third input to the second deserializer, wherein the second deserializer is configured to: (A) receive a third serial data stream; (B) convert the third serial data stream into a third plurality of parallel data streams having a third amount of data streams; (C) generate a second receiver side clock signal based on the first clock signal, wherein the second receiver side clock signal has a sixth frequency and a sixth phase; and (D) transmit within the field programmable gate array to the computational circuitry the third plurality of parallel data streams and the second receiver side clock signal; (ii) the computational circuitry further configured to (A) receive the third plurality of parallel data streams and the second receiver side clock signal; and (B) generate a fourth plurality of parallel processed data streams having a fourth amount of data streams; (c) a second serializer operationally connected to: (i) the transceiver phase lock loop to receive as a fifth input the first wire rate clock signal based on the second clock signal; and (ii) the fourth plurality of data pins to transmit as a second output the fourth serial data stream, wherein the second serializer is configured to (A) receive the fourth plurality of parallel processed data streams from the computational circuitry; (B) convert the fourth plurality of parallel processed data streams into the fourth serial data stream; (C) transmit the fourth serial data stream to the fourth plurality of data pins for transmission off the field programmable gate array; (d) a third clock output pin of the second interface configured to transmit the second receiver side clock signal, wherein the third clock output pin is operationally connected to the second deserializer; and (e) a second phase control circuit, provided at least partially on the field programmable gate array, wherein the phase control circuit comprises: (i) a second phase detector operationally connected to the first clock output pin and the third clock output pin of the second interface of the field programmable gate array, wherein the second phase detector is configured to (A) compare the third phase of the first receiver side clock signal to the sixth phase of the second receiver side clock signal; and (B) generate a second phase difference indicator signal based on a difference between the third phase of the first receiver side clock signal and the sixth phase of the second receiver side clock signal; (ii) a second phase controller operationally connected to the second phase detector and configured to receive the second phase difference indicator signal, wherein the second phase controller is configured to determine second adjustment information based on the second phase difference indicator signal; and (iii) a delay element operationally connected to the second phase controller and to the second deserializer, wherein the second phase controller sends to the delay element the second adjustment information, wherein the delay element is configured to (A) delay the third serial data stream based on the second adjustment information, and (B) transmit the third serial data stream to the second deserializer, wherein the first receiver side clock signal and the second receiver side clock signal are phase aligned so that there is a fixed phase difference between the third phase and the sixth phase.

In embodiments, the field programmable gate array system further comprises a third plurality of data pins of the first interface, wherein the delay element is placed on the field programmable gate array and operationally connected to the third plurality of data pins and wherein the delay element is further configured to (A) receive the third serial data stream via the third plurality of data pins, and (B) transmit the third serial data stream to the second deserializer.

In embodiments, the field programmable gate array system further comprises a third plurality of data pins of the first interface, wherein (A) the delay element is placed outside of the field programmable gate array, (B) the delay element and the second deserializer are operationally connected to the third plurality of data pins, and (C) the third plurality of data pins is further configured to transmit the third serial data stream from the delay element to the second deserializer.

The present invention also relates to a method for processing a first serial data stream comprising market data, using a field programmable gate array system, to generate a second serial data stream comprising order entry data, wherein the method comprises the steps of (a) receiving, by a first plurality of data pins of a first interface of a field programmable gate array in the field programmable gate array system, the first serial data stream; (b) receiving, by a first reference clock pin in the first interface, a first clock signal having a first frequency and a first phase; (c) transmitting, from the first plurality of data pins of the first interface to a deserializer in the field programmable gate array, the first serial data stream; (d) transmitting, from the first reference clock pin in the first interface to the deserializer, the first clock signal; (e) generating, by the deserializer, a first receiver side clock signal having a second frequency and a second phase, based on the first clock signal; (f) converting, by the deserializer, the first serial data stream into a first plurality of parallel data streams; (g) transmitting, from the deserializer to computational circuitry in the field programmable gate array, the first receiver side clock signal; (h) transmitting, from the deserializer to the computational circuitry, the first plurality of data streams comprising a first plurality of data items and a first amount of data streams; (i) transmitting, from the deserializer via a first clock output pin on a second interface of the field programmable gate array to a phase detector that is part of the field programmable gate array system and not part of the field programmable gate array, the first receiver side clock signal; (j) generating, using the field programmable gate array system, a first transmitter side clock signal having a third frequency and a third phase, by performing the following steps until a first output of the phase detector is below a first threshold level: (i) generating, by an adjustable oscillator in the field programmable gate array system, a second clock signal having a fourth frequency and a fourth phase; (ii) generating a first wire rate clock signal having a fifth frequency and a fifth phase based on the second clock signal; (iii) generating, by a serializer in the field programmable gate array, an interim transmitter side clock signal having a sixth frequency and a sixth phase; (iv) transmitting, from the serializer via a second clock output pin of the second interface to the phase detector, the interim transmitter side clock signal; (v) generating, by the phase detector, the first output based on a comparison of the first receiver side clock signal and the interim transmitter side clock signal; (vi) transmitting, from the phase detector to a phase controller of the field programmable gate array system which is placed within the field programmable gate array, the first output; (vii) determining, by the phase controller, interim adjustment information based on the first output; and (viii) transmitting, from the phase controller to the adjustable oscillator, the interim adjustment information, wherein, the adjustable oscillator adjusts the second clock signal based on the interim adjustment information and steps (i) through (viii) are repeated until the first output of the phase detector is below the first threshold level; (k) transmitting, from the serializer to the computational circuitry, first transmitter side clock signal; (l) performing, by the computational circuitry, a first set of operations on at least a portion of the first plurality of data items to generate a second plurality of parallel data streams comprising a second amount of data streams; (m) transmitting, from the computational circuitry to the serializer, the second plurality of parallel data streams; (n) converting, by the serializer, the second plurality of parallel data streams into the second serial data stream; and (o) transmitting, from the serializer off the field gate programmable array system via a second plurality of data pins of the first interface, the second serial data stream.

In embodiments, step (a) is performed before step (b).
In embodiments, step (b) is performed before step (a).
In embodiments, step (a) and step (b) are performed contemporaneously.
In embodiments, step (c) is performed before step (d).
In embodiments, step (d) is performed before step (c).
In embodiments, step (c) and step (d) are performed contemporaneously.
In embodiments, step (e) is performed before step (f).
In embodiments, step (f) is performed before step (e).

In embodiments, step (e) and step (f) are performed contemporaneously.
In embodiments, the second frequency corresponds to the first frequency.
In embodiments, the second phase is not aligned with the first phase.
In embodiments, the second frequency is different from the first frequency.
In embodiments, step (g) is performed before step (h).
In embodiments, step (h) is performed before step (g).
In embodiments, step (g) and step (h) are performed contemporaneously.
In embodiments, the step (i) comprises transmitting, from the deserializer to the phase detector, the first receiver side clock signal via a first zero delay buffer phase lock loop of the field programmable gate array before transmitting the first receiver side clock signal via the first clock output pin of the second interface.
In embodiments, the third frequency corresponds to the second frequency.
In embodiments, the third phase is aligned with the second phase.
In embodiments, a difference between the third phase and the second phase is less than a second threshold level
In embodiments, the sixth frequency corresponds to the third frequency.
In embodiments, the sixth phase is not aligned with the third phase prior to the first output of the phase detector being below the first threshold level.
In embodiments, the step (j)(iv) comprises transmitting, from the serializer to the phase detector, the interim transmitter side clock signal via a second zero delay buffer phase lock loop of the field programmable gate array before transmitting the interim transmitter side clock signal via the second clock output pin of the second interface.
In embodiments, the first set of operations does not include clock domain crossing operations that delays processing of the first set of parallel data streams.
In embodiments, the first amount of data streams is the same as the second amount of data streams.
In embodiments, the first amount of data streams and the second amount of data streams is one of the following: (i) eight (8) data streams; (ii) ten (10) data streams; (iii) sixteen (16) data streams; (iv) twenty (20) data streams; (v) thirty-two (32) data streams; (vi) forty (40) data streams; (vii) sixty-four (64) data streams; and (viii) eighty (80) data streams; (ix) one hundred twenty-eight (128) data streams; and (x) one hundred sixty (160) data streams.
In embodiments, the first amount of data streams and the second amount of data streams are equal to two (2) to the power of N, where N is an integer.
In embodiments, the first amount of data streams and the second amount of data streams are equal to ten (10) times two (2) to the power of N, where N is an integer.
In embodiments, the first amount of data streams and the second amount of data streams are equal to thirty-three (33) times two (2) to the power of N, where N is an integer.
In embodiments, at least a portion of the first set of operations is performed prior to step (k).
In embodiments, at least a portion of the first set of operations is performed after step (k).
In embodiments, all of the first set of operations is performed after step (k).
In embodiments, the transmission of the second serial data stream from the serializer off the field programmable gate array is transmitted to an input/output module off the field programmable gate array.

In embodiments, the first serial data stream includes market data and the second serial data stream includes trading data.

In embodiments, the step of generating the first wire rate clock signal further includes: (a) receiving, from the adjustable oscillator at a transceiver phase lock loop via a second reference clock pin in the first interface, the second clock signal; (b) processing, by the transceiver phase lock loop, the received second clock signal; (c) providing, by the transceiver phase lock loop, the first wire rate clock signal based on the processing of the received clock signal; and (d) transmitting, by the transceiver phase lock loop, the first wire rate clock signal to the serializer.

In embodiments, a phase lock loop generates the first wire rate clock signal.

In embodiments, the phase lock loop is on the field programmable gate array.

In embodiments, the phase lock loop that is part of the field programmable gate array system and not part of the field programmable gate array.

In embodiments, the step of generating the first wire rate clock signal further includes: (a) processing the second clock signal; (b) providing the first wire rate clock signal based on the processing of the second clock signal; and (c) transmitting, to the serializer, the first wire rate clock signal.

In embodiments, the sixth frequency corresponds to the third frequency.

In embodiments, the sixth phase is not aligned with the third phase.

The present invention also relates to a field programmable gate array system comprising: (a) a field programmable gate array comprising (1) a first interface comprising (A) a first reference clock pin, wherein said first reference clock pin is configured to receive a first clock signal having a first frequency and a first phase; (B) a second reference clock pin, wherein said second reference clock pin is configured to receive a second clock signal having a second frequency and a second phase; (C) a first plurality of data pins, wherein said first plurality of data pins is configured to receive a first serial data stream; (D) a second plurality of data pins, wherein said second plurality of data pins is configured to transmit a second serial data stream; (2) a deserializer operationally connected to (A) the first reference clock pin to receive as a first input the first clock signal and (B) the first plurality of data pins to receive as a second input the first serial data stream, and wherein the deserializer is configured to (A) convert the first serial data stream into a first plurality of parallel data streams having a first amount of data streams; (B) generate a first receiver side clock signal based on the first clock signal, wherein the first receiver side clock signal has a third frequency and a third phase; and (C) transmit the first plurality of parallel data streams and the first receiver side clock signal within the field programmable gate array; (3) computational circuitry operationally connected to the deserializer to receive the first plurality of parallel data streams and the first receiver side clock signal, wherein the computational circuitry is configured to perform a first set of operations on the first plurality of parallel data streams to generate a second plurality of parallel processed data streams having a second amount of data streams; (4) a serializer operationally connected to (A) a transceiver phase lock loop to receive as a third input a first wire rate clock signal based on the second clock signal, wherein the first wire rate clock signal has a fourth frequency and a fourth phase; (B) the second plurality of data pins to transmit as a first output the second serial data stream; (C) the computational circuitry, wherein the serializer receives the second plurality of parallel processed data streams from the computational circuitry and the serializer transmits to the computational circuitry a first transmitter side clock signal including a fifth frequency and a fifth phase; and wherein the serializer is configured to (A) convert the second plurality of parallel processed data streams into the second serial data stream; (B) generate the first transmitter side clock signal based on the first wire rate signal, wherein the first transmitter side clock signal has the fifth frequency and the fifth phase, wherein the fifth frequency is different than and less than the fourth frequency; and (C) transmit the second serial data stream to the second plurality of data pins for transmission off the field programmable gate array; and (b) a phase control circuit, provided at least partially on the field programmable gate array, wherein the phase control circuit comprises (1) a phase detector configured to compare the third phase of the first receiver side clock signal to the fifth phase of the transmitter side clock signal and to generate a phase difference indicator signal based on a difference between the third phase of the first receiver side clock signal and the fifth phase of the transmitter side clock signal; (2) a phase controller operationally connected to the phase detector and configured to receive the phase difference indicator signal, and wherein the phase controller is configured to determine adjustment information based on the phase difference indicator signal; and (3) a phase lock loop with phase adjustment operationally connected to the phase controller and configured to receive the adjustment information as well as operationally connected to the second reference clock pin of the first interface of the field programmable gate array, wherein the phase lock loop with phase adjustment is configured to generate the second clock signal including the second frequency and the second phase based on the adjustment information and transmit the second clock signal to the second reference clock pin of the first interface of the field programmable gate array, wherein the transmitter side clock signal and the first receiver side clock signal are phase aligned so that there is a fixed phase difference between the third phase and the fifth phase.

In embodiments, the third frequency corresponds to the first frequency.

In embodiments, the third phase is not aligned with the first phase.

In embodiments, the third frequency is different than the first frequency.

In embodiments, the first set of operations does not include clock domain crossing operations that delays processing of the first set of parallel data streams.

In embodiments, the first set of operations includes at least one of the following: (i) an arithmetic operation; (ii) a logical operation; (iii) a pipeline operation; and (iv) a memory access operation.

In embodiments, the first amount of data streams is the same as the second amount of data streams.

In embodiments, the first amount of data streams and the second amount of data streams are equal to one of the following: (i) eight (8) data streams; (ii) ten (10) data streams; (iii) sixteen (16) data streams; (iv) twenty (20) data streams; (v) thirty-two (32) data streams; (vi) forty (40) data streams; (vii) sixty-four (64) data streams; (viii) eighty (80) data streams; (ix) one hundred twenty-eight (128) data streams; and (x) one hundred sixty (160) data streams.

In embodiments, the first amount of data streams and the second amount of data streams are equal to two (2) to the power of N, where N is an integer.

In embodiments, the first amount of data streams and the second amount of data streams are equal to ten (10) times two (2) to the power of N, where N is an integer.

In embodiments, the first amount of data streams and the second amount of data streams are equal to thirty-three (33) times two (2) to the power of N, where N is an integer.

In embodiments, the transceiver phase lock loop is operationally connected to the second reference clock pin and is configured to (A) receive the second clock signal, as a fourth input, to generate the first wire rate clock signal; and (B) transmit the first wire rate clock signal as the third input, to the serializer.

In embodiments, the fourth frequency is equal to x times the fifth frequency, where x is the second amount of data streams.

In embodiments, the fourth frequency is equal to x times the fifth frequency, where x is half of the second amount of data streams.

In embodiments, the fourth frequency is a rational multiple of the second frequency.

In embodiments, the phase difference indicator signal is a pulse signal.

In embodiments, adjustment information indicates at least one of the following: (A) a desired phase; (B) a desired frequency; (C) a change in phase; and (D) a change in frequency.

In embodiments, adjustment information comprises a voltage.

In embodiments, adjustment information comprise a digital transmission.

In embodiments, the adjustment information is used to do at least one of the following: (i) set a bias to an oscillator; (ii) set a divider ratio; and (iii) set a delay.

In embodiments, the first serial data stream comprises market data, the second serial data stream comprises order entry data, and the first operation comprises a trading algorithm.

In embodiments, the first serial data stream includes market data and the second serial data stream includes trading data.

In embodiments, the field programmable gate array system further comprises: (5) a second interface comprising (A) a first clock output pin configured to transmit the first receiver side clock signal, wherein the first clock output pin is operationally connected to the deserializer; and (B) a second clock output pin configured to transmit the first transmitter side clock signal, wherein the second clock output pin is operationally connected to the serializer; and wherein the phase detector is not on the field programmable gate array and is operationally connected to the first clock output pin and the second clock output pin of the second interface of the field programmable gate array.

In embodiments, the field programmable gate array system further comprises (a) a fourth plurality of data pins of the first interface, wherein the fourth plurality of data pins is configured to transmit a fourth serial data stream; (b) a second deserializer operationally connected to: (i) the first reference clock pin to receive the first clock signal as a third input to the second deserializer, wherein the second deserializer is configured to (A) receive a third serial data stream; (B) convert the third serial data stream into a third plurality of parallel data streams having a third amount of data streams; (C) generate a second receiver side clock signal based on the first clock signal, wherein the second receiver side clock signal has a sixth frequency and a sixth phase; and (D) transmit within the field programmable gate array to the computational circuitry the third plurality of parallel data streams and the second receiver side clock signal; (ii) the computational circuitry further configured to (A) receive the third plurality of parallel data streams and the second receiver side clock signal; and (B) generate a fourth plurality of parallel processed data streams having a fourth amount of data streams; (c) a second serializer operationally connected to: (i) the transceiver phase lock loop to receive as a fifth input the first wire rate clock signal based on the second clock signal; and (ii) the fourth plurality of data pins to transmit as a second output the fourth serial data stream, wherein the second serializer is configured to (A) receive the fourth plurality of parallel processed data streams from the computational circuitry; (B) convert the fourth plurality of parallel processed data streams into the fourth serial data stream; (C) transmit the fourth serial data stream to the fourth plurality of data pins for transmission off the field programmable gate array; and (d) a second phase control circuit, provided at least partially on the field programmable gate array, wherein the phase control circuit comprises (i) a second phase detector configured to (A) compare the third phase of the first receiver side clock signal to the sixth phase of the second receiver side clock signal; and (B) generate a second phase difference indicator signal based on a difference between the third phase of the first receiver side clock signal and the sixth phase of the second receiver side clock signal; (ii) a second phase controller operationally connected to the second phase detector and configured to receive the second phase difference indicator signal, wherein the second phase controller is configured to determine second adjustment information based on the second phase difference indicator signal; and (iii) a delay element operationally connected to the second phase controller and to the second deserializer, wherein the second phase controller sends to the delay element the second adjustment information, wherein the delay element is configured to (A) delay the third serial data stream based on the second adjustment information, and (B) transmit the third serial data stream to the second deserializer, wherein the first receiver side clock signal and the second receiver side clock signal are phase aligned so that there is a fixed phase difference between the third phase and the sixth phase.

In embodiments, the field programmable gate array system further comprises a third plurality of data pins of the first interface, wherein the delay element is placed on the field programmable gate array and operationally connected to the third plurality of data pins and wherein the delay element is further configured to (A) receive the third serial data stream via the third plurality of data pins, and (B) transmit the third serial data stream to the second deserializer.

In embodiments, the field programmable gate array system further comprises a third plurality of data pins of the first interface, wherein (A) the delay element is placed outside of the field programmable gate array, (B) the delay element and the second deserializer are operationally connected to the third plurality of data pins, and (C) the third plurality of data pins is further configured to transmit the third serial data stream from the delay element to the second deserializer.

In embodiments, the field programmable gate array system further comprises (A) a first clock output pin of a second interface of the field programmable gate array, the first clock output pin being configured to transmit the first receiver side clock signal from the deserializer to the second phase detector; and (B) a third clock output pin of the second interface configured to transmit the second receiver side clock signal from the second deserializer to the second phase detector, wherein the second phase detector is not placed on the field programmable gate array and is operationally connected to the first clock output pin and the third clock output pin of the second interface of the field programmable gate array.

The present invention also relates to a method for processing a first serial data stream comprising market data, using a field programmable gate array system, to generate a second serial data stream comprising order entry data, wherein the method comprises the steps of: (a) receiving, by a first plurality of data pins of a first interface of a field programmable gate array in the field programmable gate array system, the first serial data stream; (b) receiving, by a first reference clock pin in the first interface, a first clock signal having a first frequency and a first phase; (c) transmitting, from the first plurality of data pins of the first interface to a deserializer in the field programmable gate array, the first serial data stream; (d) transmitting, from the first reference clock pin in the first interface to the deserializer, the first clock signal; (e) generating, by the deserializer, a first receiver side clock signal having a second frequency and a second phase, based on the first clock signal; (f) converting, by the deserializer, the first serial data stream into a first plurality of parallel data streams; (g) transmitting, from the deserializer to computational circuitry in the field programmable gate array, the first receiver side clock signal; (h) transmitting, from the deserializer to the computational circuitry, the first plurality of data streams comprising a first plurality of data items and a first amount of data streams; (i) transmitting, from the deserializer to a phase detector of the field programmable gate array system, the first receiver side clock signal; (j) generating, using the field programmable gate array system, a first transmitter side clock signal having a third frequency and a third phase, by performing the following steps until a first output of the phase detector is below a first threshold level: (i) generating, by a phase lock loop with phase adjustment in the field programmable gate array system, a second clock signal having a fourth frequency and a fourth phase; (ii) generating a first wire rate clock signal having a fifth frequency and a fifth phase based on the second clock signal; (iii) generating, by a serializer in the field programmable gate array, an interim transmitter side clock signal having a sixth frequency and a sixth phase; (iv) transmitting, from the serializer to the phase detector, the interim transmitter side clock signal; (v) generating, by the phase detector, the first output based on a comparison of the first receiver side clock signal and the interim transmitter side clock signal; (vi) transmitting, from the phase detector to a phase controller of the field programmable gate array system which is placed within the field programmable gate array, the first output; (vii) determining, by the phase controller, interim adjustment information based on the first output; and (viii) transmitting, from the phase controller to the phase lock loop with phase adjustment, the interim adjustment information; wherein, the phase lock loop with phase adjustment adjusts the second clock signal based on the interim adjustment information and steps (i) through (viii) are repeated until the first output of the phase detector is below the first threshold level; (k) transmitting, from the serializer to the computational circuitry, first transmitter side clock signal; (l) performing, by the computational circuitry, a first set of operations on at least a portion of the first plurality of data items to generate a second plurality of parallel data streams comprising a second amount of data streams; (m) transmitting, from the computational circuitry to the serializer, the second plurality of parallel data streams; (n) converting, by the serializer, the second plurality of parallel data streams into the second serial data stream; and (o) transmitting, from the serializer off the field gate programmable array system via a second plurality of data pins of the first interface, the second serial data stream.

In embodiments, step (a) is performed before step (b).

In embodiments, step (b) is performed before step (a).

In embodiments, step (a) and step (b) are performed contemporaneously.

In embodiments, step (c) is performed before step (d).

In embodiments, step (d) is performed before step (c).

In embodiments, step (c) and step (d) are performed contemporaneously.

In embodiments, step (e) is performed before step (f).

In embodiments, step (f) is performed before step (e).

In embodiments, step (e) and step (f) are performed contemporaneously.

In embodiments, the second frequency corresponds to the first frequency.

In embodiments, the second phase is not aligned with the first phase.

In embodiments, the second frequency is different from the first frequency.

In embodiments, step (g) is performed before step (h).

In embodiments, step (h) is performed before step (g).

In embodiments, step (g) and step (h) are performed contemporaneously.

In embodiments, the phase detector is not placed on the field programmable gate array and the step (i) comprises transmitting, from the deserializer to the phase detector via a first clock output pin on a second interface of the field programmable gate array, the first receiver side clock signal.

In embodiments, the step (i) further comprises transmitting, from the deserializer to the phase detector, the first receiver side clock signal via a first zero delay buffer phase lock loop of the field programmable gate array before transmitting the first receiver side clock signal via the first clock output pin of the second interface.

In embodiments, the third frequency corresponds to the second frequency.

In embodiments, the third phase is aligned with the second phase.

In embodiments, a difference between the third phase and the second phase is less than a second threshold level In embodiments, the sixth frequency corresponds to the third frequency.

In embodiments, the sixth phase is not aligned with the third phase prior to the first output of the phase detector being below the first threshold level.

In embodiments, the phase detector is not placed on the field programmable gate array and the step (j)(iv) comprises transmitting, from the serializer to the phase detector via a second clock output pin of the second interface of the field programmable gate array, the interim transmitter side clock signal.

In embodiments, the step (j)(iv) further comprises transmitting, from the serializer to the phase detector, the interim transmitter side clock signal via a second zero delay buffer phase lock loop of the field programmable gate array before transmitting the interim transmitter side clock signal via the second clock output pin of the second interface.

In embodiments, the first set of operations does not include clock domain crossing operations that delays processing of the first set of parallel data streams.

In embodiments, the first amount of data streams is the same as the second amount of data streams.

In embodiments, the first amount of data streams and the second amount of data streams is one of the following: (i) eight (8) data streams; (ii) ten (10) data streams; (iii) sixteen

(16) data streams; (iv) twenty (20) data streams; (v) thirty-two (32) data streams; (vi) forty (40) data streams; (vii) sixty-four (64) data streams; (viii) eighty (80) data streams; (ix) one hundred twenty-eight (128) data streams; and (x) one hundred sixty (160) data streams.

In embodiments, the first amount of data streams and the second amount of data streams are equal to two (2) to the power of N, where N is an integer.

In embodiments, the first amount of data streams and the second amount of data streams are equal to ten (10) times two (2) to the power of N, where N is an integer.

In embodiments, the first amount of data streams and the second amount of data streams are equal to thirty-three (33) times two (2) to the power of N, where N is an integer.

In embodiments, at least a portion of the first set of operations is performed prior to step (k).

In embodiments, at least a portion of the first set of operations is performed after step (k).

In embodiments, all of the first set of operations is performed after step (k).

In embodiments, the transmission of the second serial data stream from the serializer off the field programmable gate array is transmitted to an input/output module off the field programmable gate array.

In embodiments, the first serial data stream includes market data and the second serial data stream includes trading data.

In embodiments, the step of generating the first wire rate clock signal further includes: (a) receiving, from the phase lock loop with phase adjustment at a transceiver phase lock loop via a second reference clock pin in the first interface, the second clock signal; (b) processing, by the transceiver phase lock loop, the received second clock signal; (c) providing, by the transceiver phase lock loop, the first wire rate clock signal based on the processing of the received clock signal; and (d) transmitting, by the transceiver phase lock loop, the first wire rate clock signal to the serializer.

In embodiments, a phase lock loop generates the first wire rate clock signal.

In embodiments, the phase lock loop is on the field programmable gate array.

In embodiments, the phase lock loop that is part of the field programmable gate array system and not part of the field programmable gate array.

In embodiments, the step of generating the first wire rate clock signal further includes: (a) processing the second clock signal; (b) providing the first wire rate clock signal based on the processing of the second clock signal; and (c) transmitting, to the serializer, the first wire rate clock signal.

In embodiments, the sixth frequency corresponds to the third frequency.

In embodiments, the sixth phase is not aligned with the third phase.

The present invention also relates to a field programmable gate array system comprising (a) a field programmable gate array comprising (1) a first interface comprising (A) a first reference clock pin, wherein said first reference clock pin is configured to receive a first clock signal having a first frequency and a first phase; (B) a second reference clock pin, wherein said second reference clock pin is configured to receive the first clock signal; (C) a first plurality of data pins, wherein said first plurality of data pins is configured to receive a first serial data stream; (D) a second plurality of data pins, wherein said second plurality of data pins is configured to transmit a second serial data stream; (2) a deserializer operationally connected to (A) the first reference clock pin to receive as a first input the first clock signal and (B) the first plurality of data pins to receive as a second input the first serial data stream, and wherein the deserializer is configured to (A) convert the first serial data stream into a first plurality of parallel data streams having a first amount of data streams; (B) generate a first receiver side clock signal based on the first clock signal, wherein the first receiver side clock signal has a third frequency and a third phase; and (C) transmit the first plurality of parallel data streams and the first receiver side clock signal within the field programmable gate array; (3) computational circuitry operationally connected to the deserializer to receive the first plurality of parallel data streams and the first receiver side clock signal, wherein the computational circuitry is configured to perform a first set of operations on the first plurality of parallel data streams to generate a second plurality of parallel processed data streams having a second amount of data streams; (4) a serializer operationally connected to (A) an adjustable transceiver phase lock loop to receive as a third input a first wire rate clock signal, wherein the first wire rate clock signal has a fourth frequency and a fourth phase; (B) the second plurality of data pins to transmit as a first output the second serial data stream; (C) the computational circuitry, wherein the serializer receives the second plurality of parallel processed data streams from the computational circuitry and the serializer transmits to the computational circuitry a first transmitter side clock signal including a fifth frequency and a fifth phase; and wherein the serializer is configured to (A) convert the second plurality of parallel processed data streams into the second serial data stream; (B) generate the first transmitter side clock signal based on the first wire rate signal, wherein the first transmitter side clock signal has the fifth frequency and the fifth phase, wherein the fifth frequency is different than and less than the fourth frequency; and (C) transmit the second serial data stream to the second plurality of data pins for transmission off the field programmable gate array; and (b) a phase control circuit, provided at least partially on the field programmable gate array, wherein the phase control circuit comprises (1) a phase detector configured to compare the third phase of the first receiver side clock signal to the fifth phase of the transmitter side clock signal and to generate a phase difference indicator signal based on a difference between the third phase of the first receiver side clock signal and the fifth phase of the transmitter side clock signal; (2) a phase controller operationally connected to the phase detector and configured to receive the phase difference indicator signal, and wherein the phase controller is configured to determine adjustment information based on the phase difference indicator signal; and (3) the adjustable transceiver phase lock loop operationally connected to the phase controller and configured to receive the adjustment information as well as operationally connected to the second reference clock pin of the first interface of the field programmable gate array, wherein the adjustable transceiver phase lock loop is configured to generate a second clock signal including the second frequency and the second phase based on the first clock signal received via the second reference clock pin and process the second clock signal based on the adjustment information received from the phase controller to generate the first wire rate clock signal, wherein the transmitter side clock signal and the first receiver side clock signal are phase aligned so that there is a fixed phase difference between the third phase and the fifth phase.

In embodiments, the third frequency corresponds to the first frequency.

In embodiments, the third phase is not aligned with the first phase.

In embodiments, the third frequency is different than the first frequency.

In embodiments, the first set of operations does not include clock domain crossing operations that delays processing of the first set of parallel data streams.

In embodiments, the first set of operations includes at least one of the following: (i) an arithmetic operation; (ii) a logical operation; (iii) a pipeline operation; and (iv) a memory access operation.

In embodiments, the first amount of data streams is the same as the second amount of data streams.

In embodiments, the first amount of data streams and the second amount of data streams are equal to one of the following: (i) eight (8) data streams; (ii) ten (10) data streams; (iii) sixteen (16) data streams; (iv) twenty (20) data streams; (v) thirty-two (32) data streams; (vi) forty (40) data streams; (vii) sixty-four (64) data streams; (viii) eighty (80) data streams; (ix) one hundred twenty-eight (128) data streams; and (x) one hundred sixty (160) data streams.

In embodiments, the first amount of data streams and the second amount of data streams are equal to two (2) to the power of N, where N is an integer.

In embodiments, the first amount of data streams and the second amount of data streams are equal to ten (10) times two (2) to the power of N, where N is an integer.

In embodiments, the first amount of data streams and the second amount of data streams are equal to thirty-three (33) times two (2) to the power of N, where N is an integer.

In embodiments, the fourth frequency is equal to x times the fifth frequency, where x is the second amount of data streams.

In embodiments, the fourth frequency is equal to x times the fifth frequency, where x is half of the second amount of data streams.

In embodiments, the fourth frequency is a rational multiple of the second frequency.

In embodiments, the phase difference indicator signal is a pulse signal.

In embodiments, adjustment information indicates at least one of the following: (A) a desired phase; (B) a desired frequency; (C) a change in phase; and (D) a change in frequency.

In embodiments, adjustment information comprises a voltage.

In embodiments, adjustment information comprises a digital transmission.

In embodiments, the adjustment information is used to do at least one of the following: (i) set a bias to an oscillator; (ii) set a divider ratio; and (iii) set a delay.

In embodiments, the first serial data stream comprises market data, the second serial data stream comprises order entry data, and the first operation comprises a trading algorithm.

In embodiments, the first serial data stream includes market data and the second serial data stream includes trading data.

In embodiments, the field programmable gate array system further comprises (5) a second interface comprising (A) a first clock output pin configured to transmit the first receiver side clock signal, wherein the first clock output pin is operationally connected to the deserializer; and (B) a second clock output pin configured to transmit the first transmitter side clock signal, wherein the second clock output pin is operationally connected to the serializer, wherein the phase detector is not on the field programmable gate array and is operationally connected to the first clock output pin and the second clock output pin of the second interface of the field programmable gate array.

In embodiments, the field programmable gate array system further comprises (a) a fourth plurality of data pins of the first interface, wherein the fourth plurality of data pins is configured to transmit a fourth serial data stream; (b) a second deserializer operationally connected to: (i) the first reference clock pin to receive the first clock signal as a third input to the second deserializer, wherein the second deserializer is configured to (A) receive a third serial data stream; (B) convert the third serial data stream into a third plurality of parallel data streams having a third amount of data streams; (C) generate a second receiver side clock signal based on the first clock signal, wherein the second receiver side clock signal has a sixth frequency and a sixth phase; and (D) transmit within the field programmable gate array to the computational circuitry the third plurality of parallel data streams and the second receiver side clock signal; (ii) the computational circuitry further configured to (A) receive the third plurality of parallel data streams and the second receiver side clock signal; and (B) generate a fourth plurality of parallel processed data streams having a fourth amount of data streams; (c) a second serializer operationally connected to: (i) the adjustable transceiver phase lock loop to receive as a fifth input the first wire rate clock signal based on the second clock signal; and (ii) the fourth plurality of data pins to transmit as a second output the fourth serial data stream, wherein the second serializer is configured to (A) receive the fourth plurality of parallel processed data streams from the computational circuitry; (B) convert the fourth plurality of parallel processed data streams into the fourth serial data stream; (C) transmit the fourth serial data stream to the fourth plurality of data pins for transmission off the field programmable gate array; and (d) a second phase control circuit, provided at least partially on the field programmable gate array, wherein the phase control circuit comprises (i) a second phase detector configured to (A) compare the third phase of the first receiver side clock signal to the sixth phase of the second receiver side clock signal; and (B) generate a second phase difference indicator signal based on a difference between the third phase of the first receiver side clock signal and the sixth phase of the second receiver side clock signal; (ii) a second phase controller operationally connected to the second phase detector and configured to receive the second phase difference indicator signal, wherein the second phase controller is configured to determine second adjustment information based on the second phase difference indicator signal; and (iii) a delay element operationally connected to the second phase controller and to the second deserializer, wherein the second phase controller sends to the delay element the second adjustment information, wherein the delay element is configured to (A) delay the third serial data stream based on the second adjustment information, and (B) transmit the third serial data stream to the second deserializer, wherein the first receiver side clock signal and the second receiver side clock signal are phase aligned so that there is a fixed phase difference between the third phase and the sixth phase.

In embodiments, the field programmable gate array system further comprises a third plurality of data pins of the first interface, wherein the delay element is placed on the field programmable gate array and operationally connected to the third plurality of data pins and wherein the delay element is further configured to (A) receive the third serial data stream via the third plurality of data pins, and (B) transmit the third serial data stream to the second deserializer.

In embodiments, the field programmable gate array system further comprises a third plurality of data pins of the first interface, wherein (A) the delay element is placed outside of the field programmable gate array, (B) the delay element and the second deserializer are operationally connected to the third plurality of data pins, and (C) the third plurality of data pins is further configured to transmit the third serial data stream from the delay element to the second deserializer.

In embodiments, the field programmable gate array system further comprises (A) a first clock output pin of a second interface of the field programmable gate array, the first clock output pin being configured to transmit the first receiver side clock signal from the deserializer to the second phase detector; and (B) a third clock output pin of the second interface configured to transmit the second receiver side clock signal from the second deserializer to the second phase detector, wherein the second phase detector is not placed on the field programmable gate array and is operationally connected to the first clock output pin and the third clock output pin of the second interface of the field programmable gate array.

The present invention also relates to a method for processing a first serial data stream comprising market data, using a field programmable gate array system, to generate a second serial data stream comprising order entry data, wherein the method comprises the steps of (a) receiving, by a first plurality of data pins of a first interface of a field programmable gate array in the field programmable gate array system, the first serial data stream; (b) receiving, by a first reference clock pin in the first interface, a first clock signal having a first frequency and a first phase; (c) transmitting, from the first plurality of data pins of the first interface to a deserializer in the field programmable gate array, the first serial data stream; (d) transmitting, from the first reference clock pin in the first interface to the deserializer, the first clock signal; (e) generating, by the deserializer, a first receiver side clock signal having a second frequency and a second phase, based on the first clock signal; (f) converting, by the deserializer, the first serial data stream into a first plurality of parallel data streams; (g) transmitting, from the deserializer to computational circuitry in the field programmable gate array, the first receiver side clock signal; (h) transmitting, from the deserializer to the computational circuitry, the first plurality of parallel data streams comprising a first plurality of data items and a first amount of data streams; (i) transmitting, from the deserializer to a phase detector of the field programmable gate array system, the first receiver side clock signal; (j) generating, using the field programmable gate array system, a first transmitter side clock signal having a third frequency and a third phase, by performing the following steps until a first output of the phase detector is below a first threshold level: (i) receiving, by an adjustable transceiver phase lock loop via a second reference clock pin in the first interface, the first clock signal to generate a second clock signal having a fourth frequency and a fourth phase; (ii) generating a first wire rate clock signal having a fifth frequency and a fifth phase based on the second clock signal and interim adjustment information; (iii) generating, by a serializer in the field programmable gate array, an interim transmitter side clock signal having a sixth frequency and a sixth phase; (iv) transmitting, from the serializer to the phase detector, the interim transmitter side clock signal; (v) generating, by the phase detector, the first output based on a comparison of the first receiver side clock signal and the interim transmitter side clock signal; (vi) transmitting, from the phase detector to a phase controller of the field programmable gate array system which is placed within the field programmable gate array, the first output; (vii) determining, by the phase controller, the interim adjustment information based on the first output; and (viii) transmitting, from the phase controller to the adjustable transceiver phase lock loop, the interim adjustment information, wherein, the adjustable transceiver phase lock loop adjusts the second clock signal based on the interim adjustment information and steps (i) through (viii) are repeated until the first output of the phase detector is below the first threshold level; (k) transmitting, from the serializer to the computational circuitry, first transmitter side clock signal; (l) performing, by the computational circuitry, a first set of operations on at least a portion of the first plurality of data items to generate a second plurality of parallel data streams comprising a second amount of data streams; (m) transmitting, from the computational circuitry to the serializer, the second plurality of parallel data streams; (n) converting, by the serializer, the second plurality of parallel data streams into the second serial data stream; and (o) transmitting, from the serializer off the field gate programmable array system via a second plurality of data pins of the first interface, the second serial data stream.

In embodiments, step (a) is performed before step (b).

In embodiments, step (b) is performed before step (a).

In embodiments, step (a) and step (b) are performed contemporaneously.

In embodiments, step (c) is performed before step (d).

In embodiments, step (d) is performed before step (c).

In embodiments, step (c) and step (d) are performed contemporaneously.

In embodiments, step (e) is performed before step (f).

In embodiments, step (f) is performed before step (e).

In embodiments, step (e) and step (f) are performed contemporaneously.

In embodiments, the second frequency corresponds to the first frequency.

In embodiments, the second phase is not aligned with the first phase.

In embodiments, the second frequency is different from the first frequency.

In embodiments, step (g) is performed before step (h).

In embodiments, step (h) is performed before step (g).

In embodiments, step (g) and step (h) are performed contemporaneously.

In embodiments, the phase detector is not placed on the field programmable gate array and the step (i) comprises transmitting, from the deserializer to the phase detector via a first clock pin on a second interface of the field programmable gate array, the first receiver side clock signal.

In embodiments, the step (i) further comprises transmitting, from the deserializer to the phase detector, the first receiver side clock signal via a first zero delay buffer phase lock loop of the field programmable gate array before transmitting the first receiver side clock signal via the first clock output pin of the second interface.

In embodiments, the third frequency corresponds to the second frequency.

In embodiments, the third phase is aligned with the second phase.

In embodiments, a difference between the third phase and the second phase is less than a second threshold level In embodiments, the sixth frequency corresponds to the third frequency.

In embodiments, the sixth phase is not aligned with the third phase prior to the first output of the phase detector being below the first threshold level.

In embodiments, the phase detector is not placed on the field programmable gate array and the step (j)(iv) comprises transmitting, from the serializer to the phase detector via a second clock output pin of the second interface of the field programmable gate array, the interim transmitter side clock signal.

In embodiments, the step (j)(iv) further comprises transmitting, from the serializer to the phase detector, the interim transmitter side clock signal via a second zero delay buffer phase lock loop of the field programmable gate array before transmitting the interim transmitter side clock signal via the second clock output pin of the second interface.

In embodiments, the first set of operations does not include clock domain crossing operations that delays processing of the first set of parallel data streams.

In embodiments, the first amount of data streams is the same as the second amount of data streams.

In embodiments, the first amount of data streams and the second amount of data streams is one of the following: (i) eight (8) data streams; (ii) ten (10) data streams; (iii) sixteen (16) data streams; (iv) twenty (20) data streams; (v) thirty-two (32) data streams; (vi) forty (40) data streams; (vii) sixty-four (64) data streams; (viii) eighty (80) data streams; (ix) one hundred twenty-eight (128) data streams; and (x) one hundred sixty (160) data streams.

In embodiments, the first amount of data streams and the second amount of data streams are equal to two (2) to the power of N, where N is an integer.

In embodiments, the first amount of data streams and the second amount of data streams are equal to ten (10) times two (2) to the power of N, where N is an integer.

In embodiments, the first amount of data streams and the second amount of data streams are equal to thirty-three (33) times two (2) to the power of N, where N is an integer.

In embodiments, at least a portion of the first set of operations is performed prior to step (k).

In embodiments, at least a portion of the first set of operations is performed after step (k).

In embodiments, all of the first set of operations is performed after step (k).

In embodiments, the transmission of the second serial data stream from the serializer off the field programmable gate array is transmitted to an input/output module off the field programmable gate array.

In embodiments, the first serial data stream includes market data and the second serial data stream includes trading data.

In embodiments, the step of generating the first wire rate clock signal further includes: (a) generating, by the adjustable phase lock loop, the second clock signal based on the received first clock signal; (b) processing, by the adjustable transceiver phase lock loop, the second clock signal based on the interim adjustment information received from the phase controller; (c) providing, by the adjustable transceiver phase lock loop, the first wire rate clock signal based on the processing of the second clock signal; and (d) transmitting, by the adjustable transceiver phase lock loop, the first wire rate clock signal to the serializer.

In embodiments, a phase lock loop generates the first wire rate clock signal.

In embodiments, the phase lock loop is on the field programmable gate array.

In embodiments, the phase lock loop that is part of the field programmable gate array system and not part of the field programmable gate array.

In embodiments, the step of generating the first wire rate clock signal further includes: (a) processing the second clock signal; (b) providing the first wire rate clock signal based on the processing of the second clock signal; and (c) transmitting, to the serializer, the first wire rate clock signal.

In embodiments, the sixth frequency corresponds to the third frequency.

In embodiments, the sixth phase is not aligned with the third phase.

BRIEF DESCRIPTION OF THE DRAWINGS

Exemplary embodiments of the present invention will be described with reference to the accompanying figures, wherein:

FIG. 7A is an exemplary block diagram of a serializer suitable for use in the field programmable gate array systems of FIGS. 3A-3F, 4A-4C and 5A-5F in accordance with an exemplary embodiment of the present invention;

FIG. 7B is an exemplary block diagram of a serializer suitable for use in field programmable gate array systems of FIGS. 3A-3F, 4A-4C and 5A-5F in accordance with an exemplary embodiment of the present invention;

FIGS. 10A-10B are flow charts of a process for generating a transmitter side clock signal in accordance with an exemplary embodiment of the present invention;

FIGS. 13A-13B are flow charts of a process for generating a transmitter side clock signal in accordance with an exemplary embodiment of the present invention;

FIGS. 15A-C are flow charts of a process implementing the field programmable gate array system in accordance with an exemplary embodiment of the present invention;

FIGS. 16A-16B are flow charts of a process for generating a transmitter side clock signal in accordance with an exemplary embodiment of the present invention.

DETAILED DESCRIPTION

The present invention generally relates to a field programmable gate array system. In embodiments, the present invention generally relates to a field programmable gate array and an external or internal phase controller providing phase matching between a receiver clock and a transmitter clock used in the field programmable gate array.

Figure 1:
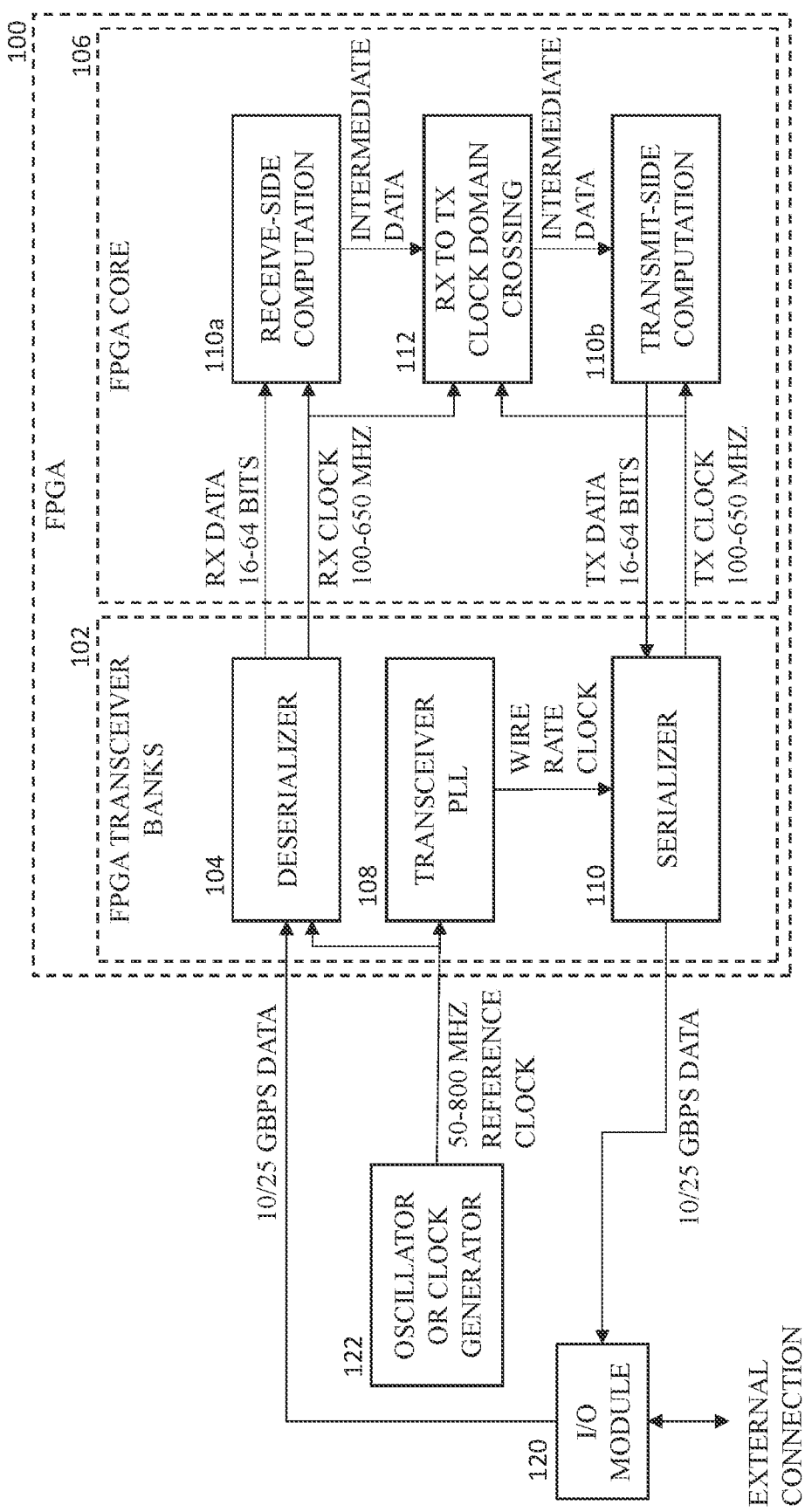
FIG. 1 is a block diagram of a conventional field programmable gate array.

FIG. 1 illustrates an exemplary schematic of a FPGA 100. Examples of currently available FPGAs include the XCVU3P-2FFVC1517E, Intel 1SG280LH3F55E3VG, Xilinx XCVU9P-2FLGA2104E the Vitrex® Ultrascale, the Vitrex® Ultrascale Plus, the Stratix® V, the Stratix® 10, XILINX XC3042, the Intel EP4CE6E22C8LN and the Lattice ICE40LP384-SG32, to name a few.

In embodiments, FPGA 100 may include an FPGA Core 106 and a number of peripheral systems. In embodiments, the FPGA Core 106 includes 4 main components: logic elements, digital signal processor blocks ("DSP blocks"), clock distribution components, and memories, to name a few, and may generally be referred to as the FPGA core, or simply logic core, 106. In embodiments, the peripheral systems may include CPU cores, reconfiguration controllers, security features, hardened logic functions, FPGA transceiver banks 102, hardened high-speed interface accelerators (e.g., PCIe or 100 GbE controllers, to name a few), general-purpose I/O pins, memory interface controllers, larger memories, analog components (e.g., ADCs or DACs to name a few), and 3D-stacked memories (e.g., HBM), to name a few. The FPGA Transceiver banks 102 receive serial data to be processed from outside the FPGA and then transmit serial data out of the FBGA after being processed by internal circuitry of the FPGA 100. Some FPGA's may not include FPGA Transceiver banks.

Figure 1A:
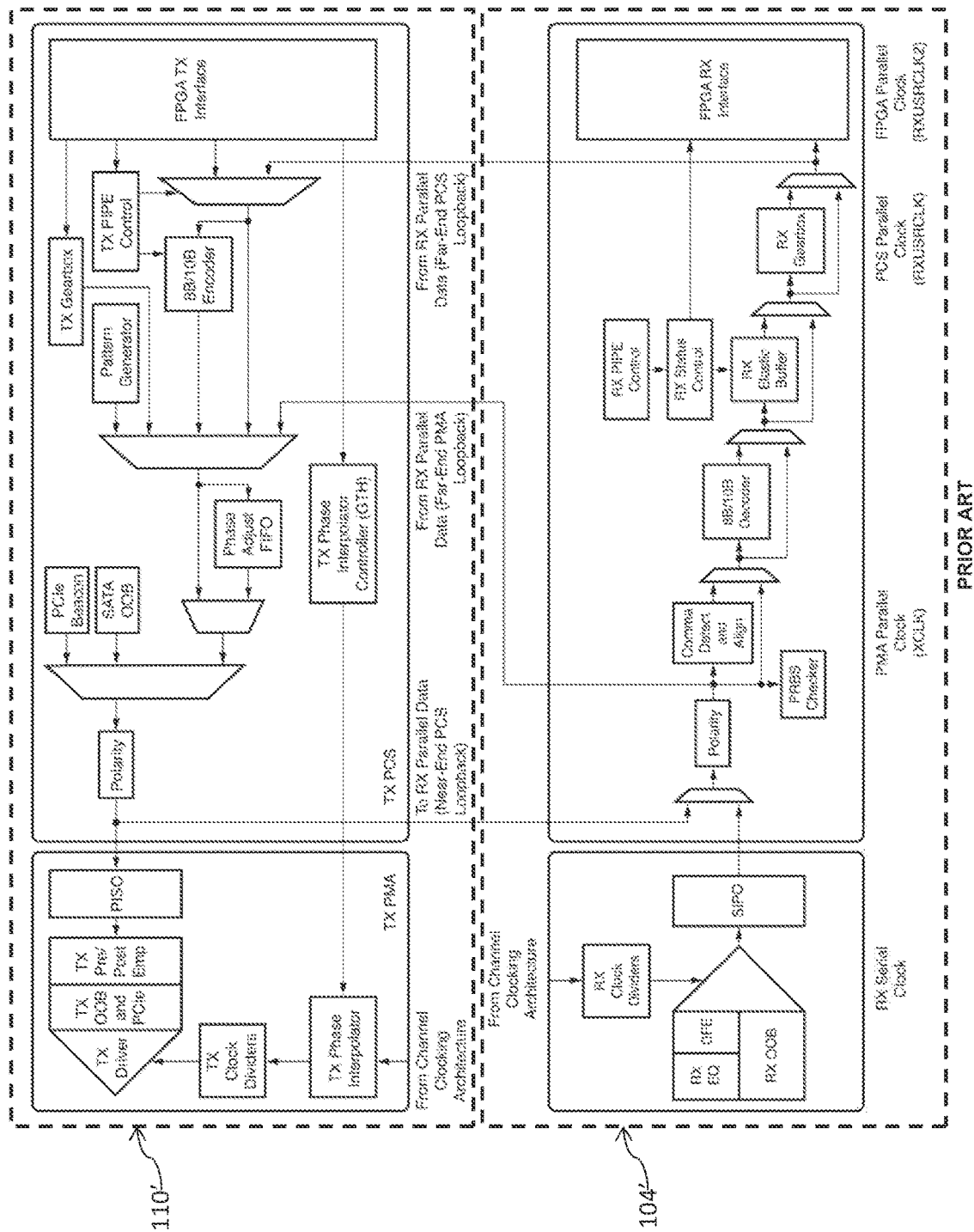
FIG. 1A is a block diagram of an exemplary transceiver suitable for use in the field programmable gate array of FIG. 1.

In embodiments, data may be received by a receiver side of the transceiver banks 102 in the FPGA 100 at rates such as 10 or 25 Gbps, to name a few. In embodiments, rates may be between a range of 9-25 Gbps, 10-25 Gbps, 22-33 Gbps, 33-45 Gbps, 45-60 Gbps, 60-80 Gbps, or 80-120 Gbps, to name a few. An exemplary transceiver (including deserializer 104' and serializer 110') suitable for use in FPGA 100 is shown in FIG. 1A. In embodiments, the input data may be received from I/O module 120. The input data may then be deserialized, using deserializer 104, for example, and parallelized into parallel data streams, such as 16-64 bits wide at 1/16th to 1/64th of the frequency of the incoming data stream, to name a few. In embodiments, FPGA transceivers may support parallel streams with widths of, for example, 8 bits, 10 bits, 16 bits, 20 bits, 32 bits, 40 bits, 64 bits, 80 bits, 128 bits, and 160 bits (with corresponding clock division), to name a few. In some FPGAs, a physical coding sublayer (PCS) may be used in the transceiver 102. In some FPGAs, the PCS of the transceiver 102 may be bypassed and so that the corresponding PCS functions may be done in the FPGA core 106. After deserialization, data is available for computation in the FPGA logic core 106 where computation is completed. In embodiments, the computation of the data may be computed by receive-side computation 110*a* of the FPGA core 106. Similarly, data may be computed by the transmit-side computation 110*b*.

Figure 1B:
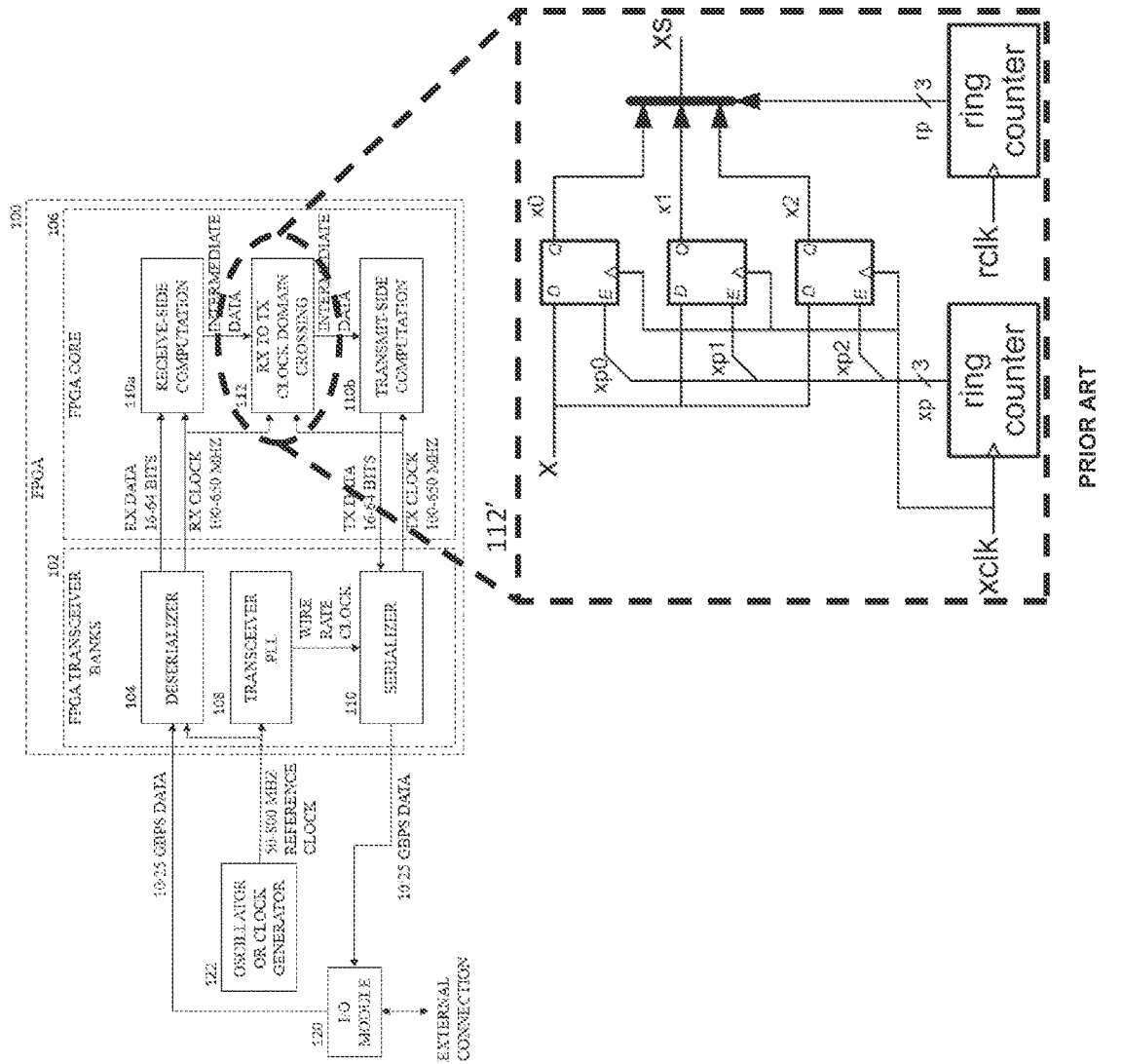
FIG. 1B is an exemplary block diagram of a Clock Domain Crossing Circuit suitable for use in the field programmable gate array of FIG. 1.
Figure 1C:
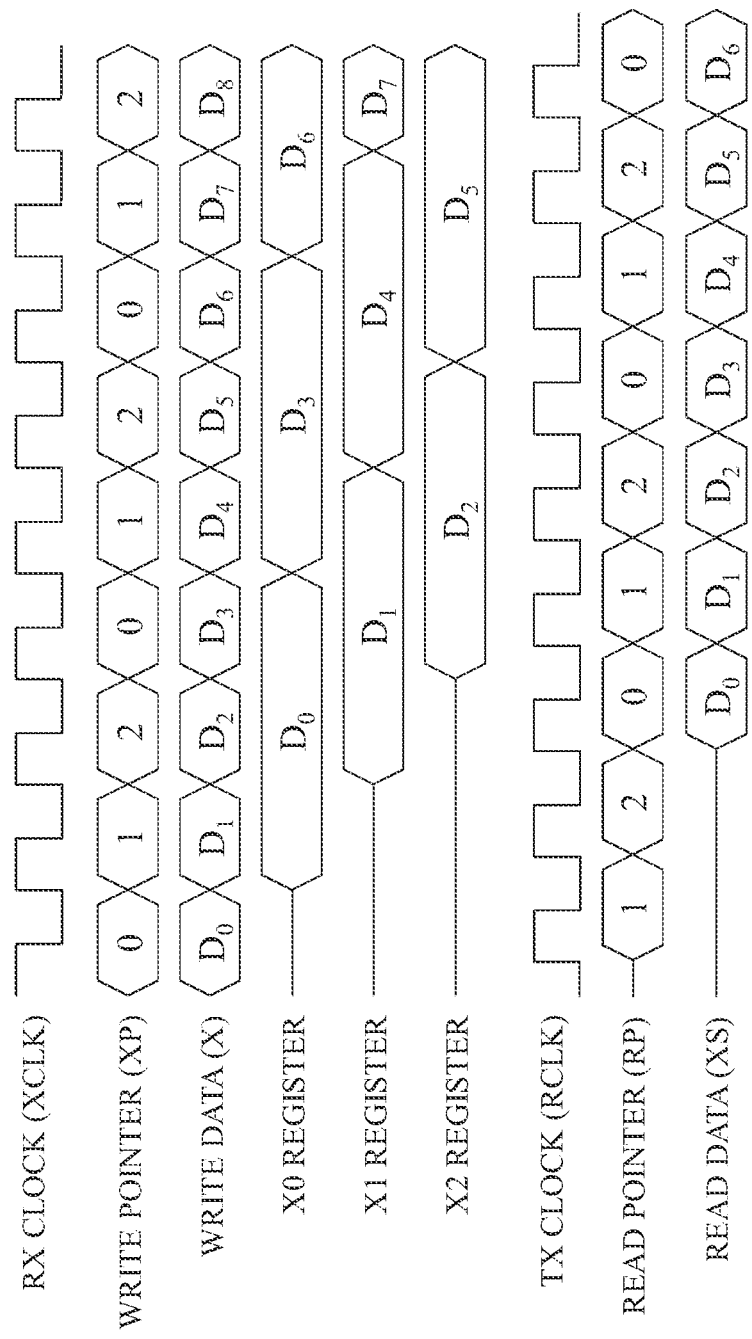
FIG. 1C illustrates exemplary input output waveforms of the Clock Domain Crossing Circuit of the field programmable gate array of FIG. 1.

In embodiments, a REFERENCE CLOCK signal is provided, by Oscillator or Clock Generator 122, to both the deserializer 104 and the serializer 110. The REFERENCE CLOCK signal is received by the serializer 110 via the transceiver PLL 108 (Phase-Locked Loop). The first receiver side clock signal RXCLOCK, however, is different in both frequency and phase from the REFERENCE CLOCK based on the deserialization process that occurs in the deserializer 104. Similarly, the transmitter clock signal TXCLOCK, while based on the REFERENCE CLOCK signal varies in frequency and phase based on processing that occurs in the serializer 110. As a result, the RXCLOCK signal and TXCLOCK signal will be out of phase. A known solution to this issue is the inclusion of the RX to TX clock domain crossing circuit 112. An exemplary Clock Domain Crossing circuit is suitable for use in FPGA 100 is shown as clock domain crossing circuit 112' in connection with FIG. 1B. As is noted above, the inclusion of the RX to TX clock domain crossing circuit 112 creates a technical problem, introducing an inherent delay in the FPGA 100, which is undesirable. The technical problem of an inherent delay is illustrated in FIG. 1C. FIG. 1C illustrates an example of a phase difference between the receiver side clock and the transmitter side clock of the conventional field programmable gate array of FIG. 1.

Thereafter, the data it transmitted out of the FPGA 100. After all computation (computation by receive-side computation 110*a* and/or transmit-side computation 110*b*) and clock domain crossing (by RX to TX clock domain crossing 112) is completed, the data goes back to the transmit side of the FPGA transceiver 102 to be serialized by the serializer 110 out on an output wire. The serializer 110 (e.g., the transmitter) typically runs off a fast clock generated (e.g., 10 Gbps, 25 Gbps, or a range from 10 Gbps to 25 Gbps, or a range from 1 Gbps to 100 Gbps, to name a few) by the transceiver phase-locked loop 108 within the transceiver bank 102 from a reference clock signal received by oscillator or clock generator 122.

The receiver (deserializer 104) and transmitter (serializer 110) of the transceiver 102 operate on different clocks that are independently generated within the transceiver 102. The receiver clock domain is typically generated by a clock and data recovery (CDR) circuit from the incoming data stream. The transmitter clock is typically generated by the transceiver phase-locked loop 108. In conventional FPGAs, phase matching or synchronizing is provided using the clock domain crossing circuit 112 that adjusts the phases of the two clock domains. The clock domain crossing circuit 112 may be an asynchronous FIFO or an asynchronous gearbox, to name a few. In embodiments, domain crossing circuit 112 may be a mesochronous clock crossing circuit. In embodiments, clock domain crossing circuit 112 may be instantiated within transceiver 102 of FPGA 100, although this structure has a higher latency cost than implementing it in logic fabric 106 of FPGA 100. As discussed above, a significant drawback of the clock domain crossing circuit 112 is that it adds latency related to the phase difference between the clocks plus the latency of the synchronizers used, and does not perform any computation, such that it slows the effective processing speed of FPGA 100.

FIGS. 2A-2D illustrate example phase differences between the receiver side clock and the transmitter side clock. It will be understood that other examples of phase differences may be present consistent with the teachings of this disclosure. Generally, when the clocks are aligned, the minimum and maximum delays may be used to determine the time available for the computation of data.

Figure 2A:
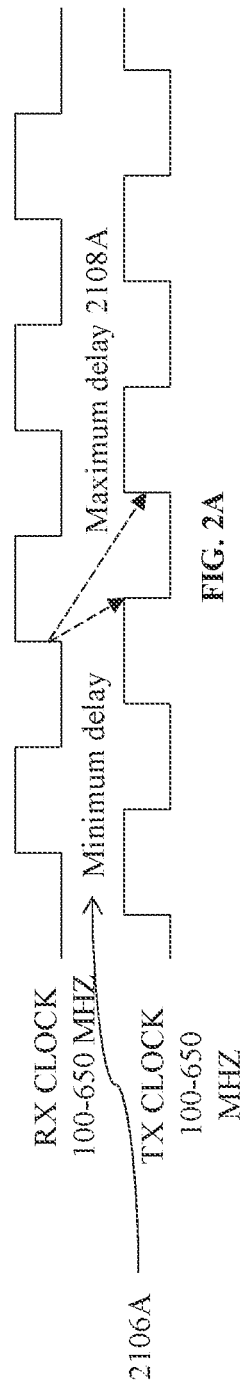
FIG. 2A illustrates an example of a phase difference between the receiver side clock and the transmitter side clock of an FPGA in accordance with an exemplary embodiment of the present invention.

FIG. 2A illustrates an example of a phase difference between the receiver side clock and the transmitter side clock of an FPGA in accordance with an embodiment. FIG. 2A depicts a phase difference when the clocks are under 360 degrees apart. This embodiment results in minimum delay 2106A and maximum delay 2108A, for which data may be computed. The minimum delay 2106A is from the driving clock edge back to itself, as shown in FIG. 2A.

Figure 2B:
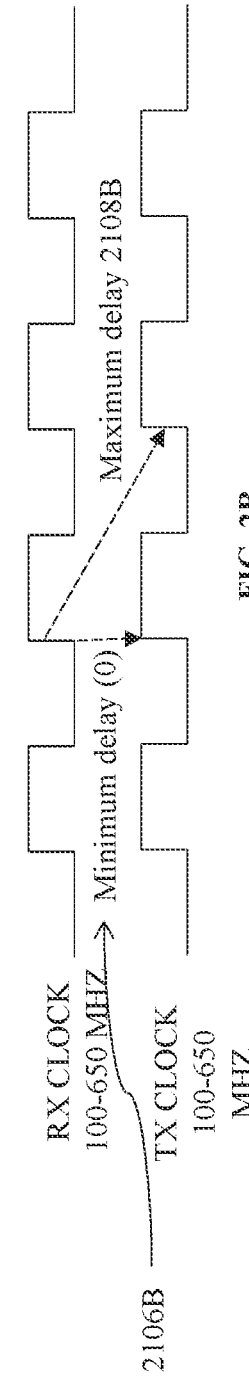
FIG. 2B illustrates an example of a phase difference between receiver clock and a transmitter clock of an FPGA in accordance with an exemplary embodiment of the present invention.

FIG. 2B illustrates an example of a phase difference between receiver clock and a transmitter clock of an FPGA in accordance with an embodiment. The phase difference depicted in FIG. 2B shows a phase difference with medium delay 2106B and maximum delay 2108B. The example shown in FIG. 2B shows a minimum delay 2106B of 0. However, in practice, while designers may design for the phase difference in FIG. 2B, the phase difference may end up more similar to the phase differences of FIGS. 2A and/or 2C.

Figure 2C:
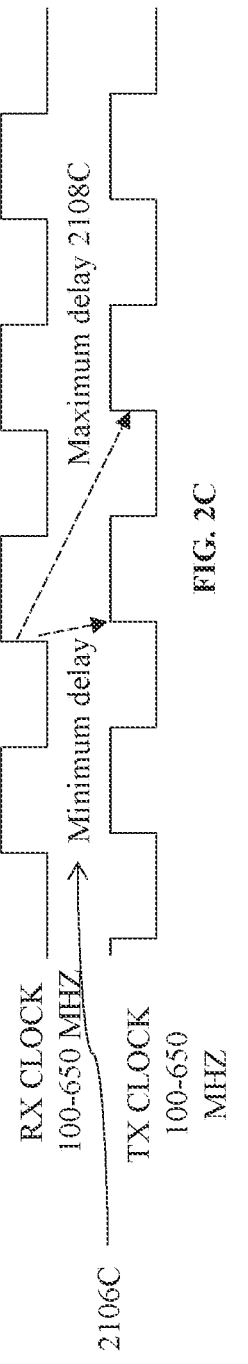
FIG. 2C illustrates an example of a phase difference between receiver clock and a transmitter clock of an FPGA in accordance with an exemplary embodiment of the present invention.

FIG. 2C illustrates an example of a phase difference between receiver clock and a transmitter clock of an FPGA in accordance with an embodiment. FIG. 2C depicts a phase difference with the clocks are over 360 degrees apart. The time between minimum delay 2106C and maximum delay 2108C may allow for more data computations within the phase difference.

Figure 2D:
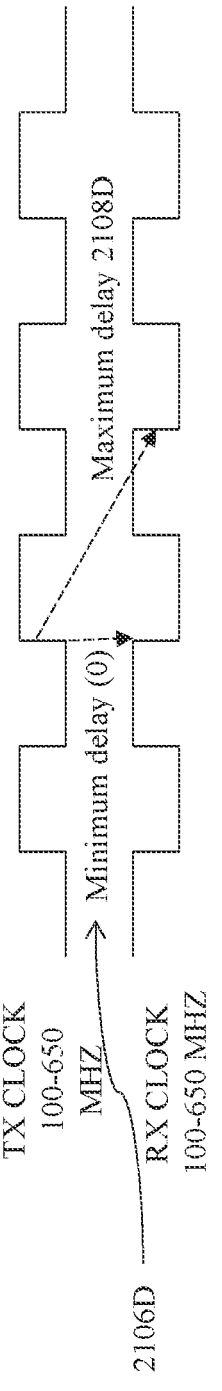
FIG. 2D illustrates an example of an inverted phase difference between receiver clock and a transmitter clock of an FPGA in accordance with an exemplary embodiment of the present invention.

FIG. 2D illustrates an example of an inverted phase difference between receiver clock and a transmitter clock of an FPGA in accordance with an embodiment. This example of an inverted phase difference between minimum delay 2106D and maximum delay 2108D shows that, even inverted, the phase difference would work similarly to the phase detectors of FIGS. 2A-2C.

Figure 3A:
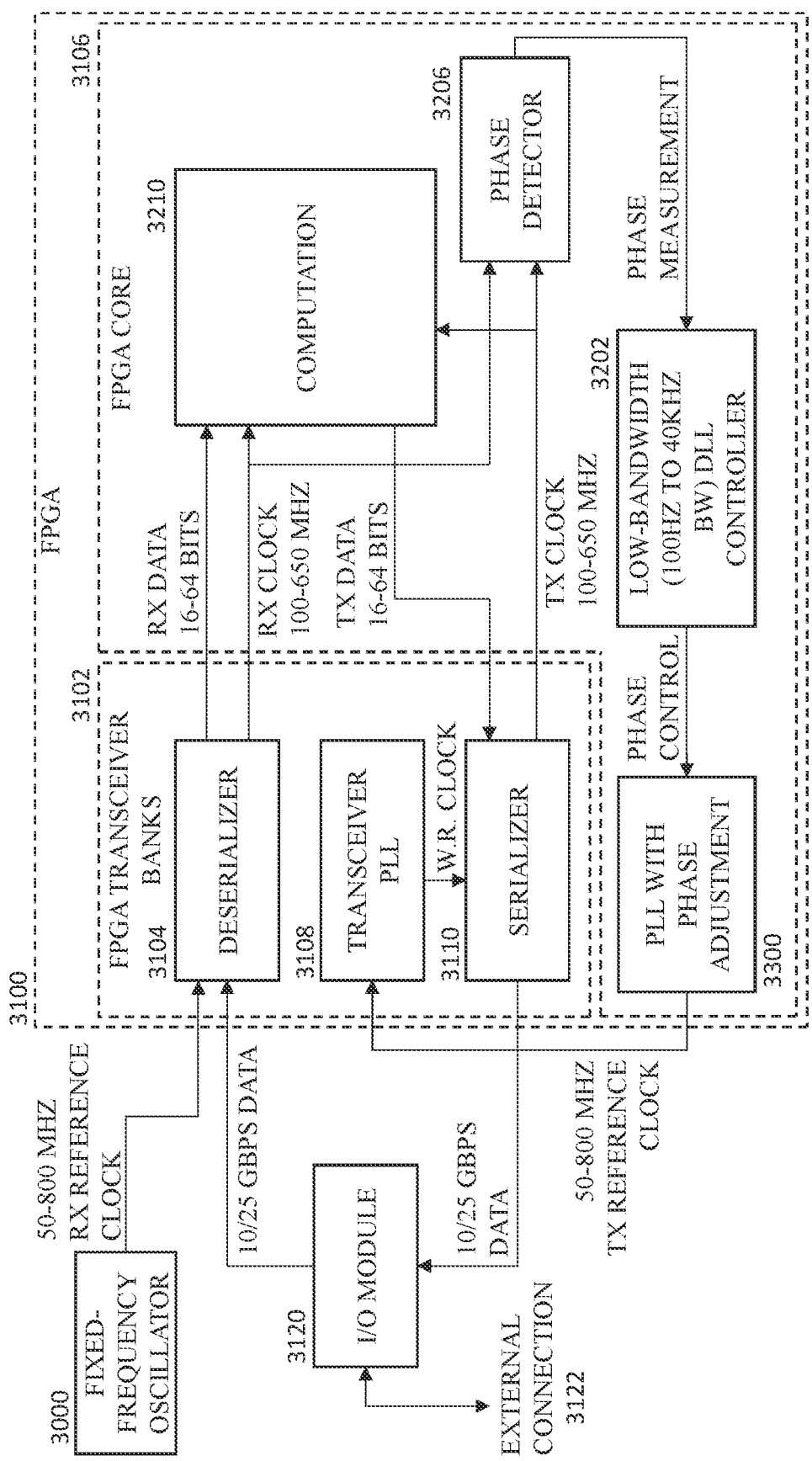
FIG. 3A is a block diagram of a field programmable gate array system in accordance with an exemplary embodiment of the present invention.

FIG. 3A illustrates a block diagram of a field programmable gate array (FPGA) system in accordance with an embodiment of the present disclosure that provides phase control while minimizing latency. In embodiments, the system generally includes FPGA 3100 which preferably includes FPGA transceiver banks 3102. In embodiments, the FPGA transceiver banks 3102 includes deserializer 3104 on the receiver end of FPGA 3100, transceiver PLL 3108, and serializer 3110 on the transmitter end of FPGA 3100. Deserializer 3104 may be similar to the deserializer 3104' and deserializer 3104" discussed below in connection with FIGS. 6A-6E, the descriptions of which applying herein. Serializer 3110 may be similar to serializer 3110' and serializer 3110" discussed below in connection with FIGS. 7A and 7B respectively, the descriptions of which applying herein. In embodiments, deserializer 3104 receives a serial data stream from the I/O module 3120 and provides deserialized data to the FPGA core 3106. More specifically, the deserializer 3104 will provide parallel data streams to the FPGA core 3106 for processing. As illustrated, this parallel data is provided to the computational logic 3210 where processing and computation takes place. FIG. 3A illustrates computational logic 3210 as a single element with a receiver side and a transmitting side. In embodiments, the computational logic 3210 may be implemented as a plurality of logic elements. In embodiments, when all computation is complete, the resulting data may be provided to serializer 3110 and then transmitted out of FPGA 3100, preferably via I/O module 3120, for example. In embodiments, the I/O module may be a direct soldered cable, on-chip optics, or an on-board optical transceiver, to name a few. Additionally, the I/O module may be an SFP, a QSFP, a micro QSFP, or a QSFP-DD, to name a few.

In embodiments, the serializer 3110 and deserializer 3104 (SERDES) circuit(s) may contain two major sections: (1) an analog side whose purpose is signal cleaning, and (2) a digital side which turns the analog signal into bits and converts between parallel and serial data streams. In embodiments, the analog side may include a few different types of amplifiers to provide signal cleaning.

In embodiments, as shown in FIG. 3A, a PLL with phase adjustment 3300 may be located inside the FPGA 3100 fabric with adjustable feedback dividers, which in turn adjust the frequency of the PLL. Alternatively, the PLL with phase adjustment 3300 may comprise a phase adjuster on the output of the loop, which adjusts the phase of the PLL directly. In embodiments, the same description may apply to adjustable transceiver PLLs 3108 and 5108 respectively shown in FIGS. 3B and 5B, but the differences are the location of the PLL inside the FPGA (e.g., within the FPGA core 3106 versus outside the FPGA core and within the FPGA transceiver banks 3102, 5102) and the operating frequency.

As illustrated in FIG. 3A, in embodiments, the first receiver side clock signal RXCLOCK is based on but has a different frequency and phase than the REFERENCE CLOCK signal provided by oscillator 3000 based on the operation of the deserializer 3104, as is discussed above with respect to the serializer 104. In embodiments, the transmitter side clock signal TXCLOCK provided from the serializer 3110 may be provided by transceiver phase locked loop 3108, which is provided inside FPGA 3100, and may be controlled by Phase Lock Loop (PLL) with Phase Adjustment 3300 of the FPGA core 3106. In this manner, the frequency or phase of the transmitter side clock signal TXCLOCK may be adjusted.

In embodiments, an internal phase controller 3202 is connected to the PLL with Phase Adjustment 3300 and provides control signals to allow for adjustment of the phase of at least the transmitter side clock signal TXCLOCK. The phase of the incoming data, in embodiments, may be adjusted by adjusting the data stream received by I/O module 3120. In embodiments, the internal phase controller 3202 provides control signals based on the phase difference between the receiver clock signal RXCLOCK and the transmitter clock signal TXCLOCK. In embodiments, the phase difference may be determined using phase detector 3206

Using the configuration of FIG. 3A, the receiver clock signal RXCLOCK and the transmitter clock signal TXCLOCK may be sufficiently aligned in phase such that there is no need for the clock domain crossing circuit discussed above, eliminating a technical problem. The technical solution to a technical problem, in embodiments, is shown in the system of FIG. 3A, which provides a wire or a logic path via the controller 3202 and PLL with phase adjustment 3300 to adjust the phase of the transmitter side clock TXCLOCK to correspond to that of the first receiver side clock signal RXCLOCK. Some delays may be intro- duced in the path including min_delay and max_delay constraints of the wire and components, however, such delays are insignificant compared to the larger delays that are necessarily present when an asynchronous clock domain crossing circuit is used.

In embodiments, with a phase difference between about 45° and 360°, the min_delay should be set at 0 and the max_delay should be set equal to the time between rising edges on the receive clock signal and transmit clock signal (as shown in FIGS. 2A and 2B). The difference between 45° and 360° approximates the minimum amount of time required to safely capture data. In embodiments, the formula for the time is as follows:

$$t_{min} = t_{setup} + t_{wire} + t_{clock-out} + \Delta t_{jitter} + t_{skew}$$

Referencing the above equation, $t_{setup}$ is the setup time of a flip-flop (i.e., a latch) on FPGA 3100. The $t_{wire}$ is the delay of the, for example, shortest wire (as compared to other wires on the FPGA) on FPGA 3100. In embodiments, the shortest wire is the shortest possible wire. In embodiments, $t_{clock-out}$ is the clock-to-output time of a flip-flop on the FPGA 3100. In embodiments, $\Delta t_{jitter}$ is a safety factor for jitter on both clocks. Jitter, for example, is the deviation from true periodicity of a periodic signal from a reference clock. In embodiments, $t_{skew}$ is the skew between clock paths to the two flip-flops on FPGA 3100.

In embodiments where there is a phase difference with the transmitter clock running less than 45° ahead of the receiver clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, the transmit clock signal may also sample on the opposite edge as the receiving clock signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

In embodiments, to avoid instability, the transceiver PLL 3108 preferably runs at the highest bandwidth available from the PLL on the FPGA, while the overall phase locking system including the phase detectors 3206, controller 3202 and PLL with Phase Adjustment 3300 run at a low bandwidth. In embodiments, the highest bandwidth available from the PLL on the FPGA may range between 100 kHz and 10 MHz. In such embodiments, the poles in the on-chip PLLs on the FPGA 3100 are prevented from affecting the gain or phase margin of the overall control loop which may be included in the controller 3202. In embodiments, any loop filter order may be used in the controller 3202 as long as the bandwidth is low enough to avoid interaction of poles in the control system. In embodiments, a low bandwidth may be, for example, 100 Hz-40 kHz, 400 Hz and 4 khz, 4 kHz and 10 kHz, 100 hz to 40 kHz, 0 Hz and 100 Hz, to name a few. In embodiments, a second-order loop filter may be used in an effort to improve lock time and phase locking error. In embodiments a third-order filter may be used if the second-order filter is stable. In embodiments, a first-order filter is also an option when the second-order filter has stability problems. In embodiments, other order filters may be used, depending on the internal bandwidth of the FPGA 3100.

In embodiments, where the bandwidth of the controller 3202 is too low, the receiving clock and the transmitter clock may not track each other closely enough to consider them locked. In embodiment, such tracking issues may be solved by adjusting the min and max delay constraints appropriately to provide a cushion for the clocks being away from the expected phase. In embodiments, a PD (Phase Detector) control system may be provided after the loop filter to aid in resolving tracking issues. In embodiments, tracking issues may be addressed by adding some nonlinearity in the transfer function of the filter. Other solutions may also be possible.

In the embodiment of FIG. 3A, the controller 3202 utilizes a phase-locked loop. In embodiments, a derivative component may be provided in the loop filter to slow down the control loop when the output value has changed recently and reduces the chance that the PLLs on the FPGA will lose lock. In embodiments, the derivative component's coefficient will be negative (i.e., the derivative component will act against the loop filter, however, some references refer to this as being a positive direction) and less than 1 (so the path straight from the filter dominates). The loop filter consists of a standard PLL loop filter with bandwidth between 400 Hz and 40 kHz of up to 4th order plus a derivative component that slows down the loop based on recent changes in the filter value. The bandwidth of the standard PLL loop filter, in some embodiments, may range between 400 Hz and 4 kHz, 4 kHz and 10 kHz, 100 Hz and 40 kHz, 0 Hz and 100 Hz, to name a few. The extra derivative component helps to keep the other components in the control system in their linear operating regions. The loop filter is represented by DigitalFilter( ) in the pseudocode provided below.

Figure 3B:
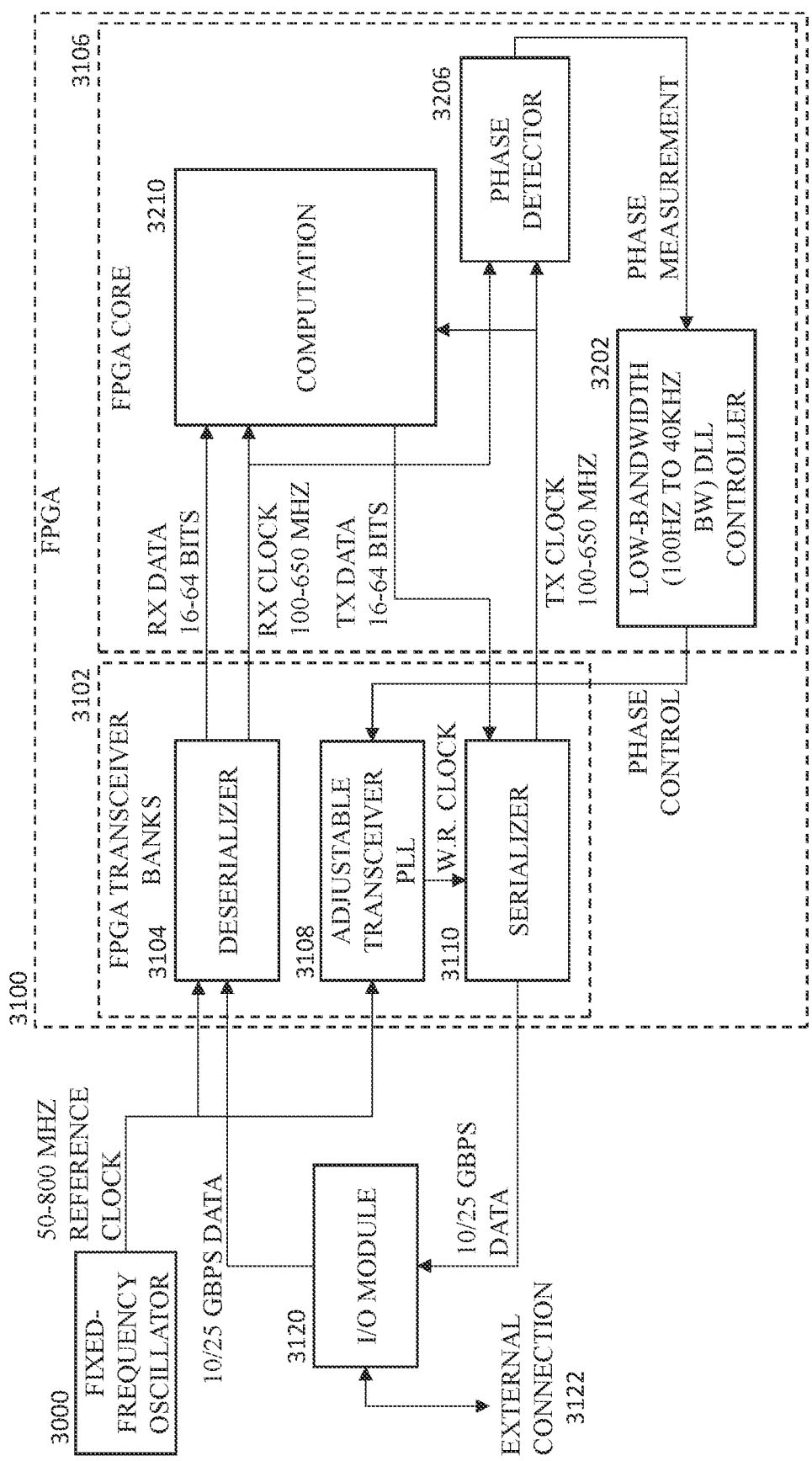
FIG. 3B is a block diagram of a field programmable gate array system in accordance with an exemplary embodiment of the present invention.

While similar to the embodiment shown in FIG. 3A, in FIG. 3B, an internal phase controller 3202 is directly connected and provides phase control signals to the adjustable transceiver PLL 3108, which is located in the FPGA transceiver banks 3102 and outside the FPGA core 3106. FIG. 3B illustrates a block diagram of an FPGA system in accordance with an embodiment of the present invention that provides phase control while minimizing latency wherein the FPGA 3100 has an acceptable phase-controlled adjustable transceiver PLL 3108. This embodiment uses the phase-controlled transceiver PLL directly to control the phase of TXCLOCK. An acceptable phase-control system must have adjustment gain capable of matching phase transients on the incoming data stream to within the timing margin ($t_{min}$), meaning that the following inequality must be able to be satisfied:

$$\int_0^\infty |\Delta t_{pk}(\omega)[1 - LF(\omega)]| d\omega \le t_{min}$$

Where $\Delta t_{pk}(\omega)$ is the peak design jitter at that frequency and LF is the transfer function over frequency of the phase locking system consisting of the phase detector 3206, controller 3202, and adjustable transceiver PLL 3108. The transfer function of a phase locked loop relates linearly to the phase control gain at low frequencies, and is given by:

$$LF(\omega) = \frac{K_{APLL} K_{PD} T(\omega)/F(\omega)}{\omega^2 + K_{APLL} K_{PD} T(\omega)/F(\omega)}$$

where $K_{APLL}$ is the phase control gain of adjustable PLL 3108, $K_{PD}$ is the gain of the phase detector 3206, $T(\omega)$ is the transfer function of the PLL controller 3202, and $F(\omega)$ is the transfer function of the feedback network.

In embodiments, expected functions for $\Delta t_{pk}(\omega)$ may be specified within the protocol specifications for communication protocols used. For example, for 10 Gigabit Ethernet, this is specified in clause 52.8 of the IEEE 802.3 standard.

In embodiments, the system of FIG. 3B generally includes FPGA 3100 which preferably includes FPGA transceiver banks 3102. In embodiments, the FPGA transceiver banks 3102 includes deserializer 3104 on the receiver end of FPGA 3100, adjustable transceiver PLL 3108, and serializer 3110 on the transmitter end of FPGA 3100. Deserializer 3104 may be similar to the deserializer 3104' and deserializer 3104'' discussed below in connection with FIGS. 6A-6E, the descriptions of which applying herein. Serializer 3110 may be similar to serializer 3110' and serializer 3110'' discussed below in connection with FIGS. 7A and 7B respectively, the descriptions of which applying herein. In embodiments, deserializer 3104 receives a serial data stream from the I/O module 3120 and provides deserialized data to the FPGA core 3106. More specifically, the deserializer 3104 will provide parallel data streams to the FPGA core 3106 for processing. As illustrated, this parallel data is provided to the computational logic 3210 where processing and computation takes place. FIG. 3B illustrates computational logic 3210 as a single element with a receiver side and a transmitting side. In embodiments, the computational logic 3210 may be implemented as a plurality of logic elements. In embodiments, when all computation is complete, the resulting data may be provided to serializer 3110 and then transmitted out of FPGA 3100, preferably via I/O module 3120, for example. In embodiments, the I/O module may be a direct soldered cable, on-chip optics, or an on-board optical transceiver, to name a few. Additionally, the I/O module may be an SFP, a QSFP, a micro QSFP, or a QSFP-DD, to name a few.

In embodiments, the serializer 3110 and deserializer 3104 (SERDES) circuit(s) may contain two major sections: (1) an analog side whose purpose is signal cleaning, and (2) a digital side which turns the analog signal into bits and converts between parallel and serial data streams. In embodiments, the analog side may include a few different types of amplifiers in order to provide signal cleaning.

In embodiments, as shown in FIG. 3B, an adjustable transceiver PLL 3108 may be located inside the FPGA 3100 fabric with adjustable feedback dividers, which in turn adjust the frequency of the PLL. Alternatively, the adjustable transceiver PLL 3108 may comprise a phase adjuster on the output of the loop, which adjusts the phase of the PLL directly. Unlike the PLL with phase adjustment 3300 in FIG. 3A, the adjustable transceiver PLL 3108 in FIG. 3B is located outside the FPGA core 3106 and within the FPGA transceiver banks 3102. The adjustable transceiver PLL 3108 in FIG. 3B may also differ from the PLL with phase adjustment 3300 in FIG. 3A in operating frequency.

As illustrated in FIG. 3B, in embodiments, the first receiver side clock signal RXCLOCK is based on, but has a different frequency and phase than, the REFERENCE CLOCK signal provided by oscillator 3000 based on the operation of the deserializer 3104, as is discussed above with respect to the serializer 104. In embodiments, the transmitter side clock signal TXCLOCK provided from the serializer 3110 may be provided by adjustable transceiver phase locked loop 3108. In this manner, the frequency or phase of the transmitter side clock signal TXCLOCK may be adjusted.

In embodiments, an internal phase controller 3202 is connected to the phase adjustment interface of the phase-controlled transceiver PLL 3108 and provides control signals to allow for adjustment of the phase of at least the transmitter side clock signal TXCLOCK. In embodiments, the phase of the incoming data may be adjusted by adjusting the data stream received by I/O module 3120. In embodiments, the internal phase controller 3202 provides control signals based on the phase difference between the receiver clock signal RXCLOCK and the transmitter clock signal TXCLOCK. In embodiments, the phase difference may be determined using phase detector 3206.

Using the configuration of FIG. 3B, the receiver clock signal RXCLOCK and the transmitter clock signal TXCLOCK may be sufficiently aligned in phase such that there is no need for the clock domain crossing circuit discussed above, eliminating a technical problem. The technical solution to a technical problem, in embodiments, is shown in the system of FIG. 3B, which provides a wire or a logic path via the controller 3202 and adjustable transceiver PLL 3108 to adjust the phase of the transmitter side clock TXCLOCK to correspond to that of the first receiver side clock signal RXCLOCK. Some delays may be introduced in the path including min_delay and max_delay constraints of the wire and components. However, such delays are insignificant compared to the larger delays that are necessarily present when an asynchronous clock domain crossing circuit is used.

In embodiments, with a phase difference between about 45° and 360°, the min_delay should be set at 0 and the max_delay should be set equal to the time between rising edges on the receive clock signal and transmit clock signal (as shown in FIGS. 2A and 2B). The difference between 45° and 36° approximates the minimum amount of time required to safely capture data. In embodiments, the formula for the time is as follows:

$$t_{min} = t_{setup} + t_{wire} + t_{clock-out} + \Delta t_{jitter} + t_{skew}$$

Referencing the above equation, $t_{setup}$ is the setup time of a flip-flop (i.e., a latch) on FPGA 3100. The $t_{wire}$ is the delay of the, for example, shortest wire (as compared to other wires on the FPGA) on FPGA 3100. In embodiments, the shortest wire is the shortest possible wire. In embodiments, $t_{clock-out}$ is the clock-to-output time of a flip-flop on the FPGA 3100. In embodiments, $\Delta t_{jitter}$ is a safety factor for jitter on both clocks. Jitter, for example, is the deviation from true periodicity of a periodic signal from a reference clock. In embodiments, $t_{skew}$ is the skew between clock paths to the two flip-flops on FPGA 3100.

In embodiments where there is a phase difference with the transmitter clock running less than 45° ahead of the receiver clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, the transmit clock signal may also sample on the opposite edge as the receiving clock signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

In the embodiment of FIG. 3B, to avoid instability, the internal PLL of the adjustable transceiver PLL 3108 preferably runs at the highest bandwidth available from the PLL on the FPGA, while the overall phase locking system including the phase detectors 3206 and controller 3202 runs at a low bandwidth. In embodiments, the highest bandwidth available from the PLL on the FPGA may range between 100 kHz and 10 MHz. In such embodiments, the poles in the adjustable transceiver PLL 3108 are prevented from affecting the gain or phase margin of the off-chip PLL which may be included in the controller 3202. In embodiments, any loop filter order may be used in the controller 3202 as long as the bandwidth is low enough to avoid interaction of poles in the control system. In embodiments, a low bandwidth may be, for example, 100 Hz-40 kHz, 400 Hz and 4 khz, 4 kHz and 10 kHz, 100 hz to 40 kHz, 0 Hz and 100 Hz, to name a few. In embodiments, a second-order loop filter may be used in an effort to improve lock time and phase locking error. In embodiments a third-order filter may be used if the second-order filter is stable. In embodiments, a first-order filter is also an option when the second-order filter has stability problems. In embodiments, other order filters may be used, depending on the internal bandwidth of the FPGA 3100.

In embodiments, where the bandwidth of the controller 3202 is too low, the receiving clock and the transmitter clock may not track each other closely enough to consider them locked. In embodiment, such tracking issues may be solved by adjusting the min and max delay constraints appropriately to provide a cushion for the clocks being away from the expected phase. In embodiments, a PD (Phase Detector) control system may be provided after the loop filter to aid in resolving tracking issues. In embodiments, tracking issues may be addressed by adding some nonlinearity in the transfer function of the filter. Other solutions may also be possible.

In the embodiment of FIG. 3B, the controller 3202 utilizes a phase-locked loop. In embodiments, a derivative component may be provided in the loop filter to slow down the control loop when the output value has changed recently and reduces the chance that the PLLs on the FPGA will lose lock. In embodiments, the derivative component's coefficient will be negative (i.e., the derivative component will act against the loop filter, however, some references refer to this as being a positive direction) and less than 1 (so the path straight from the filter dominates). The loop filter consists of a standard PLL loop filter with bandwidth between 400 Hz and 40 kHz of up to 4th order plus a derivative component that slows down the loop based on recent changes in the filter value. The bandwidth of the standard PLL loop filter, in some embodiments, may range between 400 Hz and 4 khz, 4 kHz and 10 kHz, 100 hz to 40 kHz, 0 Hz and 100 Hz, to name a few. The extra derivative component helps to keep the other components in the control system in their linear operating regions. The loop filter is represented by DigitalFilter( ) in the pseudocode provided below.

Figure 3C:
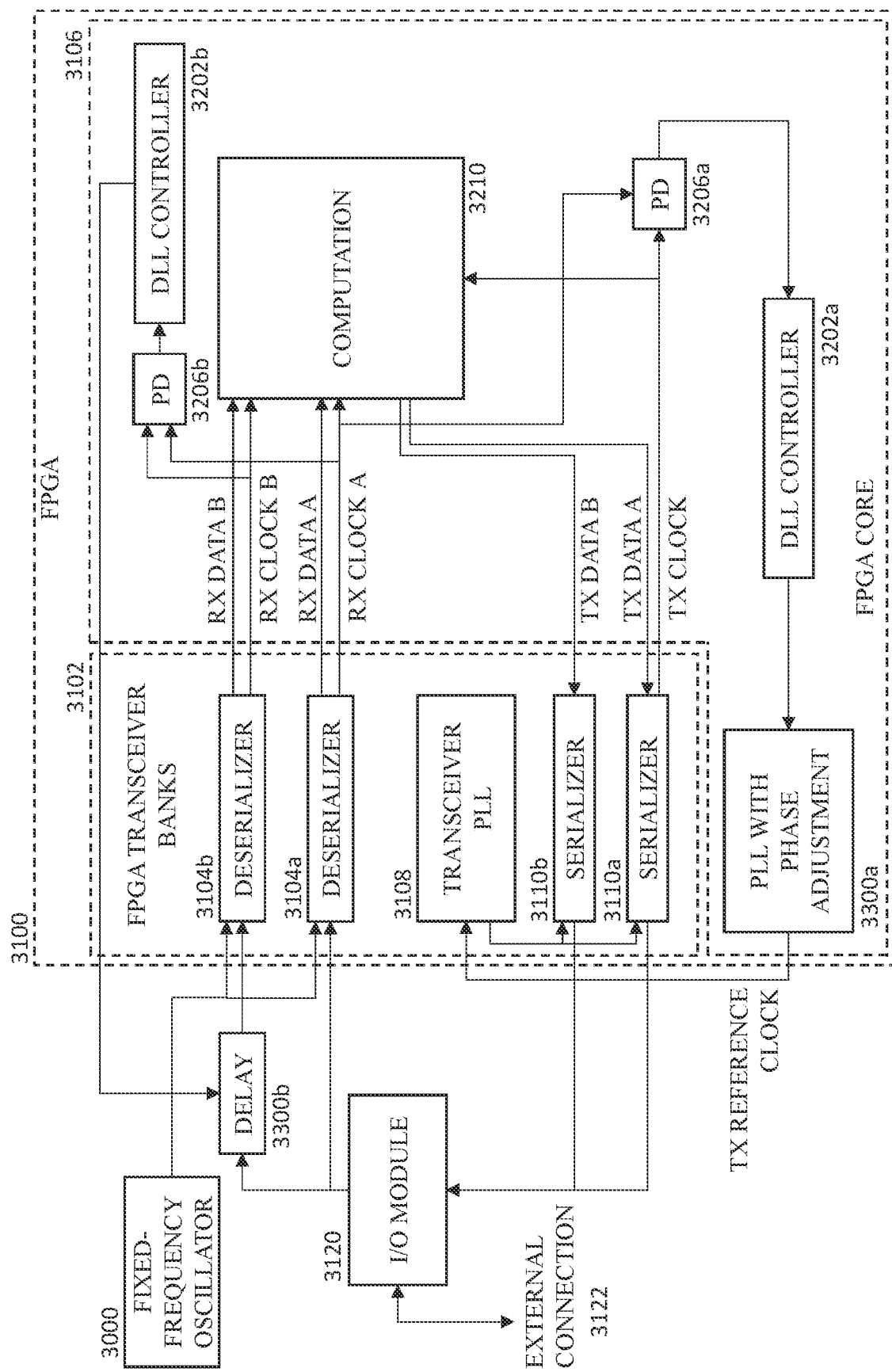
FIG. 3C is a block diagram of a field programmable gate array system in accordance with an exemplary embodiment of the present invention.

FIG. 3C illustrates a block diagram of another embodiment of an FPGA system in accordance with an exemplary embodiment of the present invention. Like in the embodiment shown in FIG. 3A, a PLL with phase adjustment 3300a located within the FPGA core 3106 is used by the FPGA system in FIG. 3C. Unlike in the embodiment shown in FIG. 3A, however, an additional control loop, comprising a phase detector 3206b, a controller 3202b, and an external delay element 3300b, may be used to allow multiple deserializers 3104a, 3104b and serializers 3110a, 3110b to be aligned. Multiple deserializers and serializers, as opposed to one of each, allow FPGA 3100 to receive more input data and more output data. In such systems, for every additional receiver that needs to be phase-aligned, an additional control loop is required.

In embodiments, the additional control loop may use a similar method to the control loop for phase aligning a transmitter to the receiver. However, in embodiments, the control loop may use a delay element 3300b on the received data rather than adjusting the frequency or phase of an oscillator. The control loop may also include a deserializer 3104b in the feedback path instead of a transceiver PLL. In such embodiments, the required bandwidth may change or cause different types of nonlinearities. Otherwise, the method for phase-aligning additional receivers generally corresponds to the method used to phase align a transmitter and a receiver, as discussed.

In embodiments, the external delay element 3300b may have an adjustment range at least as wide as one period of the parallel RX clock. This can be accomplished by using a long delay line or a pair of smaller delay lines with a glitch-free switchover circuit to hide the boundary conditions of the delay lines. In embodiments, the delay element 3300b may be implemented with a digital delay line (e.g., the SY89295U from Micrel), or a voltage-controlled delay element (e.g., the HMC910 from Analog devices).

In embodiments, the additional controller 3202b utilizes a delay-locked loop. In embodiments, a derivative component may be provided in the loop filter to slow down the control loop when the output value has changed recently and reduces the chance that the PLLs on the FPGA will lose lock. In embodiments, the derivative component's coefficient will be negative, i.e., the derivative component will act against the loop filter (however, some references refer to this as being a "positive" direction) and less than 1 so that the path straight from the filter dominates. The loop filter consists of a standard PLL loop filter with bandwidth between 400 Hz and 40 kHz of up to 4th order plus a derivative component that slows down the loop based on recent changes in the filter value. In embodiments, the bandwidth of the standard PLL loop filter may range between 400 Hz and 4 kHz, 4 kHz and 10 kHz, 100 Hz and 40 kHz, 0 Hz and 100 Hz, to name a few. The extra derivative component helps to keep the other components in the control system in their linear operating regions. The loop filter is represented by DigitalFilter( ) in the pseudocode provided below.

In the embodiment of FIG. 3C, there are three clocks which should be aligned, and the required timing constraints for passing data from one clock domain to another all follow the same pattern. In embodiments where there is a phase difference between any pair of aligned clocks with one clock running less than 45 degrees ahead of the other clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, one of the clock signals may also sample on the opposite edge as the signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

Figure 3D:
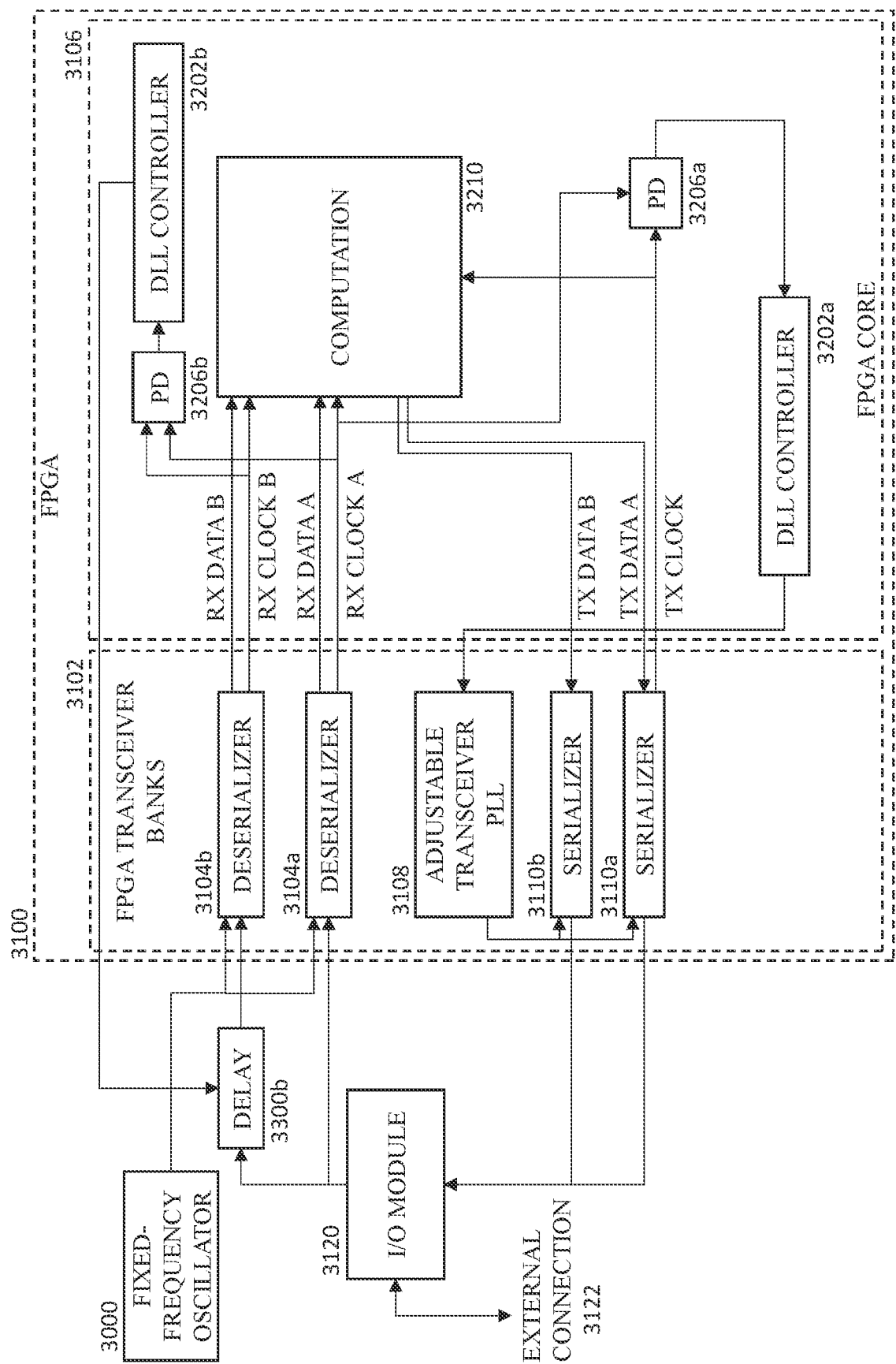
FIG. 3D is a block diagram of a field programmable gate array system in accordance with an exemplary embodiment of the present invention.

FIG. 3D illustrates a block diagram of another embodiment of an FPGA system in accordance with an exemplary embodiment of the present invention. Like in the embodiment shown in FIG. 3B, an adjustable transceiver PLL 3108 located within the FPGA transceiver banks 3102 is used by the FPGA system of FIG. 3D. Unlike in the embodiment shown in FIG. 3B, however, an additional control loop similar to the additional control loop in FIG. 3C is used to allow multiple deserializers 3104a, 3104b and serializers 3110a, 3110b to be aligned. In embodiments, the additional control loop may operate in the manner identical to the additional control loop described for FIG. 3C.

Figure 3E:
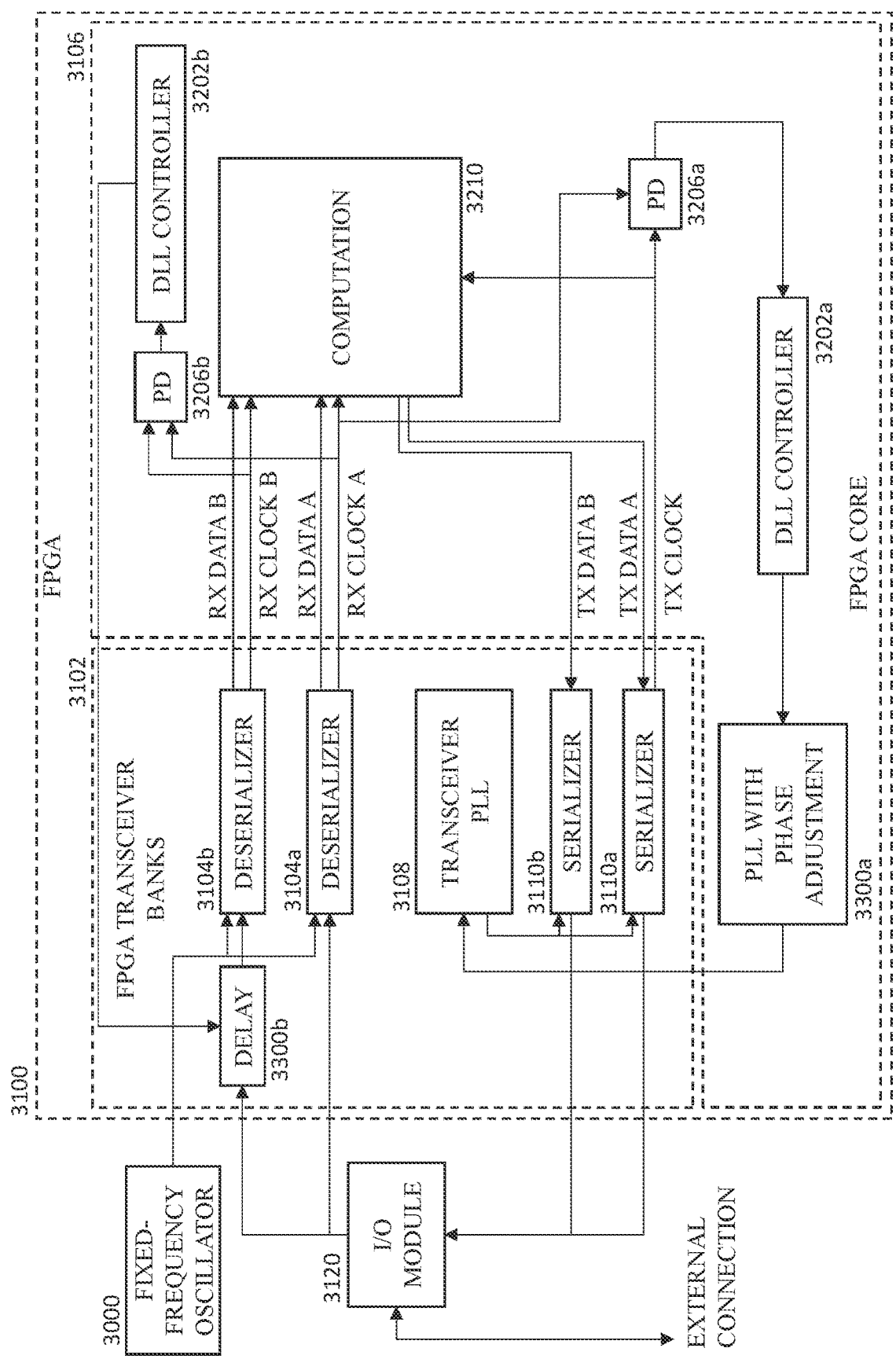
FIG. 3E is a block diagram of a field programmable gate array system in accordance with an exemplary embodiment of the present invention.

FIG. 3E illustrates a block diagram of another embodiment of an FPGA system in accordance with an exemplary embodiment of the present invention. This embodiment is similar to the embodiment shown in FIG. 3C in almost all aspects, except that the delay element 3300b is internal to the FPGA 3100 in FIG. 3E, unlike the delay element 3300b located outside of the FPGA 3100 in FIG. 3C. In embodiments, the delay element 3300b in FIG. 3E has the same requirements as the external delay element shown in FIG. 3C.

Figure 3F:
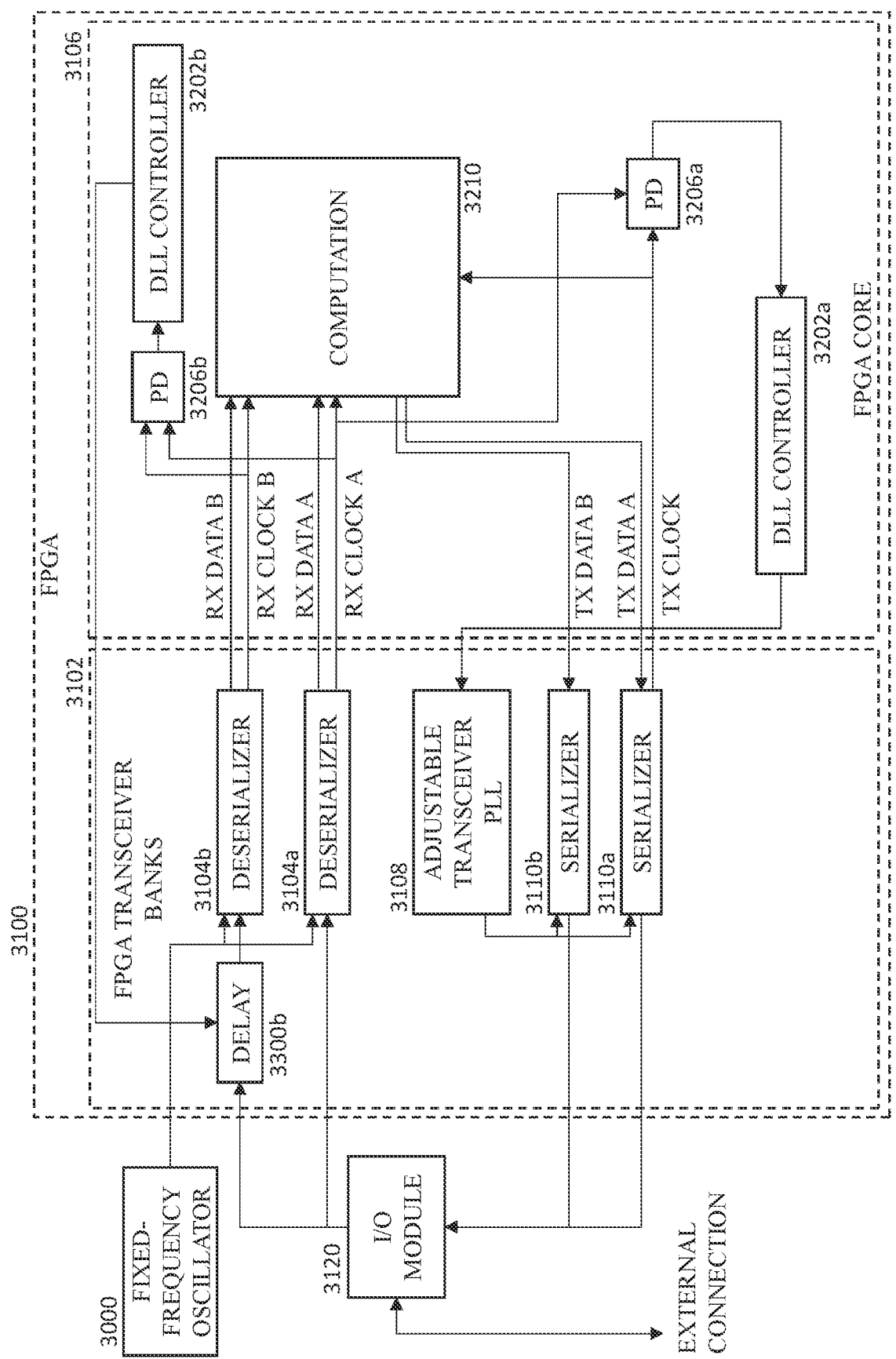
FIG. 3F is a block diagram of a field programmable gate array system in accordance with an exemplary embodiment of the present invention.

FIG. 3F illustrates a block diagram of another embodiment of an FPGA system in accordance with an exemplary embodiment of the present invention. This embodiment is similar to the embodiment shown in FIG. 3D in almost all aspects, except that the delay element 3300b is internal to the FPGA 3100 in FIG. 3F, unlike the delay elements 3300b located outside of the FPGA 3100 in FIG. 3D. The delay element 3300b has the same requirements as the external delay element shown in FIG. 3D.

Figure 4A:
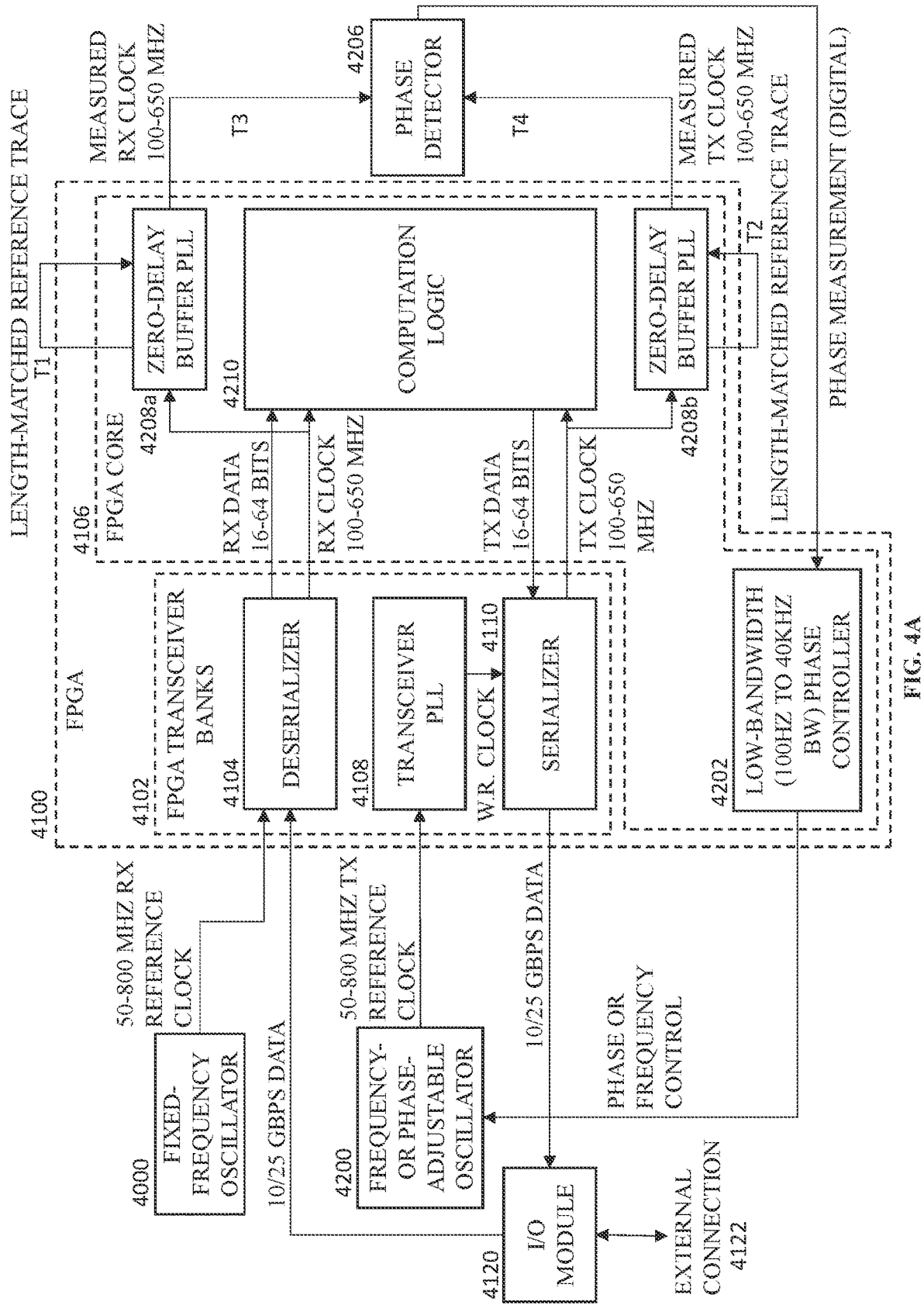
FIG. 4A is a block diagram of a field programmable gate array system in accordance with an exemplary embodiment of the present invention.

FIG. 4A is a block diagram of another FPGA system in accordance with an exemplary embodiment of the present invention. The system of FIG. 4A is similar to that of FIG. 3A or 3B, and common components are referred to using the same reference numbers (with a differing first digit to indicate the Figure—e.g., if the first digit of a reference numeral is "3," the reference numeral is located on FIG. 3A or 3B) as in FIGS. 3A and 3B. One difference between the system of FIG. 4A and the system of FIGS. 3A and 3B is that the phase detector 4206 is off-chip, i.e., not of the FPGA 4100. Another difference between the system of FIG. 4A and the system of FIGS. 3A and 3B is that the FPGA 4100 includes zero-delay buffer PLLS 4208a, 4208b. Another difference between the system of FIG. 4A and the system of FIGS. 3A and 3B is that an internal phase controller 4202 is operationally connected to frequency or phase adjustable oscillator 4200, which is outside the FPGA 4100, such that a phase or frequency control signal may be transmitted from the internal phase controller 4202 to transceiver PLL 4108 via the frequency or phase-adjustable oscillator 4200.

Referring back to FIG. 4A, in embodiments, the system generally includes FPGA 4100 which preferably includes FPGA transceiver banks 4102. In embodiments, the FPGA transceiver banks 4102 includes deserializer 4104 on the receiver end of FPGA 4100, transceiver PLL 4108, and serializer 4110 on the transmitter end of FPGA 4100. Deserializer 4104 may be similar to the deserializer 3014' and deserializer 3104" discussed below in connection with FIGS. 6A-6E, the descriptions of which applying herein. Serializer 4110 may be similar to serializer 3110' and serializer 3110" discussed below in connection with FIGS. 7A and 7B respectively, the descriptions of which applying herein. In embodiments, deserializer 4104 receives a serial data stream via a first plurality of data pins of a first interface from the I/O module 4120 and provides deserialized data to the FPGA core 4106. More specifically, the deserializer 4104 will provide parallel data streams to the FPGA core 4106 for processing. As illustrated, this parallel data is provided to receiver side computational element 4210a where processing and computation takes place. The resulting data may then be provided to transmitting side computational element 4210*b* where additional computation and processing may take place. FIG. 4A illustrates computational logic 4210 as a single element. In embodiments, the computational logic 4210 may be implemented as a plurality of logic elements. In embodiments, computational logic 4210 may also include one or more of the following: RAM blocks or dedicated hardened accelerators. In embodiments, when all computation is complete, the resulting data may be provided to serializer 4110 and then transmitted out of FPGA 4100, preferably via I/O module 4120, for example. In embodiments, the I/O module 4120 may be a direct soldered cable, on-chip optics, or an on-board optical transceiver, to name a few. I/O Module 4120, may be, for example, a Samtec® I/O Module Firefly® I/O Module, to name a few. Additionally, the I/O module may be designed to meet one or more of the following standards: SFP, a QSFP, a micro QSFP, or a QSFP-DD, to name a few.

In embodiments, FPGA 4100 may include one or more interfaces, such as pins. By way of example, a first interface of the one or more interfaces, may include a first plurality of pins of FPGA 4100. The first plurality of pins may be used to transmit and/or receive data and/or signals. In embodiments, the first plurality of pins may include a first reference clock pin. The first reference clock pin may be operationally connected to deserializer 4104. In embodiments, the first reference clock pin may also be operationally connected to fixed-frequency oscillator 4000 such that a first clock signal having a first phase and a first phase may be transmitted from fixed-frequency oscillator 4000 to deserializer 4104 via the first reference clock pin. In embodiments, the first clock signal may have a frequency between 50 and 800 MHZ.

In embodiments, the first plurality of pins may also include a second reference clock pin. The second reference clock pin may, in embodiments, be operationally connected to transceiver PLL 4108. The second reference clock pin, in embodiments, may be operationally connected to frequency or phase adjustable oscillator 4200 such that a second clock signal having a second phase and a second frequency may be transmitted from the frequency or phase-adjustable oscillator 4200 to transceiver PLL 4108 via the second reference clock pin. In embodiments, the second reference clock pin may be operationally connected to serializer 4110 such that the second clock signal may be transmitted from the frequency or phase-adjustable oscillator 4200 to serializer 4110 via the second reference clock pin. In embodiments, the second reference clock pin may also receive a first wire rate clock signal.

In embodiments, the first plurality of pins may also include a first plurality of data pins. The first plurality of data pins may be operationally connected deserializer 4104. In embodiments, the first plurality of data pins may also be operationally connected to I/O module 4120 such that a first serial data stream may be transmitted from external connection 4122 to deserializer via the I/O module 4120 and the first plurality of data pins. In embodiments, the first serial data stream may range between 10 to 25 GBPS.

In embodiments, the first plurality of pins may also include a second plurality of data pins. The second plurality of data pins may be operationally connected to serializer 4110. In embodiments, the second plurality of data pins may also be operationally connected to I/O module 4120 such that a second serial data stream may be transmitted from serializer 4110 to the external connection 4122 via the I/O module 4120 and the second plurality of data pins. In embodiments, the second serial data stream may range between 10 to 25 GBPS.

Although reference is made to separate first reference clock pin, second reference clock pin, first plurality of data pins and second plurality of data pins, in embodiments, each pin may be a fixed-function, fixed-location pin, connected internally through a wire. In embodiments, each pin may be a multiplexed fixed-function pin, connected internally through a multiplexer or crossbar. In embodiments, each pin may be a general purpose I/O pin connected through the FPGA core 4106. In embodiments, one or more pin may be fixed function, fixed location pines, while other pins may me multiplexed fixed function pins and/or a general purpose I/O pin.

In embodiments, the one or more interfaces may also include at least a second interface. The second interface of the one or more interfaces, may include a second plurality of pins of FPGA 4100. The second plurality of pins may be used to transmit and/or receive data and/or signals. In embodiments, the second plurality of pins may include a first clock output pin. The first clock output pin may be operationally connected to deserializer 4104. In embodiments, the first clock output pin may also be operationally connected to computation logic 4210 such that a first receiver side clock signal is transmitted from the deserializer 4104 to computation logic 4210 via the first clock output pin. Additionally, in some embodiments, the first clock output pin may also be operationally connected to zero-delay buffer PLL 4208*a* such that the receiver side clock is transmitted from the deserializer 4104 to the zero-delay buffer PLL 4208*a* via the first clock output pin. In embodiments the first receiver side clock signal may have a frequency ranging between 100-650 MHZ.

In embodiments, the second plurality of pins may also include a second clock output pin. The second clock output pin may be operationally connected to serializer 4110. In embodiments, the second clock output pin may also be operationally connected to computation logic 4210 such that a transmitter side clock signal is transmitted from the serializer 4110 to computation logic 4210 via the second clock output pin. Additionally, in some embodiments, the second clock output pin may also be operationally connected to zero-delay buffer PLL 4208*b* such that the transmitter side clock is transmitted from the serializer 4110 to the zero-delay buffer PLL 4208*b* via the second clock output pin. In embodiments the transmitter side clock signal may have a frequency ranging between 100-650 MHZ.

In embodiments, the serializer 4110 and deserializer 4104 (SERDES) circuit(s) may contain two major sections: (a) an analog side whose purpose is signal cleaning, and (2) a digital side which turns the analog signal into bits and converts between parallel and serial data streams. In embodiments, the analog side may include a few different types of amplifiers in order to provide signal cleaning. In embodiments, the adjustable oscillator 4200 may be implemented in a variety of ways. In embodiments, the adjustable oscillator 4200 may be implemented as a voltage controlled oscillator. A voltage controller oscillator may be implemented using a variety of architectures. In embodiments, other types of oscillators may be used including negative-resistance oscillators, Clapp oscillators, Colpitts oscillators, ring oscillators, and varactor-tuned oscillators, to name a few.

In embodiments, a voltage controller crystal oscillator may be used as the adjustable oscillator 4200, for example, the Si550 from Silicon Labs. In embodiments, a numerically/digitally-controlled oscillator may be used as the adjustable oscillator 4200, which is a digital version of an analog VCO, and may use switched circuit elements or a fixed frequency oscillator and a digital PLL to adjust the frequency.

In embodiments, the adjustable oscillator 4200 may be implemented with a digital delay line, e.g., the SY89295U from Micrel.

In embodiments, the adjustable oscillator 4200 may be implemented as a voltage-controlled delay element, e.g., the HMC910 provided by Analog devices.

As illustrated in FIG. 4A, in embodiments, the first receiver side clock signal RXCLOCK is based on but has a different frequency and phase than the REFERENCE CLOCK signal provided by oscillator 4200 based on the operation of the deserializer 4104, as is discussed above with respect to the serializer 4110. In embodiments, the transmitter side clock signal TXCLOCK provided from the deserializer 4104 may be provided by transceiver phase locked loop 4108, which is provided inside FPGA 4100, and may be controlled by frequency or phase adjustable oscillator 4200, external to FPGA 4100. In this manner, the frequency or phase of the transmitter side clock signal TXCLOCK may be adjusted.

In embodiments, an internal phase controller 4202 is connected to the frequency or phase adjustable oscillator 4200 and provides control signals to allow for adjustment of the phase of at least the transmitter side clock signal TXCLOCK. The phase of the incoming data, in embodiments, may be adjusted by adjusting the data stream received by I/O module 4120. In embodiments, the internal phase controller 4202 provides control signals based on the phase difference between the receiver clock signal RXCLOCK and the transmitter clock signal TXCLOCK. In embodiments, the phase difference may be determined using phase detector 4206 and zero-delay buffers, 4208a, 4208b. In embodiments, the zero-delay buffers 4208a, 4208b may be incorporated into the FPGA core 4106 of the FPGA 4100. In embodiments, FPGA core 4106 may not include the zero-delay buffers 4208a, 4208b. In embodiments, zero-delay buffer 4208a may have a reference trace T1 whose length is matched to a length of wire T3 between the I/O pin of FPGA 4100 and external phase detector 4206. Similarly, zero delay buffer 4208b may have a reference trace T2 whose length is matched to a second length of wire T4 between the I/O pin of the FPGA 4100 and the external phase detector 4206. Any length mismatch between reference traces T1 and wire T3 between the I/O pin of the FPGA 4100 and the external phase detector 4206 may introduce a deterministic phase error proportional to the mismatch of the length of the wires. Any length mismatch between reference traces T2 and wire T4 between the I/O pin of the FPGA 4100 and the external phase detector 4206 may introduce a deterministic phase error proportional to the mismatch of the length of the wires.

In embodiments, the transceiver PLL 4108 may include a second adjustable oscillator. In embodiments, the second adjustable oscillator of the transceiver PLL 4108 may provide the wire rate signal to the serializer 4110 which may be used to provide the transmitter clock signal TX CLOCK. In embodiments, the adjustable oscillator of the transceiver PLL 4108 may be provided outside of the transceiver PLL 4108 and operatively connected to the serializer 4110. In embodiments, where a second adjustable oscillator is provided in the FPGA 4100, the adjustable oscillator 4200 may not be necessary and the output of the controller 4202 may be provided to and used by the second adjustable oscillator to adjust the first wire rate clock signal W.R. CLOCK provided to the serializer 4110 based on the information from the controller. In embodiments, where the second adjustable oscillator is provided on the FPGA 4100 and the adjustable oscillator 4200 is also provided off the FPGA, the delay of the second adjustable oscillator may be set to a constant value and the controller 4202 may provide instructions to the second adjustable oscillator based on this constant value. In embodiments, the constant value may be zero.

Using the configuration of FIG. 4A, the receiver clock signal RXCLOCK and the transmitter clock signal TXCLOCK are sufficiently aligned in phase such that there is no need for the clock domain crossing circuit discussed above, eliminating a technical problem. The technical solution to a technical problem, in embodiments, is shown in the system of FIG. 4A, which provides a wire or a logic path via the controller 4202 and adjustable oscillator 4200 to adjust the phase of the transmitter side clock TMCLOCK to correspond to that of the first receiver side clock signal RXCLOCK. Some delays may be introduced in the path including min_delay and max_delay constraints of the wire and components, however, such delays are insignificant compared to the larger delays that are necessarily present when an asynchronous clock domain crossing circuit is used.

In embodiments, zero delay buffers 4208a, 4208b may be configured to add a phase offset such that the receiver clock signal RXCLOCK and the transmitter clock signal TXCLOCK may be provided with any desired fixed phase offset with respect to each other. In such embodiments, any phase difference may be used, depending on the length of the logic path between the clocks and the corresponding delay constraints. In embodiments, with a phase difference between about 45° and 360°, the min_delay should be set at 0 and the max_delay should be set equal to the time between rising edges on the receive clock signal and transmit clock signal (as shown in FIGS. 2A and 2B). The difference between 45° and 360° approximates the minimum amount of time required to safely capture data. In embodiments, the formula for the time is as follows:

$$t_{min} = t_{setup} + t_{wire} + t_{clock-out} + \Delta t_{jitter} + t_{skew}$$

Referencing the above equation, $t_{setup}$ is the setup time of a flip-flop (i.e., a latch) on FPGA 4100. The $t_{wire}$ is the delay of the, for example, shortest wire (as compared to other wires on the FPGA) on FPGA 4100. In embodiments, the shortest wire is the shortest possible wire. In embodiments, $t_{clock-out}$ is the clock-to-output time of a flip-flop on the FPGA 4100. In embodiments, $\Delta t_{jitter}$ is a safety factor for jitter on both clocks. Jitter, for example, is the deviation from true periodicity of a periodic signal from a reference clock. In embodiments, $t_{skew}$ is the skew between clock paths to the two flip-flops on FPGA 4100.

In embodiments where there is a phase difference with the transmitter clock running less than 45 degrees ahead of the receiver clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, the transmit clock signal may also sample on the opposite edge as the receiving clock signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

In embodiments, to avoid instability, both the transceiver PLL 4108 and the zero-delay buffer PLL 4208b preferably run at the highest bandwidth available, while the overall phase locking system including the phase detectors 4206, controller 4202 and oscillator 4200 runs at a low bandwidth. In such embodiments, the poles in the on-chip PLLs on the FPGA 4100 are prevented from affecting the gain or phase margin of the off-chip PLL which may be included in the controller 4202. In embodiments, any loop filter order may be used in the controller 4202 as long as the bandwidth is low enough to avoid interaction of poles in the control system. In embodiments, a low bandwidth may be, for example, 100 Hz-40 kHz, 400 Hz and 4 khz, 4 kHz and 10 kHz, 100 hz to 40 kHz, 0 Hz and 100 Hz, to name a few. In embodiments, a second-order loop filter may be used in an effort to improve lock time and phaselocking error. In embodiments a third-order filter may be used if the second-order filter is stable. In embodiments, a first-order filter is also an option when the second-order filter has stability problems. In embodiments, other order filters may be used, depending on the internal bandwidth of the FPGA 4100.

In embodiments, where the bandwidth of the controller 4202 is too low, the receiving clock and the transmitter clock may not track each other closely enough to consider them locked. In embodiment, such tracking issues may be solved by adjusting the min and max delay constraints appropriately to provide a cushion for the clocks being away from the expected phase. In embodiments, a PD control system may be provided after the loop filter to aid in resolving tracking issues. In embodiments, tracking issues may be addressed by adding some nonlinearity in the transfer function of the filter. Other solutions may also be possible.

In the embodiment of FIG. 4A, the controller 4202 utilizes a phase-locked loop. In embodiments, a derivative component may be provided in the loop filter to slow down the control loop when the output value has changed recently and reduces the chance that the PLLs on the FPGA will lose lock. In embodiments, the derivative component's coefficient will be negative (i.e., the derivative component will act against the loop filter, however, some references refer to this as being a positive direction) and less than 1 (so the path straight from the filter dominates). The loop filter consists of a standard PLL loop filter with bandwidth between 400 Hz and 40 kHz of up to 4th order plus a derivative component that slows down the loop based on recent changes in the filter value. The bandwidth of the standard PLL loop filter, in some embodiments, may range between 400 Hz and 4 khz, 4 kHz and 10 kHz, 100 hz to 40 kHz, 0 Hz and 100 Hz, to name a few. The extra derivative component helps to keep the other components in the control system in their linear operating regions. The loop filter is represented by DigitalFilter( ) in the pseudocode provided below.

Figure 4B:
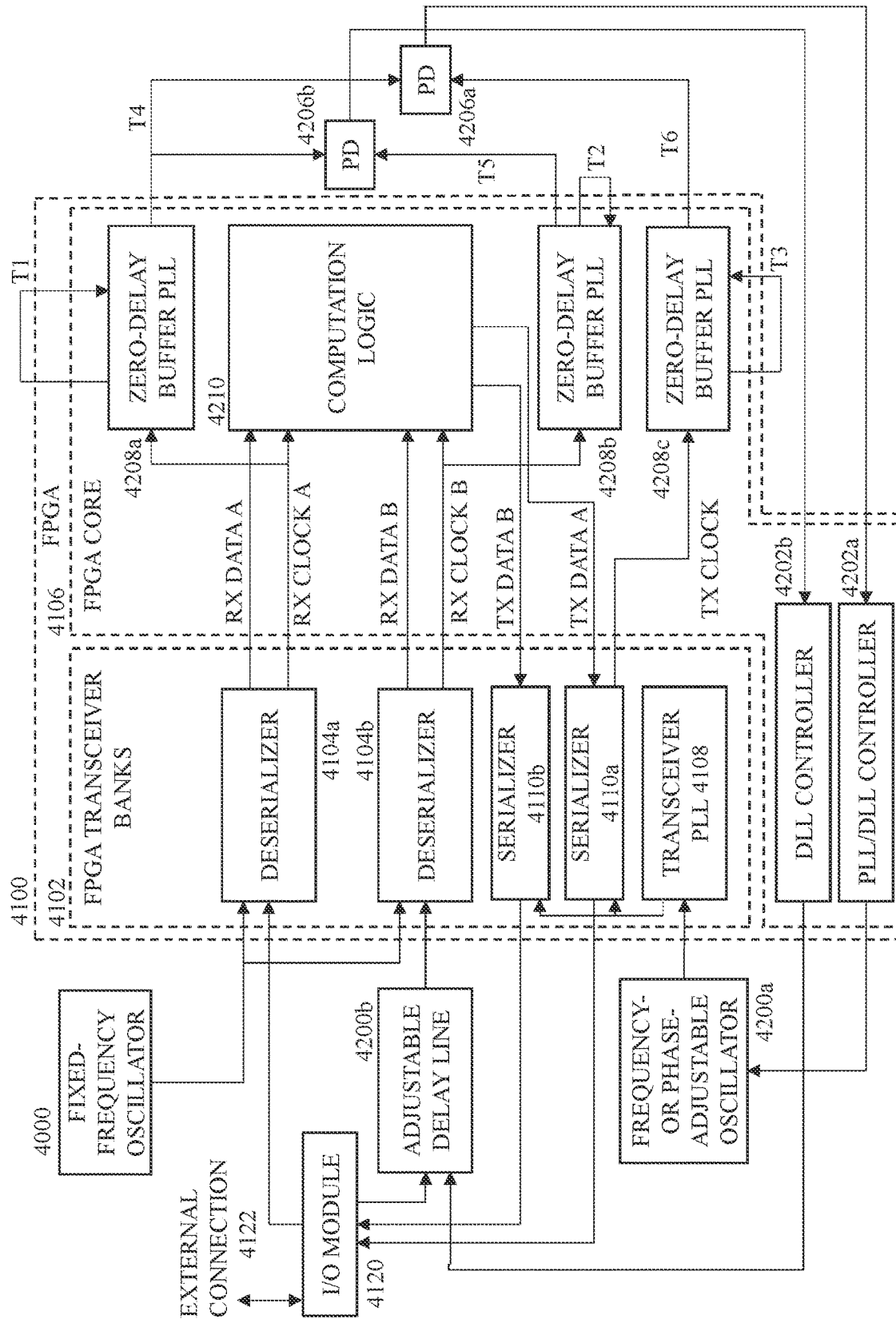
FIG. 4B is a block diagram of a field programmable gate array system in accordance with an exemplary embodiment of the present invention.

FIG. 4B illustrates a block diagram of another embodiment of an FPGA system in accordance with an exemplary embodiment of the present invention. Like the embodiment shown in FIG. 4A, the embodiment of FIG. 4B uses a frequency or phase adjustable oscillator 4200a located outside the FPGA 4100. Unlike in the embodiment shown in FIG. 4A, an additional control loop, comprising a phase detector 4206b, a controller 4202b, and an external delay element 4200b, is used in the embodiment of FIG. 4B to allow multiple deserializers 4104a, 4104b and serializers 4110a, 4110b to be aligned. For every additional receiver that needs to be phase-aligned, an additional control loop is required.

In embodiments, the external delay element 4200b may have an adjustment range at least as wide as one period of the parallel RX clock. This can be accomplished by using a long delay line or a pair of smaller delay lines with a glitch-free switchover circuit to hide the boundary conditions of the delay lines. In embodiments, the delay element 4200b may be implemented with a digital delay line (e.g., the SY89295U from Micrel), or a voltage-controlled delay element (e.g., the HMC910 from Analog devices).

In embodiments, the additional controller 4202b utilizes a delay-locked loop. In embodiments, a derivative component may be provided in the loop filter to slow down the control loop when the output value has changed recently and reduces the chance that the PLLs on the FPGA will lose lock. In embodiments, the derivative component's coefficient will be negative, i.e., the derivative component will act against the loop filter (noting, however, that some references refer to this as being a "positive" direction) and less than 1 so that the path straight from the filter dominates. The loop filter consists of a standard PLL loop filter with bandwidth between 400 Hz and 40 kHz of up to 4th order plus a derivative component that slows down the loop based on recent changes in the filter value. The bandwidth of the standard PLL loop filter, in some embodiments, may range between 400 Hz and 4 kHz, 4 kHz and 10 kHz, 100 Hz and 40 kHz, 0 Hz and 100 Hz, to name a few. The extra derivative component helps to keep the other components in the control system in their linear operating regions. The loop filter is represented by DigitalFilter( ) in the pseudocode provided below.

In the embodiment of FIG. 4B, there may be three clocks which should be aligned, and the required timing constraints for passing data from one clock domain to another all follow the same pattern. In embodiments where there is a phase difference between any pair of aligned clocks with one clock running less than 45 degrees ahead of the other clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, one of the clock signals may also sample on the opposite edge as the signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

Similar to the system described in connection with FIG. 4A, the system of FIG. 4B may or may not include zero delay buffers 4208a, 4208b, and 4208c. In embodiments, zero-delay buffer 4208a may have a reference trace T1 whose length is matched to a length of wire T4 between the I/O pin of FPGA 4100 and external phase detectors 4206a, 4206b. Similarly, zero delay buffer 4208b may have a reference trace T2 whose length is matched to a second length of wire T5 between the I/O pin of the FPGA 4100 and the external phase detector 4206a. Also, similarly, zero delay buffer 4208c may have a reference trace T3 whose length is matched to a second length of wire T6 between the I/O pin of the FPGA 4100 and the external phase detector 4206b. Any length mismatch between reference traces T1 and wire T4 between the I/O pin of the FPGA 4100 and the external phase detectors 4206a, 4206b may introduce a deterministic phase error proportional to the mismatch of the length of the wires. Any length mismatch between reference traces T2 and wire T5 between the I/O pin of the FPGA 4100 and the external phase detector 4206a may introduce a deterministic phase error proportional to the mismatch of the length of the wires. Any length mismatch between reference traces T3 and wire T6 between the I/O pin of the FPGA 4100 and the external phase detector 4206b may introduce a deterministic phase error proportional to the mismatch of the length of the wires.

Figure 4C:
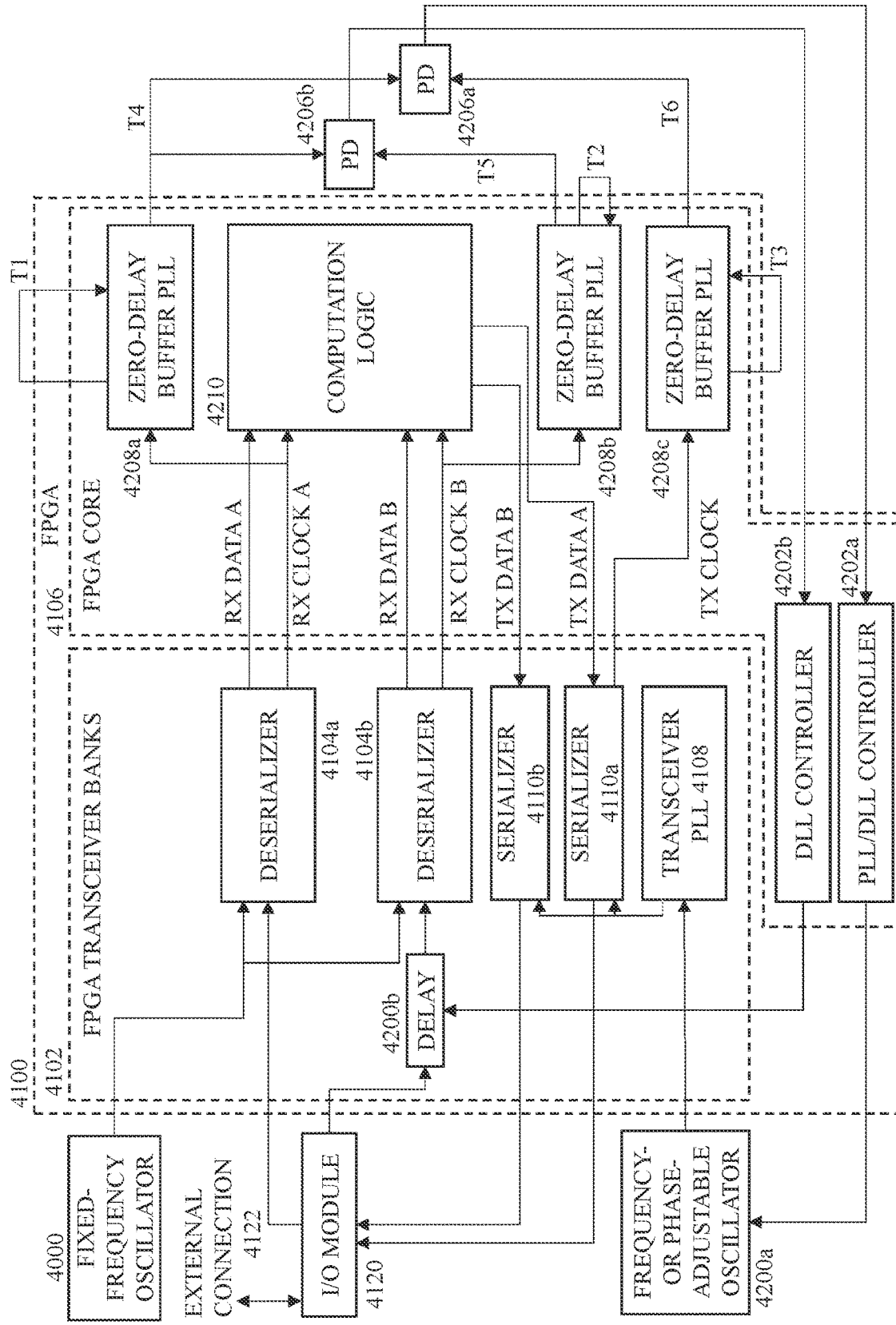
FIG. 4C is a block diagram of a field programmable gate array system in accordance with an exemplary embodiment of the present invention.

FIG. 4C illustrates a block diagram of another embodiment of an FPGA system in accordance with an exemplary embodiment of the present invention. This embodiment is similar to the embodiment shown in FIG. 4B in almost all aspects, except that the delay element 4200b is internal to the FPGA 4200b, unlike the delay element 4200b located outside of the FPGA 4100 in FIG. 4B. In embodiments, the delay element 4200b in FIG. 4C has the same requirements as the external delay element shown in FIG. 4B.

Figure 5A:
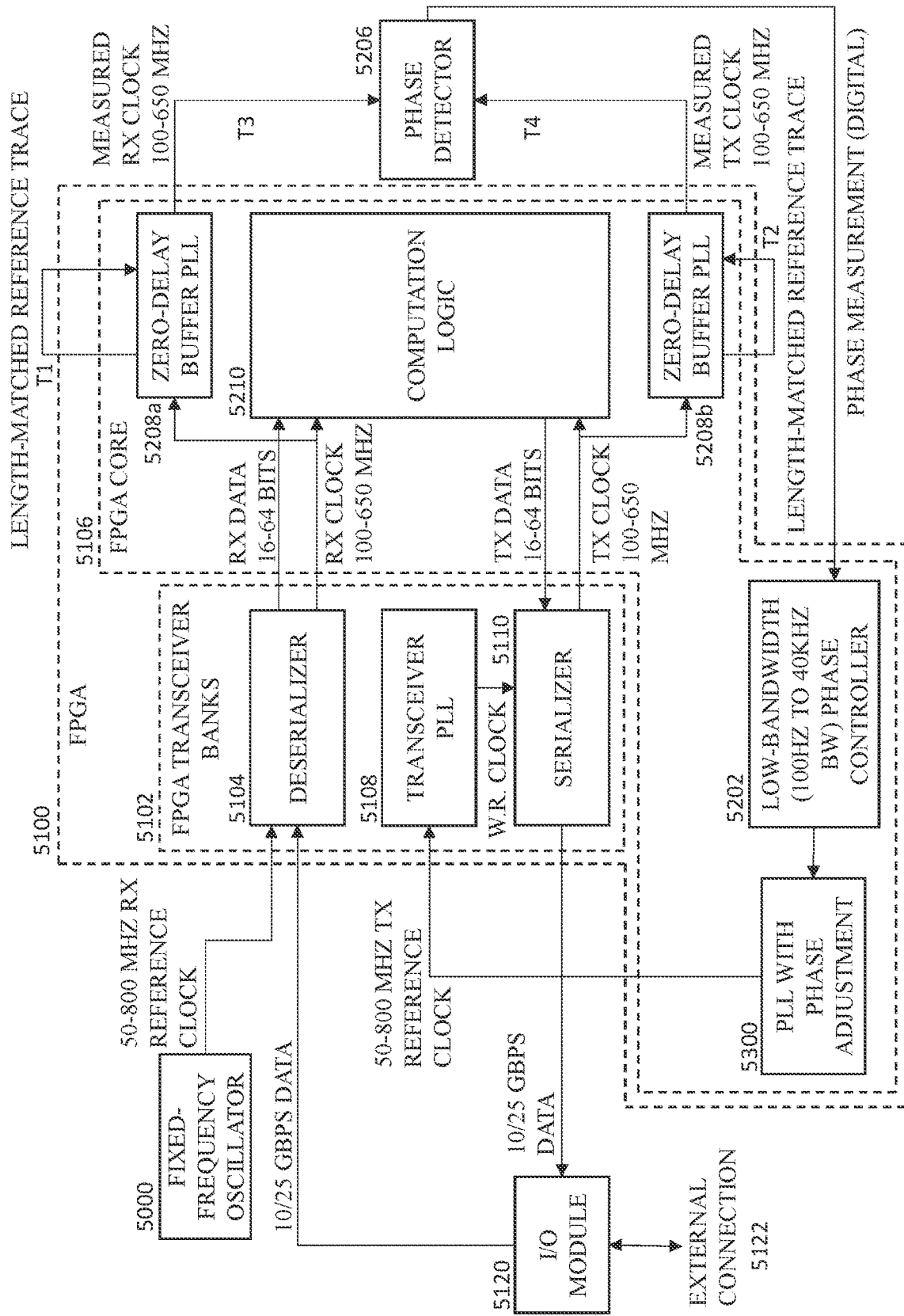
FIG. 5A is a block diagram of a field programmable gate array system in accordance with an exemplary embodiment of the present invention.

FIG. 5A is a block diagram of another FPGA system in accordance with an exemplary embodiment of the present invention. The system of FIG. 5A is similar to that of FIG. 4A, and common components are referred to using the same reference numbers (with a differing first digit to indicate the Figure—e.g., if the first digit of a reference numeral is "4," the reference numeral is located on FIG. 4A) as in FIG. 4A. Like in the system of FIG. 4A, the phase detector 5206 is off-chip, i.e., not of the FPGA 5100, and the FPGA 5100 also includes zero-delay buffer PLLS 5208a, 5208b. On the other hand, the system of FIG. 5A is different from the system of FIG. 4A in that an internal phase controller 5202 is operationally connected to the PLL with phase adjustment 5300 located within the FPGA core 5106, through which the internal phase controller provides phase control to the transceiver PLL 5108.

FIG. 5A illustrates a block diagram of an FPGA system in accordance with an exemplary embodiment of the present disclosure that provides phase control while minimizing latency. In embodiments, the system generally includes FPGA 5100 which preferably includes FPGA transceiver banks 5102. In embodiments, the FPGA transceiver banks 5102 includes deserializer 5104 on the receiver end of FPGA 5100, transceiver PLL 5108, and serializer 5110 on the transmitter end of FPGA 5100. Deserializer 5104 may be similar to the deserializer 3104' and deserializer 3104" discussed below in connection with FIGS. 6A-6E, the descriptions of which applying herein. Serializer 5110 may be similar to serializer 3110' and serializer 3110" discussed below in connection with FIGS. 7A and 7B respectively, the descriptions of which applying herein. In embodiments, deserializer 5104 receives a serial data stream from the I/O module 5120 and provides deserialized data to the FPGA core 5106. More specifically, the deserializer 5104 will provide parallel data streams to the FPGA core 5106 for processing. As illustrated, this parallel data is provided to the computational logic 5210 where processing and computation takes place. FIG. 5A illustrates computational logic 5210 as a single element with a receiver side and a transmitting side. In embodiments, the computational logic 5210 may be implemented as a plurality of logic elements. In embodiments, when all computation is complete, the resulting data may be provided to serializer 5110 and then transmitted out of FPGA 5100, preferably via I/O module 5120, for example. In embodiments, the I/O module may be a direct soldered cable, on-chip optics, or an on-board optical transceiver, to name a few. Additionally, the I/O module may be an SFP, a QSFP, a micro QSFP, or a QSFP-DD, to name a few.

In embodiments, the serializer 5110 and deserializer 5104 (SERDES) circuit(s) may contain two major sections: (1) an analog side whose purpose is signal cleaning, and (2) a digital side which turns the analog signal into bits and converts between parallel and serial data streams. In embodiments, the analog side may include a few different types of amplifiers in order to provide signal cleaning.

In embodiments, as shown in FIG. 5A, a PLL with phase adjustment 5300 may be located inside the FPGA 5100 fabric with adjustable feedback dividers, which in turn adjust the frequency of the PLL. Alternatively, the PLL with phase adjustment 5300 may comprise a phase adjuster on the output of the loop, which adjusts the phase of the PLL directly. In embodiments, the same description may apply to adjustable transceiver PLLs 3108 and 5108 respectively shown in FIGS. 3B and 5B, but the differences are the location of the PLL inside the FPGA (e.g., within the FPGA core 5106 versus outside the FPGA core and within the FPGA transceiver banks 3102, 5102) and the operating frequency.

As illustrated in FIG. 5A, in embodiments, the first receiver side clock signal RXCLOCK is based on but has a different frequency and phase than the REFERENCE CLOCK signal provided by oscillator 5000 based on the operation of the deserializer 5104, as is discussed above with respect to the serializer 104. In embodiments, the transmitter side clock signal TXCLOCK provided from the serializer 5110 may be provided by transceiver phase locked loop 5108, which is provided inside FPGA 5100, and may be controlled by PLL with Phase Adjustment 5300 of the FPGA core 5106. In this manner, the frequency or phase of the transmitter side clock signal TXCLOCK may be adjusted.

As illustrated in FIG. 5A, in embodiments, the first receiver side clock signal RXCLOCK is based on but has a different frequency and phase than the REFERENCE CLOCK signal provided by oscillator 5000 based on the operation of the deserializer 5104, as is discussed above with respect to the serializer 104. In embodiments, the transmitter side clock signal TXCLOCK provided from the serializer 5110 may be provided by transceiver phase locked loop 5108, which is provided inside FPGA 5100, and may be controlled by a PLL with Phase Adjustment 5300 of the FPGA core 5106. In this manner, the frequency or phase of the transmitter side clock signal TXCLOCK may be adjusted.

In embodiments, an internal phase controller 5202 is connected to the PLL with Phase Adjustment 5300 and provides control signals to allow for adjustment of the phase of at least the transmitter side clock signal TXCLOCK. In embodiments, the phase of the incoming data may be adjusted by adjusting the data stream received by I/O module 5120. In embodiments, the phase difference may be determined using phase detector 5206 which is external to the FPGA. In embodiments, with a phase difference between about 45° and 360°, the min_delay should be set at 0 and the max_delay should be set equal to the time between rising edges on the receive clock signal and transmit clock signal (as shown in FIGS. 2A and 2B). The difference between 45° and 360° approximates the minimum amount of time required to safely capture data. In embodiments, the formula for the time is as follows:

$$t_{min} = t_{setup} + t_{wire} + t_{clock-out} + \Delta t_{jitter} + t_{skew}$$

Referencing the above equation, $t_{setup}$ is the setup time of a flip-flop (i.e., a latch) on FPGA 3100. The $t_{wire}$ is the delay of the, for example, shortest wire (as compared to other wires on the FPGA) on FPGA 3100. In embodiments, the shortest wire is the shortest possible wire. In embodiments, $t_{clock-out}$ is the clock-to-output time of a flip-flop on the FPGA 3100. In embodiments, $\Delta t_{jitter}$ is a safety factor for jitter on both clocks. Jitter, for example, is the deviation from true periodicity of a periodic signal from a reference clock. In embodiments, $t_{skew}$ is the skew between clock paths to the two flip-flops on FPGA 3100.

In embodiments where there is a phase difference with the transmitter clock running less than 45 degrees ahead of the receiver clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, the transmit clock signal may also sample on the opposite edge as the receiving clock signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

In the embodiment of FIG. 5A, both the transceiver PLL 5108 and the zero-delay buffer PLL 5208b preferably run at the highest bandwidth available from the PLL on the FPGA, while the overall phase locking system including the phase detectors 5206, controller 5202 and PLL with Phase Adjustment 5300 runs at a low bandwidth. In such embodiments, the poles in the adjustable transceiver PLL 5108 are prevented from affecting the gain or phase margin of the off-chip PLL which may be included in the controller 5202. In embodiments, the highest bandwidth available from the PLL on the FPGA may range between 100 kHz and 10 MHz. In embodiments, any loop filter order may be used in the controller 5202 as long as the bandwidth is low enough to avoid interaction of poles in the control system. In embodiments, a low bandwidth may be, for example, 100 Hz-40 kHz, 400 Hz and 4 kHz, 4 kHz and 10 kHz, 100 Hz and 40 kHz, 0 Hz and 100 Hz, to name a few. In embodiments, a second-order loop filter may be used in an effort to improve lock time and phaselocking error. In embodiments a third-order filter may be used if the second-order filter is stable. In embodiments, a first-order filter is also an option when the second-order filter has stability problems. In embodiments, other order filters may be used, depending on the internal bandwidth of the FPGA 5100.

In embodiments, the one or more interfaces may also include at least a second interface. The second interface of the one or more interfaces, may include a second plurality of pins of FPGA 5100. The second plurality of pins may be used to transmit and/or receive data and/or signals. In embodiments, the second plurality of pins may include a first clock output pin. The first clock output pin may be operationally connected to deserializer 5104. In embodiments, the first clock output pin may also be operationally connected to computation logic 5210 such that a first receiver side clock signal is transmitted from the deserializer 5104 to computation logic 5210 via the first clock output pin. Additionally, in some embodiments, the first clock output pin may also be operationally connected to zero-delay buffer PLL 5208a such that the receiver side clock is transmitted from the deserializer 5104 to the zero-delay buffer PLL 5208a via the first clock output pin. In embodiments the first receiver side clock signal may have a frequency ranging between 100-650 MHZ.

In embodiments, the second plurality of pins may also include a second clock output pin. The second clock output pin may be operationally connected to the serializer 5110. In embodiments, the second clock output pin may also be operationally connected to computation logic 5210 such that a transmitter side clock signal is transmitted from the serializer 5110 to computation logic 5210 via the second clock output pin. Additionally, in some embodiments, the second clock output pin may also be operationally connected to zero-delay buffer PLL 5208b such that the transmitter side clock is transmitted from the serializer 5110 to the zero-delay buffer PLL 5208b via the second clock output pin. In embodiments the transmitter side clock signal may have a frequency ranging between 100-650 MHZ.

The PLL with internal phase adjustment 5300 may be similar to the PLL 3300 in FIG. 3A. It is a component of the FPGA core fabric 5106 which generates a clock of adjustable phase and frequency.

In embodiments, where the bandwidth of the controller 5202 is too low, the receiving clock and the transmitter clock may not track each other closely enough to consider them locked. In embodiment, such tracking issues may be solved by adjusting the min and max delay constraints appropriately to provide a cushion for the clocks being away from the expected phase. In embodiments, a PD (Phase Detector) control system may be provided after the loop filter to aid in resolving tracking issues. In embodiments, tracking issues may be addressed by adding some nonlinearity in the transfer function of the filter. Other solutions may also be possible.

In the embodiment of FIG. 5A, the controller 5202 utilizes a phase-locked loop. In embodiments, a derivative component may be provided in the loop filter to slow down the control loop when the output value has changed recently and reduces the chance that the PLLs on the FPGA will lose lock. In embodiments, the derivative component's coefficient will be negative (i.e., the derivative component will act against the loop filter, however, some references refer to this as being a positive direction) and less than 1 (so the path straight from the filter dominates). The loop filter consists of a standard PLL loop filter with bandwidth between 400 Hz and 40 kHz of up to 4th order plus a derivative component that slows down the loop based on recent changes in the filter value. The bandwidth of the standard PLL loop filter, in some embodiments, may range between 400 Hz and 4 khz, 4 kHz and 10 kHz, 100 hz to 40 kHz, 0 Hz and 100 Hz, to name a few. The extra derivative component helps to keep the other components in the control system in their linear operating regions. The loop filter is represented by DigitalFilter( ) in the pseudocode provided below.

Figure 5B:
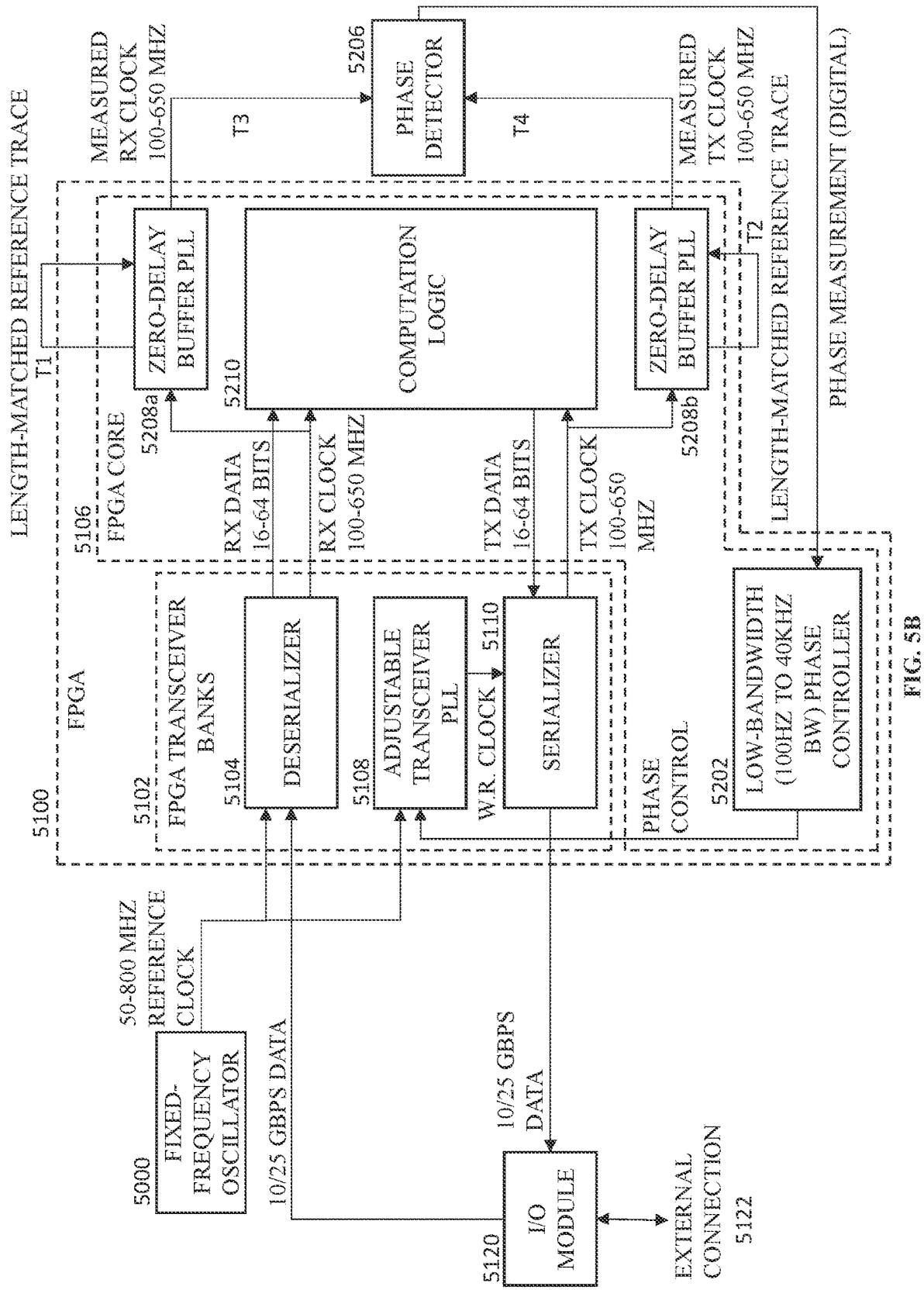
FIG. 5B is a block diagram of a field programmable gate array system in accordance with an exemplary embodiment of the present invention.

FIG. 5B is a block diagram of another FPGA system in accordance with an exemplary embodiment of the present invention. Unlike in the embodiment shown in FIG. 5A, an internal phase controller 5202 in the system of FIG. 5B is directly connected and provides phase control signals to the adjustable transceiver PLL 5108, which is located in the FPGA transceiver banks 5102 and outside the FPGA core 5106.

FIG. 5B illustrates a block diagram of an FPGA system in accordance with an embodiment of the present disclosure that provides phase control while minimizing latency wherein the FPGA has an acceptable phase-controlled transceiver PLL 5108. This embodiment uses the phase-controlled transceiver PLL directly to control the phase of TXCLOCK. An acceptable phase-control system must have adjustment gain capable of matching phase transients on the incoming data stream to within the timing margin ($t_{min}$), satisfying the following inequality:

$$\int_0^\infty |\Delta t_{pk}(\omega)[1 - LF(\omega)]| d\omega \le t_{min}$$

Where $\Delta t_{pk}(\omega)$ is the peak design jitter at that frequency and LF is the transfer function over frequency of the phase locking system consisting of the phase detector 5206, controller 5202, and PLL 5108. Expected functions for $\Delta t_{pk}(\omega)$ are specified within the protocol specifications for communication protocols used. For 10 Gigabit Ethernet, this is specified in clause 52.8 of the IEEE 802.3 standard.

In embodiments, the system of FIG. 5B generally includes FPGA 5100 which preferably includes FPGA transceiver banks 5102. In embodiments, the FPGA transceiver banks 5102 includes deserializer 5104 on the receiver end of FPGA 5100, transceiver PLL 5108, and serializer 5110 on the transmitter end of FPGA 5100. Deserializer 5104 may be similar to the deserializer 3104' and deserializer 3104" discussed below in connection with FIGS. 6A-6E, the descriptions of which applying herein. Serializer 5110 may be similar to serializer 3110' and serializer 3110" discussed below in connection with FIGS. 7A and 7B respectively, the descriptions of which applying herein. In embodiments, deserializer 5104 receives a serial data stream from the I/O module 5120 and provides deserialized data to the FPGA core 5106. More specifically, the deserializer 5104 will provide parallel data streams to the FPGA core 5106 for processing. As illustrated, this parallel data is provided to the computational logic 5210 where processing and computation takes place. FIG. 5B illustrates computational logic 5210 as a single element with a receiver side and a transmitting side. In embodiments, the computational logic 5210 may be implemented as a plurality of logic elements. In embodiments, when all computation is complete, the resulting data may be provided to serializer 5110 and then transmitted out of FPGA 5100, preferably via I/O module 5120, for example. In embodiments, the I/O module may be a direct soldered cable, on-chip optics, or an on-board optical transceiver, to name a few. Additionally, the I/O module may be an SFP, a QSFP, a micro QSFP, or a QSFP-DD, to name a few.

In embodiments, the serializer 5110 and deserializer 5104 (SERDES) circuit(s) may contain two major sections: (1) an analog side whose purpose is signal cleaning, and (2) a digital side which turns the analog signal into bits and converts between parallel and serial data streams. In embodiments, the analog side may include a few different types of amplifiers in order to provide signal cleaning.

In embodiments, as shown in FIG. 5B, an adjustable transceiver PLL 5108 may be located inside the FPGA 5100 fabric with adjustable feedback dividers, which in turn adjust the frequency of the PLL. Alternatively, the adjustable transceiver PLL 5108 may comprise a phase adjuster on the output of the loop, which adjusts the phase of the PLL directly. Unlike the PLL with phase adjustment 5300 in FIG. 5A, the adjustable transceiver PLL 5108 in FIG. 5B is located outside the FPGA core 5106 and within the FPGA transceiver banks 5102. The adjustable transceiver PLL 5108 in FIG. 5B may also differ from the PLL with phase adjustment 5300 in FIG. 5A in operating frequency.

As illustrated in FIG. 5B, in embodiments, the first receiver side clock signal RXCLOCK is based on, but has a different frequency and phase than, the REFERENCE CLOCK signal provided by oscillator 5000 based on the operation of the deserializer 5104, as is discussed above with respect to the serializer 104. In embodiments, the transmitter side clock signal TXCLOCK provided from the serializer 5110 may be provided by adjustable transceiver phase locked loop 5108. In this manner, the frequency or phase of the transmitter side clock signal TXCLOCK may be adjusted.

In embodiments, an internal phase controller 5202 is connected to the phase adjustment interface of the phase-controlled transceiver PLL 5108 and provides control signals to allow for adjustment of the phase of at least the transmitter side clock signal TXCLOCK. The phase of the incoming data, in embodiments, may be adjusted by adjusting the data stream received by I/O module 5120. In embodiments, the internal phase controller 5202 provides control signals based on the phase difference between the receiver clock signal RXCLOCK and the transmitter clock signal TXCLOCK. In embodiments, the phase difference may be determined using phase detector 5206.

Using the configuration of FIG. 5B, the receiver clock signal RXCLOCK and the transmitter clock signal TXCLOCK may be sufficiently aligned in phase such that there is no need for the clock domain crossing circuit discussed above, eliminating a technical problem. The technical solution to a technical problem, in embodiments, is shown in the system of FIG. 5B, which provides a wire or a logic path via the controller 5202 and adjustable transceiver PLL 5108 to adjust the phase of the transmitter side clock TXCLOCK to correspond to that of the first receiver side clock signal RXCLOCK. Some delays may be introduced in the path including min_delay and max_delay constraints of the wire and components, however, such delays are insignificant compared to the larger delays that are necessarily present when an asynchronous clock domain crossing circuit is used.

In embodiments, with a phase difference between about 45° and 360°, the min_delay should be set at 0 and the max_delay should be set equal to the time between rising edges on the receive clock signal and transmit clock signal (as shown in FIGS. 2A and 2B). The difference between 45° and 360° approximates the minimum amount of time required to safely capture data. In embodiments, the formula for the time is as follows:

$$t_{min} = t_{setup} + t_{wire} + t_{clock-out} + \Delta t_{jitter} + t_{skew}$$

Referencing the above equation, $t_{setup}$ is the setup time of a flip-flop (i.e., a latch) on FPGA 5100. The $t_{wire}$ is the delay of the, for example, shortest wire (as compared to other wires on the FPGA) on FPGA 5100. In embodiments, the shortest wire is the shortest possible wire. In embodiments, $t_{clock-out}$ is the clock-to-output time of a flip-flop on the FPGA 5100. In embodiments, $\Delta t_{jitter}$ is a safety factor for jitter on both clocks. Jitter, for example, is the deviation from true periodicity of a periodic signal from a reference clock. In embodiments, $t_{skew}$ is the skew between clock paths to the two flip-flops on FPGA 5100.

In embodiments where there is a phase difference with the transmitter clock running less than 45° ahead of the receiver clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, the transmit clock signal may also sample on the opposite edge as the receiving clock signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

In the embodiment of FIG. 5B, both the transceiver PLL 5108 and the zero-delay buffer PLL 5208*b* preferably run at the highest bandwidth available from the PLL on the FPGA, while the overall phase locking system including the phase detectors 5206 and controller 5202 runs at a low bandwidth. In such embodiments, the poles in the adjustable transceiver PLL 5108 are prevented from affecting the gain or phase margin of the off-chip PLL which may be included in the controller 5202. In embodiments, the highest bandwidth available from the PLL on the FPGA may range between 100 kHz and 10 MHz. In embodiments, any loop filter order may be used in the controller 5202 as long as the bandwidth is low enough to avoid interaction of poles in the control system. In embodiments, a low bandwidth may be, for example, 100 Hz-40 kHz, 400 Hz and 4 kHz, 4 kHz and 10 kHz, 100 Hz and 40 kHz, 0 Hz and 100 Hz, to name a few. In embodiments, a second-order loop filter may be used in an effort to improve lock time and phaselocking error. In embodiments a third-order filter may be used if the second-order filter is stable. In embodiments, a first-order filter is also an option when the second-order filter has stability problems. In embodiments, other order filters may be used, depending on the internal bandwidth of the FPGA 5100.

In embodiments, the one or more interfaces may also include at least a second interface. The second interface of the one or more interfaces, may include a second plurality of pins of FPGA 5100. The second plurality of pins may be used to transmit and/or receive data and/or signals. In embodiments, the second plurality of pins may include a first clock output pin. The first clock output pin may be operationally connected to deserializer 5104. In embodiments, the first clock output pin may also be operationally connected to computation logic 5210 such that a first receiver side clock signal is transmitted from the deserializer 5104 to computation logic 5210 via the first clock output pin. Additionally, in some embodiments, the first clock output pin may also be operationally connected to zero-delay buffer PLL 5208a such that the receiver side clock is transmitted from the deserializer 5104 to the zero-delay buffer PLL 5208a via the first clock output pin. In embodiments the first receiver side clock signal may have a frequency ranging between 100-650 MHz.

In embodiments, the second plurality of pins may also include a second clock output pin. The second clock output pin may be operationally connected to serializer 5110. In embodiments, the second clock output pin may also be operationally connected to computation logic 5210 such that a transmitter side clock signal is transmitted from the serializer 5110 to computation logic 5210 via the second clock output pin. Additionally, in some embodiments, the second clock output pin may also be operationally connected to zero-delay buffer PLL 5208b such that the transmitter side clock is transmitted from the serializer 5110 to the zero-delay buffer PLL 5208b via the second clock output pin. In embodiments the transmitter side clock signal may have a frequency ranging between 100-650 MHz.

In embodiments, where the bandwidth of the controller 5202 is too low, the receiving clock and the transmitter clock may not track each other closely enough to consider them locked. In embodiment, such tracking issues may be solved by adjusting the min and max delay constraints appropriately to provide a cushion for the clocks being away from the expected phase. In embodiments, a PD (Phase Detector) control system may be provided after the loop filter to aid in resolving tracking issues. In embodiments, tracking issues may be addressed by adding some nonlinearity in the transfer function of the filter. Other solutions may also be possible.

In the embodiment of FIG. 5B, the controller 5202 utilizes a phase-locked loop. In embodiments, a derivative component may be provided in the loop filter to slow down the control loop when the output value has changed recently and reduces the chance that the PLLs on the FPGA will lose lock. In embodiments, the derivative component's coefficient will be negative (i.e., the derivative component will act against the loop filter, however, some references refer to this as being a positive direction) and less than 1 (so the path straight from the filter dominates). The loop filter consists of a standard PLL loop filter with bandwidth between 400 Hz and 40 kHz of up to 4th order plus a derivative component that slows down the loop based on recent changes in the filter value. The bandwidth of the standard PLL loop filter, in some embodiments, may range between 400 Hz and 4 khz, 4 kHz and 10 kHz, 100 hz to 40 kHz, 0 Hz and 100 Hz, to name a few. The extra derivative component helps to keep the other components in the control system in their linear operating regions. The loop filter is represented by DigitalFilter( ) in the pseudocode provided below.

Figure 5C:
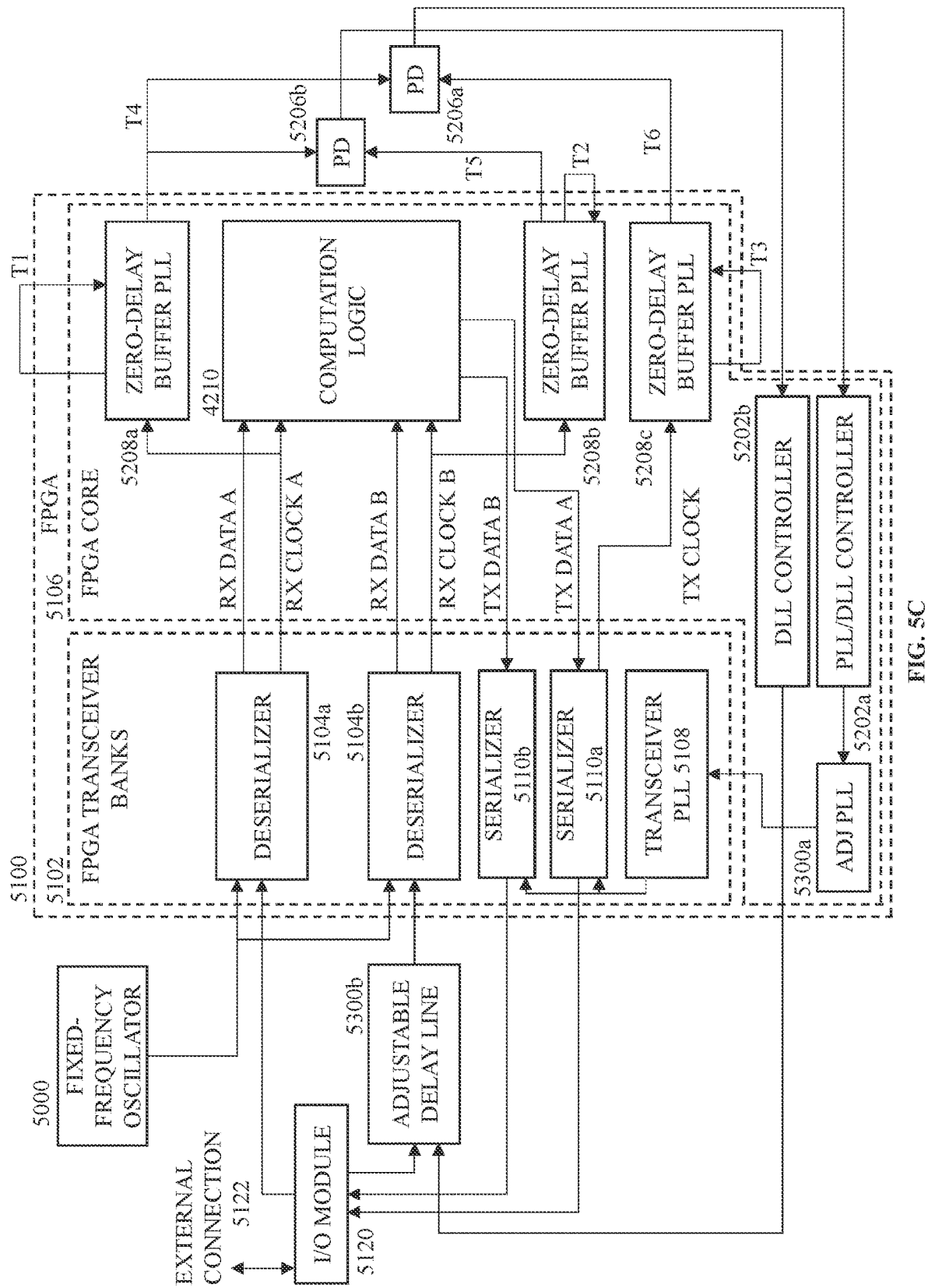
FIG. 5C is a block diagram of a field programmable gate array system in accordance with an exemplary embodiment of the present invention.

FIG. 5C illustrates a block diagram of another embodiment of an FPGA system in accordance with an exemplary embodiment of the present invention. Like the embodiment shown in FIG. 5A, a PLL with phase adjustment 5300a located within the FPGA core 5106 is used by the FPGA system in FIG. 5C. Unlike in the embodiment shown in FIG. 5A, an additional control loop, comprising a phase detector 5206b, a controller 5202b, and an external delay element 5300b, is used to allow multiple deserializers 5104a, 5104b and serializers 5110a, 5110b to be aligned. For every additional receiver that needs to be phase-aligned, an additional control loop is required.

In embodiments, the external delay element 5300b may have an adjustment range at least as wide as one period of the parallel RX clock. This can be accomplished by using a long delay line or a pair of smaller delay lines with a glitch-free switchover circuit to hide the boundary conditions of the delay lines. In embodiments, the delay element 5200b may be implemented with a digital delay line (e.g., the SY89295U from Micrel), or a voltage-controlled delay element (e.g., the HMC910 from Analog devices).

In embodiments, the additional controller 5202b utilizes a delay-locked loop. In embodiments, a derivative component may be provided in the loop filter to slow down the control loop when the output value has changed recently and reduces the chance that the PLLs on the FPGA will lose lock. In embodiments, the derivative component's coefficient will be negative, i.e., the derivative component will act against the loop filter (noting, however, that some references refer to this as being a "positive" direction) and less than 1 so the path straight from the filter dominates. The loop filter consists of a standard PLL loop filter with bandwidth between 400 Hz and 40 kHz of up to 4th order plus a derivative component that slows down the loop based on recent changes in the filter value. In embodiments, the bandwidth of the standard PLL loop filter may range between 400 Hz and 4 kHz, 4 kHz and 10 kHz, 100 Hz and 40 kHz, 0 Hz and 100 Hz, to name a few. The extra derivative component helps to keep the other components in the control system in their linear operating regions. The loop filter is represented by DigitalFilter( ) in the pseudocode provided below.

Similar to the system described in connection with FIG. 5A, the system of FIG. 5C may or may not include zero delay buffers 5208a, 5208b, and 5208c. In embodiments, zero-delay buffer 5208a may have a reference trace T1 whose length is matched to a length of wire T4 between the I/O pin of FPGA 4100 and external phase detectors 5206a, 5206b. Similarly, zero delay buffer 5208b may have a reference trace T2 whose length is matched to a second length of wire T5 between the I/O pin of the FPGA 5100 and the external phase detector 5206a. Also, similarly, zero delay buffer 5208c may have a reference trace T3 whose length is matched to a second length of wire T6 between the I/O pin of the FPGA 5100 and the external phase detector 5206b. Any length mismatch between reference traces T1 and wire T4 between the I/O pin of the FPGA 5100 and the external phase detectors 5206a, 5206b may introduce a deterministic phase error proportional to the mismatch of the length of the wires. Any length mismatch between reference traces T2 and wire T5 between the I/O pin of the FPGA 5100 and the external phase detector 5206a may introduce a deterministic phase error proportional to the mismatch of the length of the wires. Any length mismatch between reference traces T3 and wire T6 between the I/O pin of the FPGA 5100 and the external phase detector 5206b may introduce a deterministic phase error proportional to the mismatch of the length of the wires.

In the embodiment of FIG. 5C, there may be three clocks which should be aligned, and the required timing constraints for passing data from one clock domain to another all follow the same pattern. In embodiments where there is a phase difference between any pair of aligned clocks with one clock running less than 45 degrees ahead of the other clock, metastability may occur unless the clocks are treated as being greater than 360 degrees apart (as seen in FIG. 2C). In such embodiments, the min and max delay are set with the min delay greater than the time difference between rising edges and the max delay less than one full clock cycle plus the min delay. In embodiments, one of the clock signals may also sample on the opposite edge as the signal launch edge, but cases are symmetric. In embodiments, a change from positive to negative edge sampling adds an approximate 180 degrees offset. In embodiments, manufacturer analysis tools may add a reasonable jitter margin to account for times when jitter causes temporary misalignment.

Figure 5D:
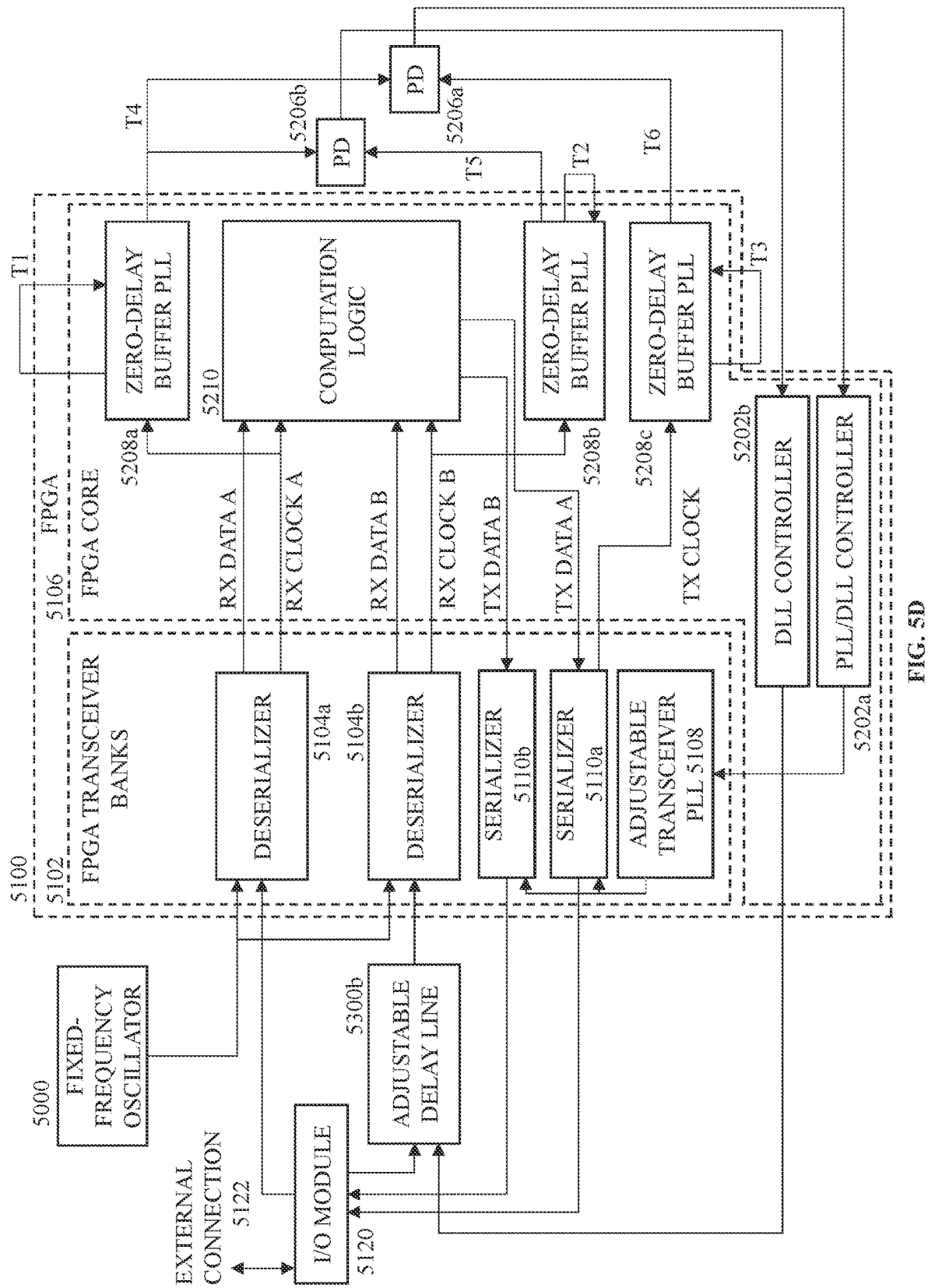
FIG. 5D is a block diagram of a field programmable gate array system in accordance with an exemplary embodiment of the present invention.

FIG. 5D illustrates a block diagram of another embodiment of an FPGA system in accordance with an exemplary embodiment of the present invention. Like in the embodiment shown in FIG. 5B, an adjustable transceiver PLL 5108 located within the FPGA transceiver banks 5102 is used by the FPGA system of FIG. 3D. Unlike in the embodiment shown in FIG. 5B, an additional control loop similar to the additional control loop in FIG. 5C is used to allow multiple deserializers 5104a, 5104b and serializers 5110a, 5110b to be aligned. In embodiments, the additional control loop in the embodiment of FIG. 5D operates in the manner identical to the additional control loop described for FIG. 5C.

Figure 5E:
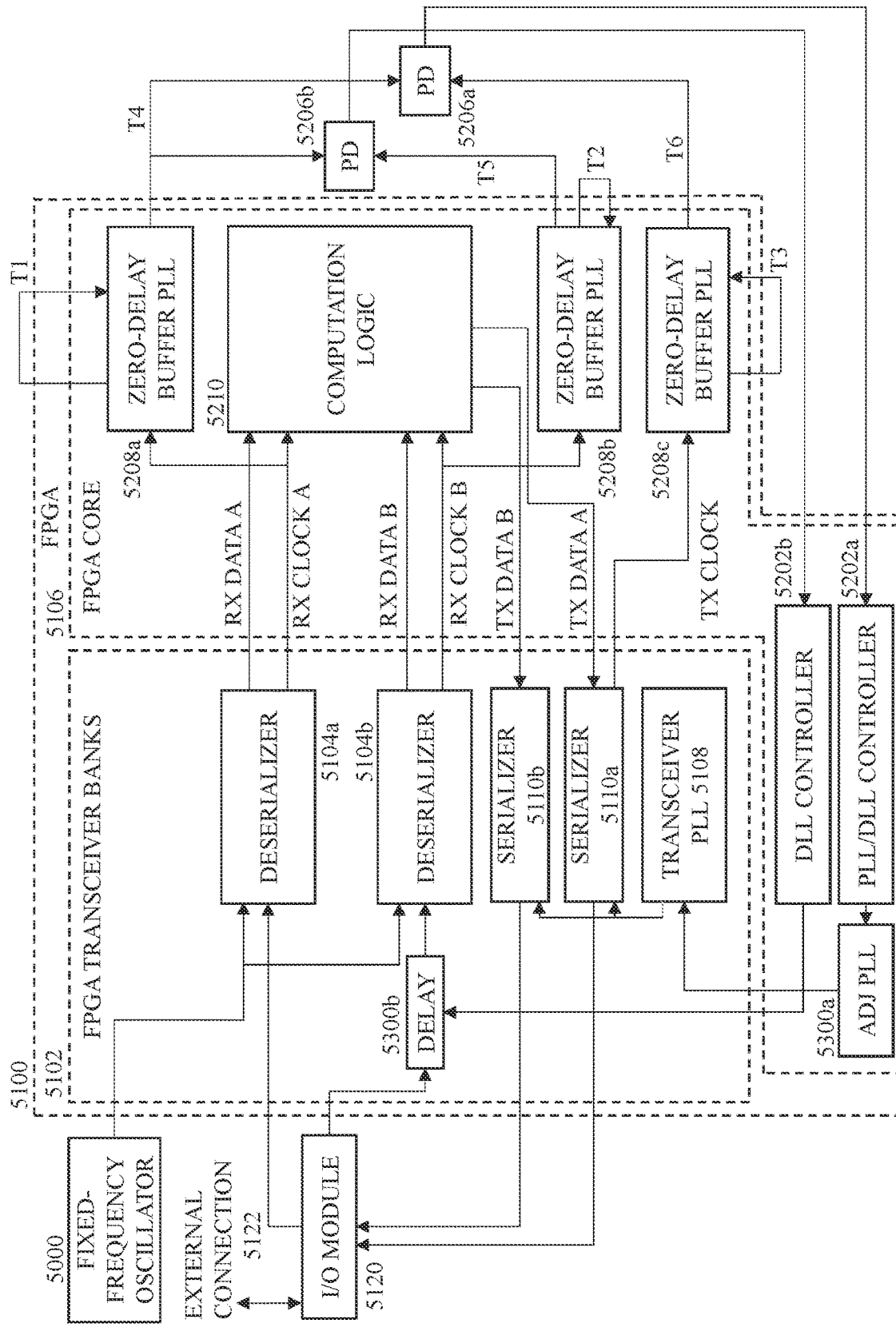
FIG. 5E is a block diagram of a field programmable gate array system in accordance with an exemplary embodiment of the present invention.

FIG. 5E illustrates a block diagram of another embodiment of an FPGA system in accordance with an exemplary embodiment of the present invention. This embodiment is similar to the embodiment shown in FIG. 5C in almost all aspects, except that the delay element 5300b is internal to the FPGA 5100, unlike the delay element 5300b located outside of the FPGA 5100 in FIG. 5C. In embodiments, the delay element 5300b in FIG. 5E has the same requirements as the external delay element 5300b shown in FIG. 5C.

Figure 5F:
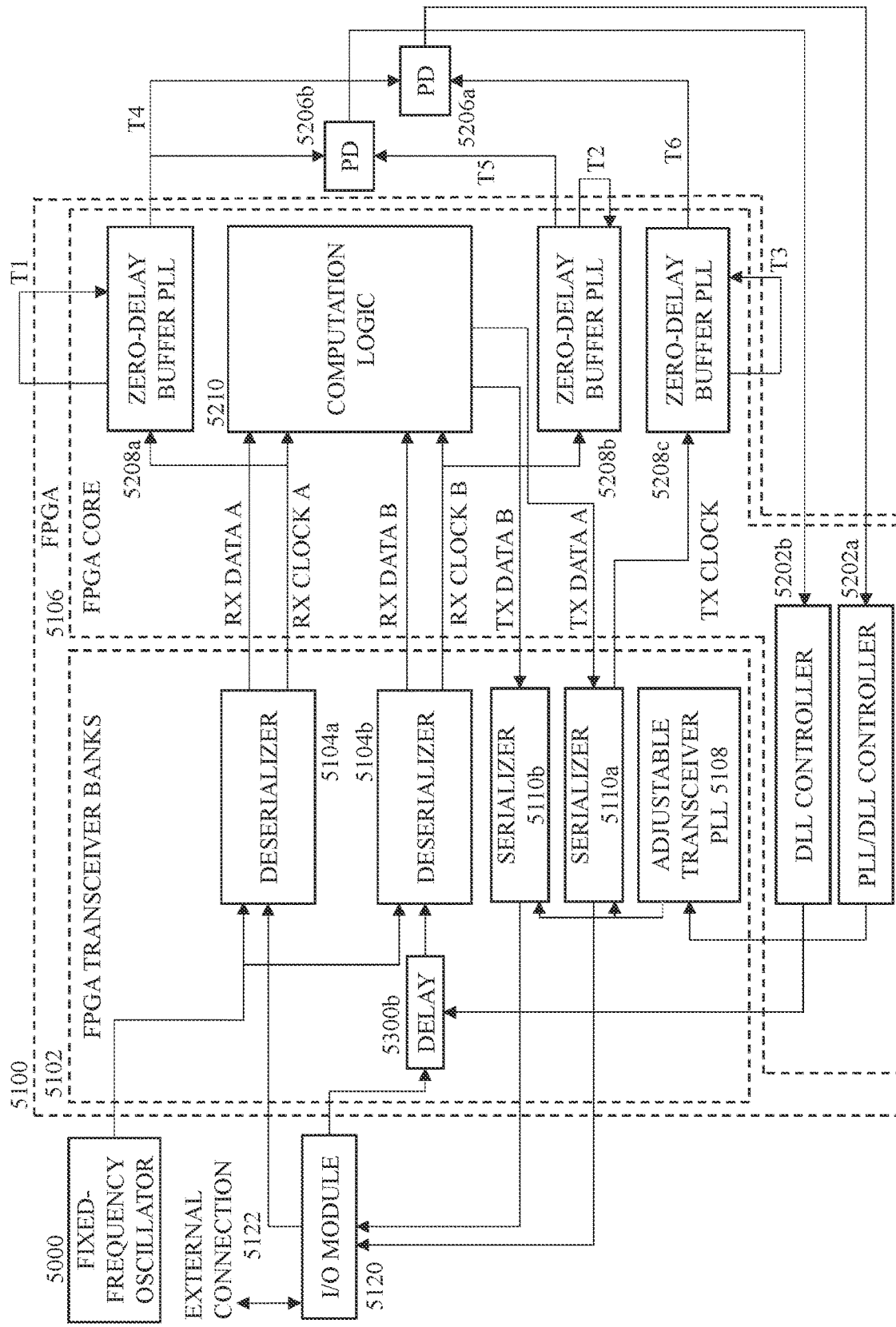
FIG. 5F is a block diagram of a field programmable gate array system in accordance with an exemplary embodiment of the present invention.

FIG. 5F illustrates a block diagram of another embodiment of an FPGA system in accordance with an exemplary embodiment of the present invention. This embodiment is similar to the embodiment shown in FIG. 5D in almost all aspects, except that the delay element 5300b is internal to the FPGA 5100, unlike the delay element 5300b located outside of the FPGA 5100 in FIG. 5D. In embodiments, the delay element 5300b in FIG. 5F has the same requirements as the external delay element 5300b shown in FIG. 5D.

Figure 6A:
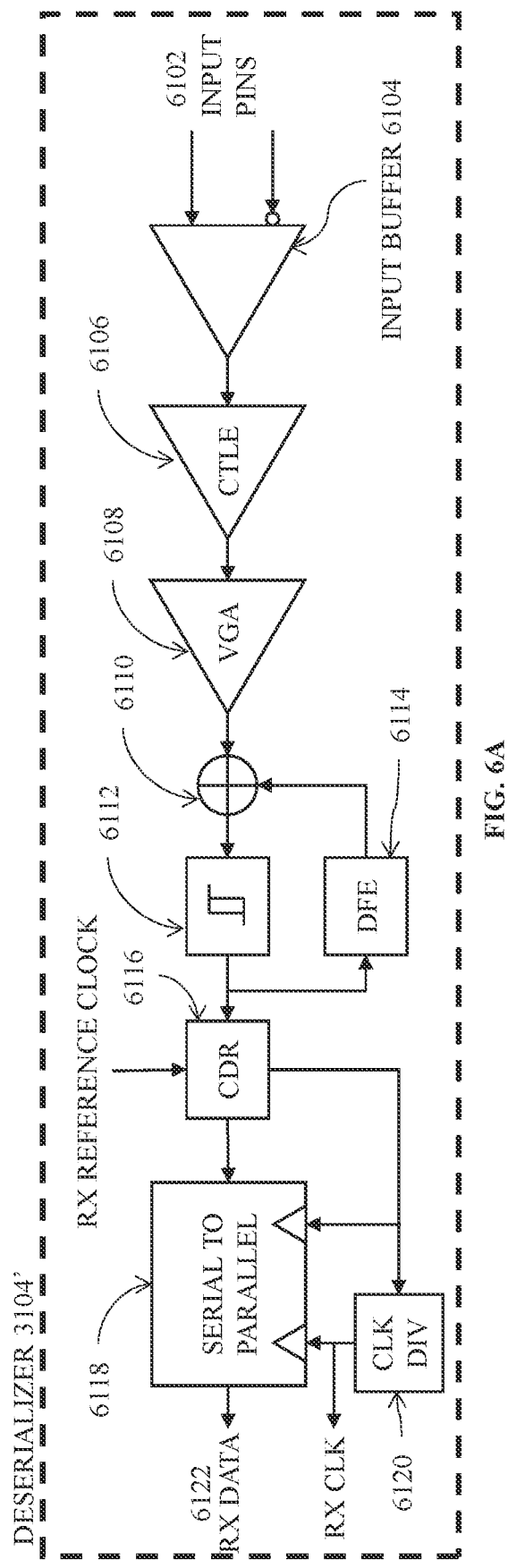
FIG. 6A is an exemplary block diagram of a deserializer suitable for use in the field programmable gate array systems of FIGS. 3A-3F, 4A-4C and 5A-5F in accordance with an exemplary embodiment of the present invention.

FIG. 6A is an exemplary block diagram of a deserializer suitable for use in the field programmable gate array systems of FIGS. 3A-3F, 4A-4C and 5A-5F in accordance with an exemplary embodiment of the present invention. Deserializer 3104', in embodiments, may include an input buffer 6104, a continuous time linear equalizer (CTLE) 6106, a variable gain amplifier (VGA) 6108; voltage adder 6110; decision feedback equalizer (DFE) 6110, clock and data recovery (CDR) 6116, Serial to parallel box 6118, decision circuit 6112, and clock divider 6120. In embodiments, deserializer 3104' may not include one or more of the following components: CTLE 6106, DFE 6114, and/or VGA 6108, to name a few.

A deserializer circuit accepts a data stream from an input buffer and converts it into a parallel format at a lower bit rate. First, data comes into the chip from the input pins 6102 into an input buffer 6104. In embodiments, the input buffer receives a transmission from an I/O module, such as I/O module 4120. A continuous time linear equalizer (CTLE) 6106 may be used after the input buffer 6104 to improve signal quality by placing a zero near the dominant pole of the transmission medium to cancel the first pole of the system. A variable-gain amplifier (VGA) 6108 may then be used to scale the signal up for further processing. This output is then turned into a binary 0-1 decision by the decision circuit 6112. In embodiments, the decision circuit 6112 includes adder 6110. A decision feedback amplifier may be included to further improve signal integrity by taking the results of the decision circuit, applying a weighting filter, and adding the result to the output from the VGA 6108. When the signal is in the digital domain, a clock and data recovery circuit (CDR) 6116 recovers the phase of the data and create a wire-rate clock that is phase-aligned to the received data. The CDR 6116 may use a reference clock and a priori knowledge of the nominal frequency of the data stream to set the frequency of the recovered clock. With a clock aligned to the data stream, which in some embodiments may be a high speed data stream (e.g., 10 Gbps, 25 Gbps, a range from 9-25 Gbps, 10-25 Gbps, 22-33 Gbps, 33-45 Gbps, 45-60 Gbps, 60-80 Gbps, 80-120 Gbps, or 1 Gbps-100 Gbps, to name a few) the receiver can use a clock divider 6120 and a serial-to-parallel circuit 6118 to convert the serial data stream into a lower-frequency than the data stream (e.g., $\frac{1}{4}^{th}$ of the data rate of the high speed data stream or $\frac{1}{256}^{th}$ of the data rate of the high speed data stream, to name a few) parallel data stream.

In embodiments, a decision feedback equalizer 6114 (DFE) may be provided. In embodiments, the decision feedback equalizer may be a filter that subtracts or adds at least n decided bits to cancel inter-symbol interference on the wire. In embodiments, a clock and data recovery circuit may be provided and includes a data phase detector, which may be any of the circuits discussed above, as well as a phase-locked loop circuit.

Figure 6B:
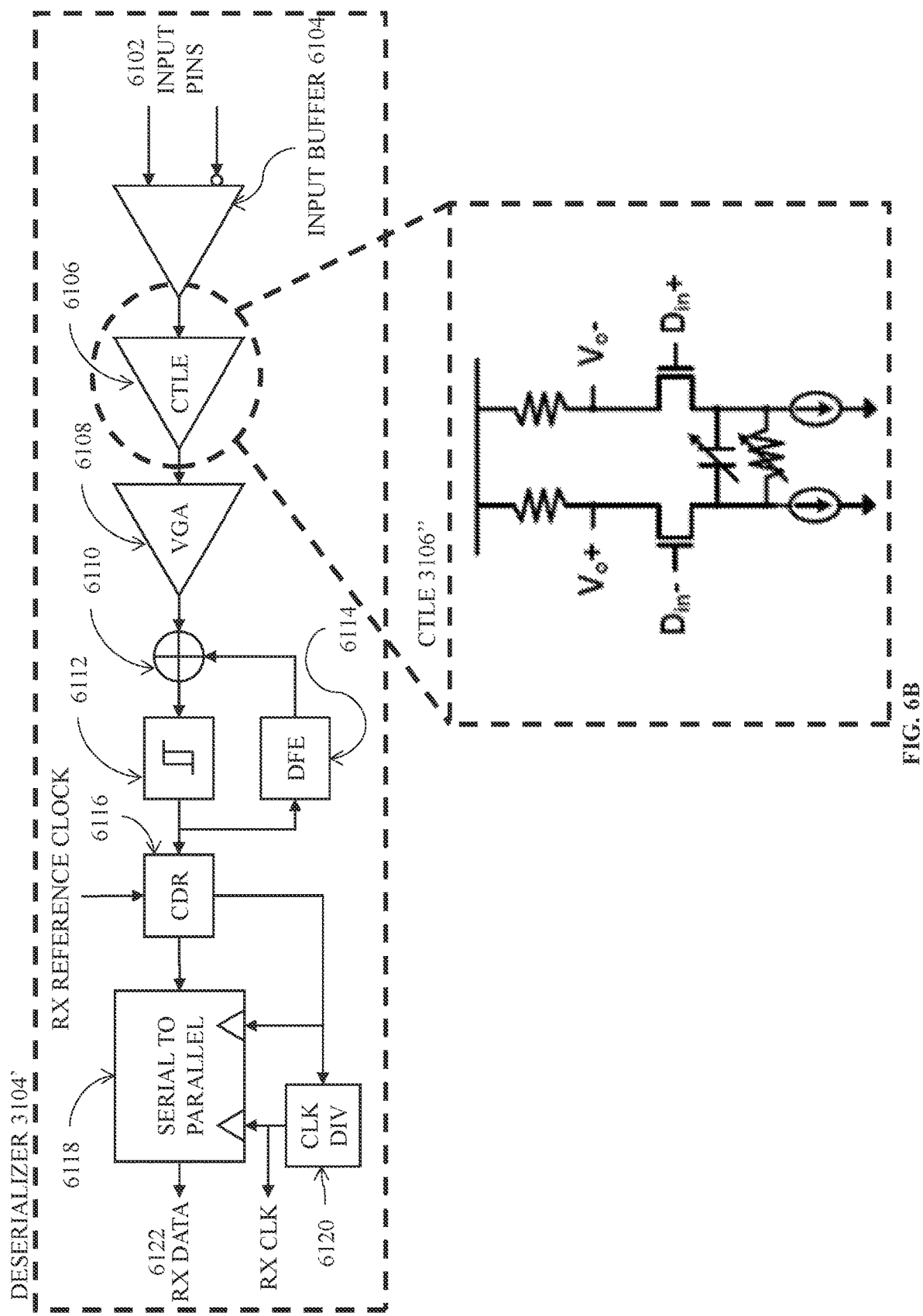
FIG. 6B is an exemplary circuit diagram of a continuous-time linear equalizer (CTLE) suitable for use in the deserializer of FIG. 6A in accordance with an exemplary embodiment of the present invention.

FIG. 6B is an exemplary circuit diagram of a continuous-time linear equalizer (CTLE) suitable for use in the deserializer of FIG. 6A in accordance with an exemplary embodiment of the present invention. CTLE 3106", in some embodiments, places a zero to cancel out the dominant pole of the trans mission line for an incoming signal. In embodiments, CTLE 3106" is a linear filter applied at a receiver, in the case of FIG. 6B, input buffer 6104, that attenuates low-frequency signal components and filters off higher frequencies. The CTLE 3106" may be adjusted to optimize the ratio of low frequency attenuation to high frequency amplification. In embodiments, a variable gain amplifier may be provided and used to scale the output of the CTLE to as large of a signal as possible. In embodiments, a decision circuit may also be provided.

Figure 6C:
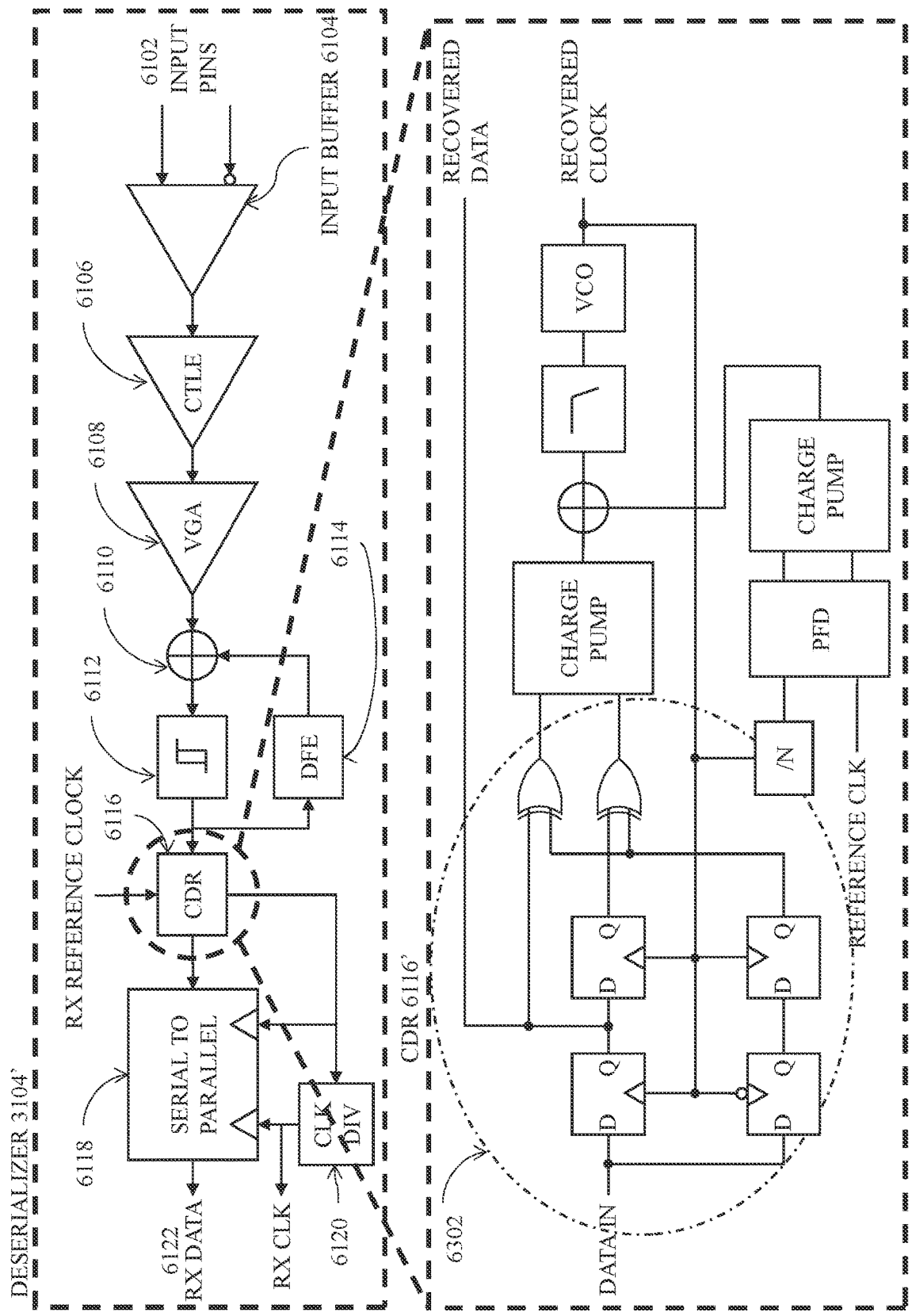
FIG. 6C is an exemplary block diagram of a clock and data recovery (CDR) circuit suitable for use in the deserializer of FIG. 6A in accordance with an exemplary embodiment of the present invention.

FIG. 6C is an exemplary block diagram of a clock and data recovery (CDR) circuit suitable for use in the deserializer of FIG. 6A in accordance with an embodiment of the present invention. In embodiments, CDR 6116' circuit recovers phase information from an incoming data stream. The data stream, in embodiments, may be received by an alexander phase detector 6302. The CDR 6116' may also obtain frequency information from a reference clock, output. In embodiments, the output may determine whether the recovered clock have the same phase as the recovered data.

Figure 6D:
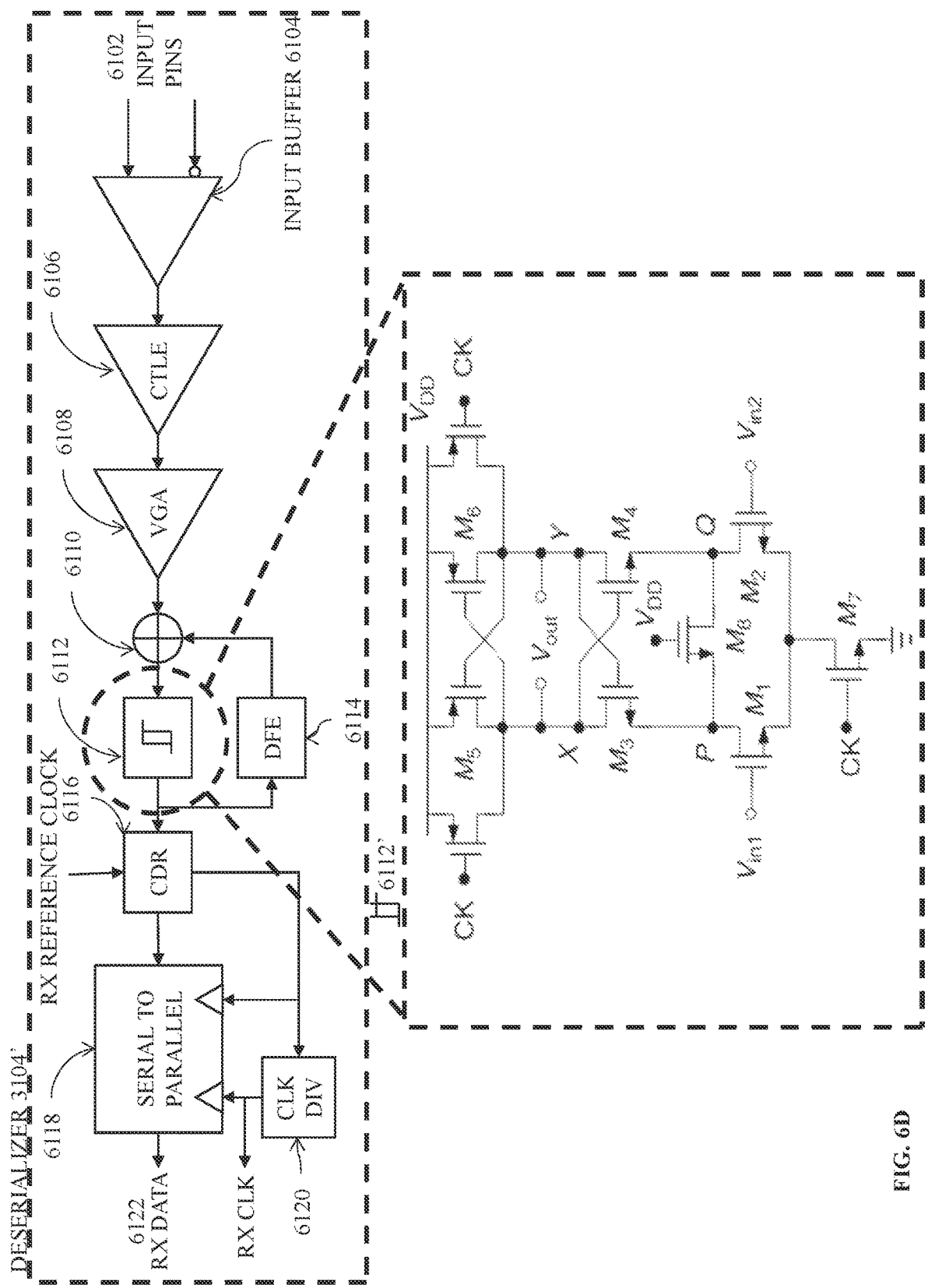
FIG. 6D is an exemplary circuit diagram of a decision circuit suitable for use in the deserializer of FIG. 6A in accordance with an embodiment of the present invention.

FIG. 6D is an exemplary circuit diagram of a decision circuit 6112' suitable for use in the deserializer of FIG. 6A in accordance with an embodiment of the present invention. FIG. 6D illustrates an exemplary embodiment of such a decision circuit 6112' utilizing a StrongARM sense amplifier. In embodiments, any comparator circuit may be used as a decision circuit.

Figure 6E:
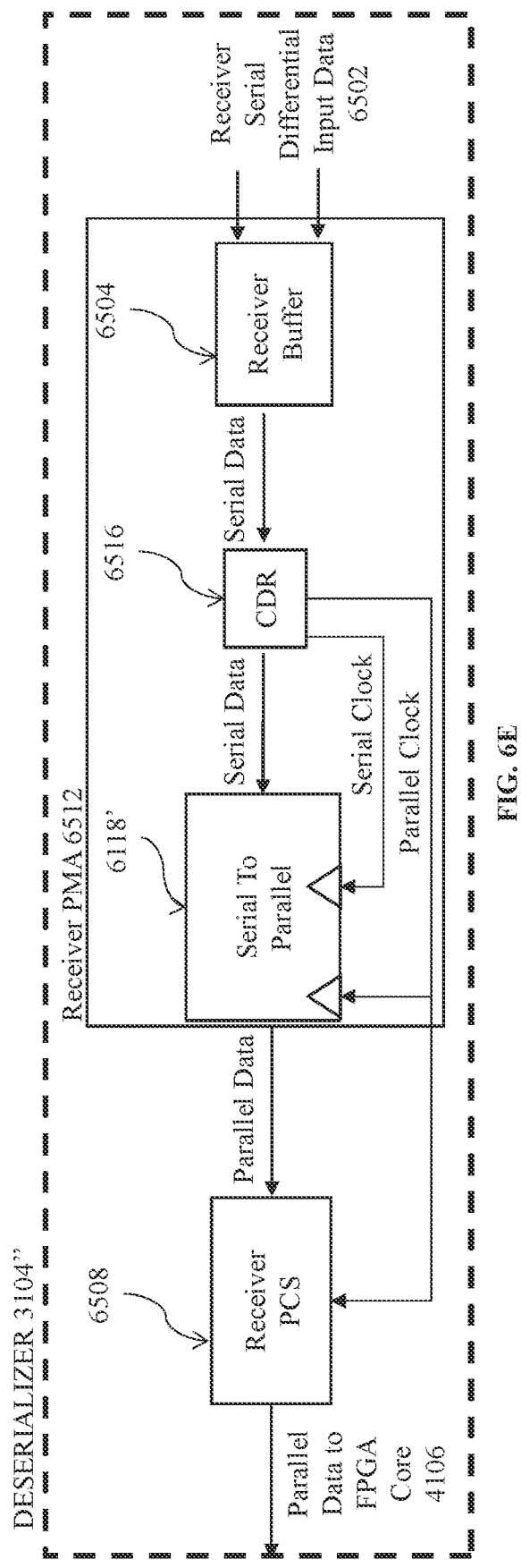
FIG. 6E is an exemplary block diagram of a deserializer suitable for use in the field programmable gate array systems of FIGS. 3A-3F, 4A-4C and 5A-5F in accordance with an exemplary embodiment of the present invention.

FIG. 6E illustrates an exemplary embodiment of deserializer 3104". In embodiments, the deserializer 3104" may include a receiver PMA 6512 and receiver PCS 6508. The receiver PMA 6512 may include receiver buffer 6504, CDR 6516, and serial to parallel box 6118'. In embodiments, the receiver buffer 6504 receives serial differential input data 6502. In embodiments, this data is received by an I/O module, such as the I/O module 4120 of FIG. 4A. In embodiments, the data is then received by the CDR 6516 from the receiver buffer 6504. The CDR, in embodiments, transmits the inputted serial data, a serial clock signal, and a parallel clock signal to the serial to parallel box 6118'. The CDR may also transmits the parallel clock data to the receiver PCS 6508. The serial to parallel box 6118', in embodiments, then converts the serial data into parallel data, transmitting the parallel data to the receiver PCS 6508. The receiver PCS 6508 transmits parallel data to the FPGA Core 4106.

In addition to the components illustrated in FIG. 6E, deserializer 3104" may also include or be electrically coupled to a continuous-time linear equalizer (CTLE) (see FIG. 6B) which is a pure analog circuit that may be used to correct channel issues. In embodiments, the deserializer 3104" may include a shift register or demultiplexer with a counter.

FIG. 7A is an exemplary block diagram of a serializer 3110' suitable for use in the field programmable gate array systems of FIGS. 3A-3F, 4A-4C and 5A-5F in accordance with an exemplary embodiment of the present invention. The serializer circuit accepts a clock running at wire rate 4112 (from transceiver PLL 4108) and accepts parallel data (e.g., TX data 7102) to serialize the data. Data is converted from a parallel format to a serial data stream in the parallel to serial box 7104. A feed-forward equalizer (FFE) 7106, which uses the history of bits serialized on the wire to filter out inter-symbol interference, may be included to improve signal integrity. Finally, the serializer outputs the serial data stream to a transmission medium using an output buffer 7114. The serializer also generates a parallel clock (TX Clk 7110), that operates at a lower speed than the data stream (e.g., 100-400 MHz, 100-600 MHz, to name a few), for use by other components using either a simple clock divider 7108 or a more complex clock generation block which can contain dividers and phase shifting elements for aligning multiple transmitters.

FIG. 7B illustrates an exemplary embodiment of serializer 3110". As discussed above with respect to FIGS. 4A and 7A, serializer 3110" receives parallel data streams from the FPGA core 4106 and serializes them for transmission out of the FPGA 4100. In embodiments, serializer 3110" may include transmitter PCS 7206, clock generation block 7210, and transmitter PMA 7216. In embodiments, transmitter PMA 7216 may include parallel to serial box 7104' and transmitter buffer 7214. The transmitter PCS 7206 may receive parallel data from FPGA core 4106. In embodiments, the parallel data is then transmitted to the parallel to serial box 7104'. The clock generation block 7210 may receive a wire-rate clock signal 7112. The clock generation block 7210, in embodiments, may split the signal in to a parallel clock signal and serial clock signal, both the parallel and serial signals being transmitted to the parallel to serial box 7104'. The parallel to serial box 7104' may covert the data from parallel to serial, transmitting the serial differential output data 7218 to the transmitter buffer 7214. Then, in embodiments, the transmitter buffer 7214 outputs the serial differential output data 7218.

In embodiments the serializer 3110" may be a shift register or a multiplexer with a counter. In embodiments, the serializer 3110" may include additional components, such as a feed forward equalizer (FFE) which uses the last n bits to cancel inter symbol interference on the wire. In embodiments, a buffer amplifier may be included which provides variable gain to allow adjustable voltage swing on the output of the transmitter. In embodiments, a clock divider may be provided. In embodiments, the clock divider may generate a low-speed clock (e.g., 100-400 MHz, 100-600 MHz, to name a few) for the serializer and the PMA/PCS. In embodiments, the clock divider is typically provided using a counter. In embodiments, the clock generation block 7210 might also include a clock phase adjustment circuit to allow multiple transmitter lanes to be phase-aligned.

Figure 8A:
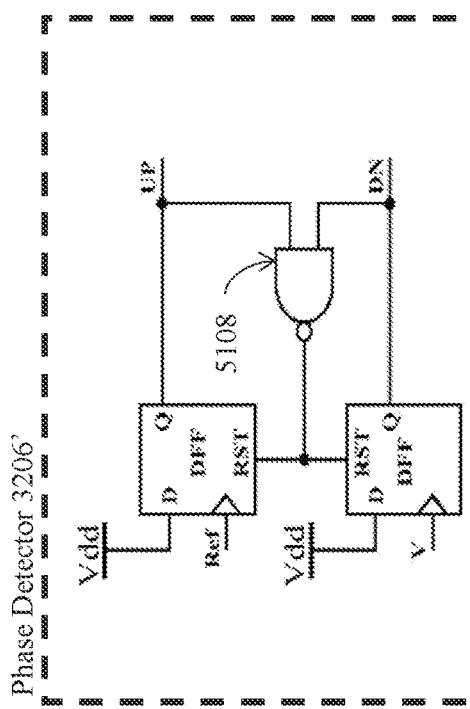
FIG. 8A is an exemplary block diagram of a phase detector suitable for use in the field programmable gate array systems of FIGS. 3A-3F, 4A-4C and 5A-5F in accordance with an exemplary embodiment of the present invention.
Figure 8B:
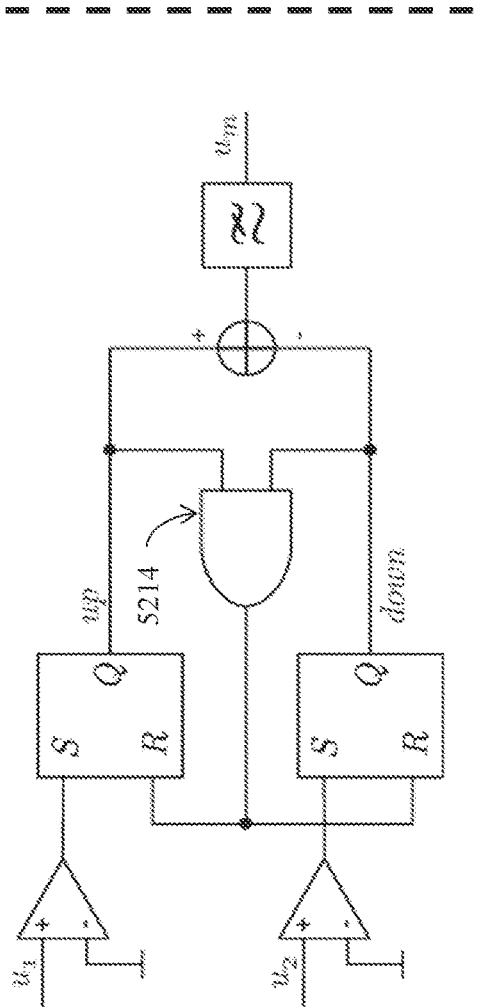
FIG. 8B is another exemplary block diagram of a phase detector suitable for use in the field programmable gate array systems of FIGS. 3A-3F, 4A-4C and 5A-5F in accordance with an exemplary embodiment of the present invention.
Figure 8C:
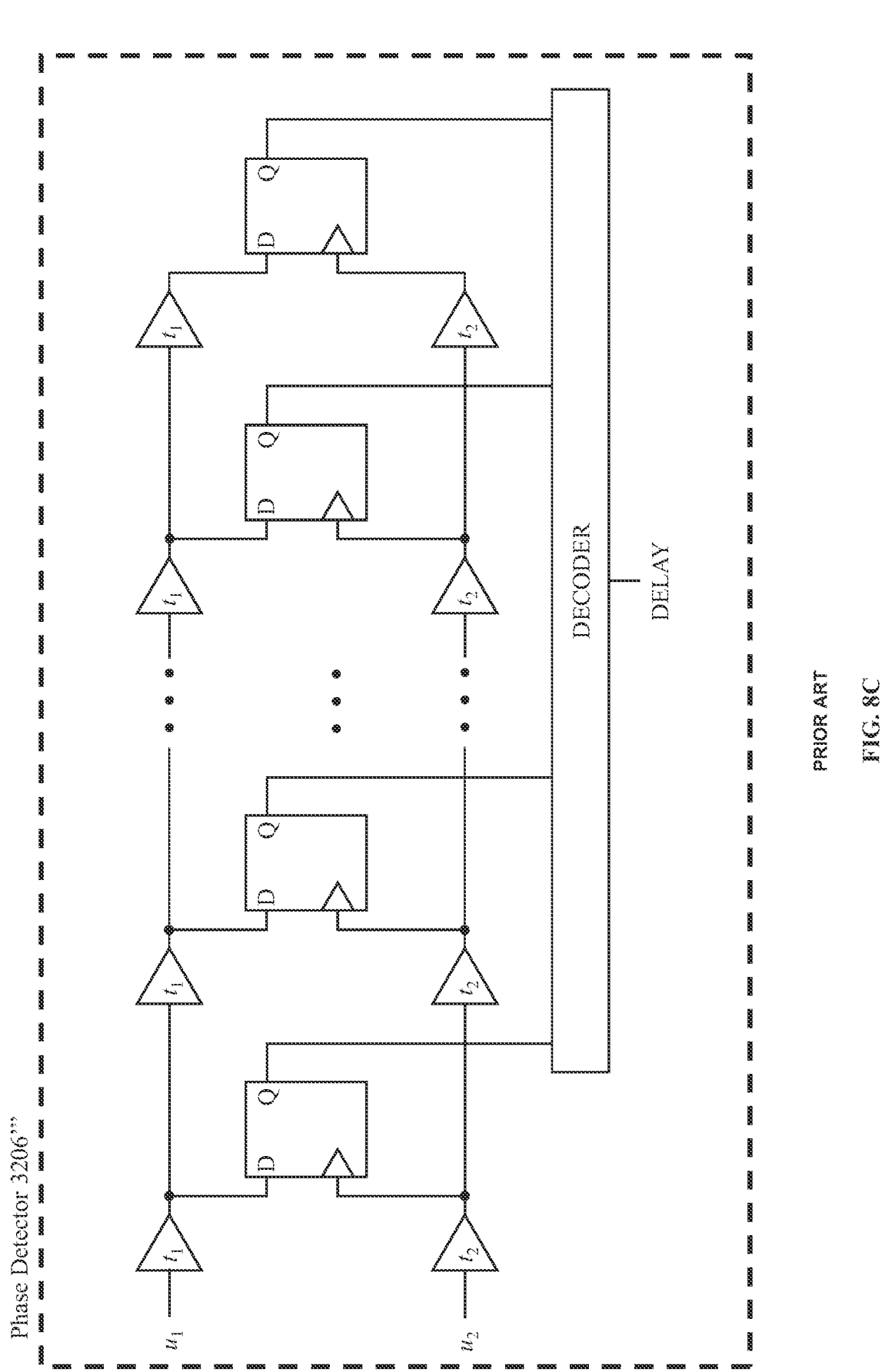
FIG. 8C is another exemplary block diagram of a phase detector suitable for use in the field programmable gate array systems of FIGS. 3A-3F, 4A-4C and 5A-5F in accordance with an exemplary embodiment of the present invention.
Figure 8D:
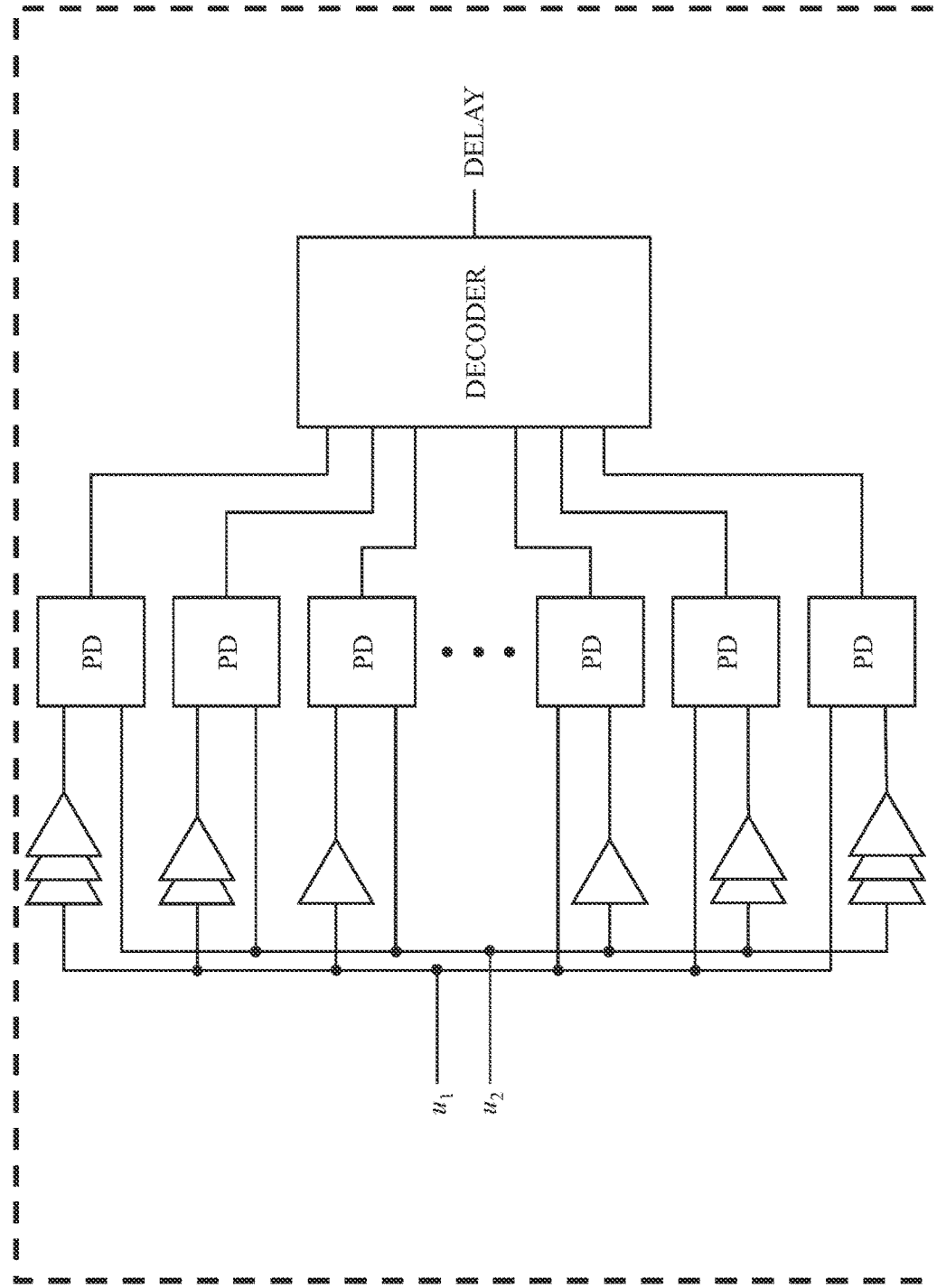
FIG. 8D is another exemplary block diagram of a phase detector suitable for use in the field programmable gate array systems of FIGS. 3A-3F, 4A-4C and 5A-5F in accordance with an exemplary embodiment of the present invention.

Referring to FIGS. 8A-8D, in embodiments, the phase detector 4206 may be an analog, single bit phase detector which may be implemented using a variety of circuit components including (1) an XOR gate; (2) S-R flip-flop; (3) D flip-flop; (4) Edge-triggered JK flip-flop; (5) Gilbert cell multiplier and/or (6) Diode ring mixer, to name a few. FIG. 8A illustrates an exemplary embodiment of a phase detector 3206' that utilizes D flip-flops. FIG. 8B illustrates another exemplary embodiment of a phase detector 3206" that utilizes S-R flip-flops. FIG. 8C is another exemplary block diagram of a phase detector 3206''' suitable for use in the field programmable gate array system of FIG. 4A in accordance with an embodiment of the present invention. FIG. 8D is another exemplary block diagram of a phase detector 3206'''' suitable for use in the field programmable gate array system of FIG. 4A in accordance with an embodiment of the present invention. Other than a basic phase detector, a time-to-digital converter (TDC) can be used to detect the phase offset of the clocks. FIG. 8C shows a Vernier TDC and FIG. 8D shows a parallel delay line TDC as examples. The Vernier TDC uses a pair of unequal delay lines to delay the two signals by varying amounts and uses D-type flip-flops to quantify the phase difference between the two signals at multiple points along the delay line. The parallel delay line TDC uses a set of simple phase detectors with the two input signals delayed by varying amounts to quantify the phase difference between the two signals. In both cases, a decoding circuit is used to translate the results of the individual phase detection elements into a phase offset.

In embodiments, the phase detector 4206 may be a multi-bit phase detector, sometimes referred to as a time-to digital converter (TDC). In embodiments, such a phase detector may be a counter-based TDC that counts up the time between START and STOP. In embodiments, such a phase detector may be an interpolator TDC in which time measurement may be performed by measuring a voltage difference (e.g., by using a ramp wave and sampling at two points or by charging a capacitor). In embodiments, a phase detector may be a Vernier TDC as shown in FIG. 8C.

In embodiments the phase detector 4206 may be implemented using a tapped delay line TDC. In embodiments, the phase detector 4206 may be implemented using a metastability-based phase detector. In embodiments, the metastability-based phase detector is similar to a D flip-flop phase detector but includes an averaging filter. In embodiments, a parallel-delay-line TDC may be used to implement the phase detector 4206. FIG. 8D illustrates an example of a parallel-delay-line TDC. In embodiments, the phase detector may be implemented as a pulse-shrinking TDC. Such a pulse-shrinking TDC may generate a pulse and then send it circularly through an engineered delay line to shrink it until it is gone, count the number of times it goes through the pulse-shrinking circuit.

In embodiments, the phase detector may be implemented as a scrambling TDC. Scrambling TDCs may be implemented with added digital noise shaping to suppress errors. In embodiments, the phase detector 4206 may be implemented as a PLL/DLL-based TDC. In such an embodiment, the phase detector may lock a digital PLL to the incoming feedback signal and record the internal control code.

In embodiments, all of the phase detector embodiments discussed above may be combined with or connected to a low-pass filter and an analog to digital converter (ADC). In embodiments, other examples of phase detectors may be used consistent with the teachings of this disclosure.

The pseudo code shown below implements the control loop inside the PLL or DLL controller (e.g., 3202 in FIGS. 3A-3B, 4202 in FIG. 4A, or 5202 in FIGS. 5A-5B) and communicates with the host in accordance with an exemplary embodiment of the present invention. In embodiments, the pseudocode shown below, or a similar pseudocode is run by the FPGA or a soft processor programmed on the FPGA and uses an interrupt- or event-based system to run the control algorithm for either the PLL or DLL paths on the device. The main control loop is triggered on every sample of the internal ADC.

```
Begin:
   Set up peripherals
   Program initial configuration
   Set up for periodic free-running measurement from the TDC
   Wait
On Periodic Interrupt:
   Read TDC code into Window[0]
   ControlCode = DigitalFilter(Window)
   Read MODE pin to Mode
   If Mode = PLL_MODE then:
       Output ControlCode to PLL frequency adjustment interface
   Else:
       Output ControlCode to PLL phase adjustment interface
   Shift Window array by 1
```

FIGS. 9A-C, 10A-B and 11 are flow charts of a process implementing the field programmable gate array system in accordance with an exemplary embodiment of the present invention. In embodiments, the process described in the flow charts of FIGS. 9A-C, 10A-B and 11 may be implemented by the field programmable gate array system shown in FIG. 4A. The field programmable gate array system, including the field programmable gate array and the components thereof, may be similar to the field programmable gate array systems of FIG. 4A, the descriptions of which applying herein.

Figure 9A:
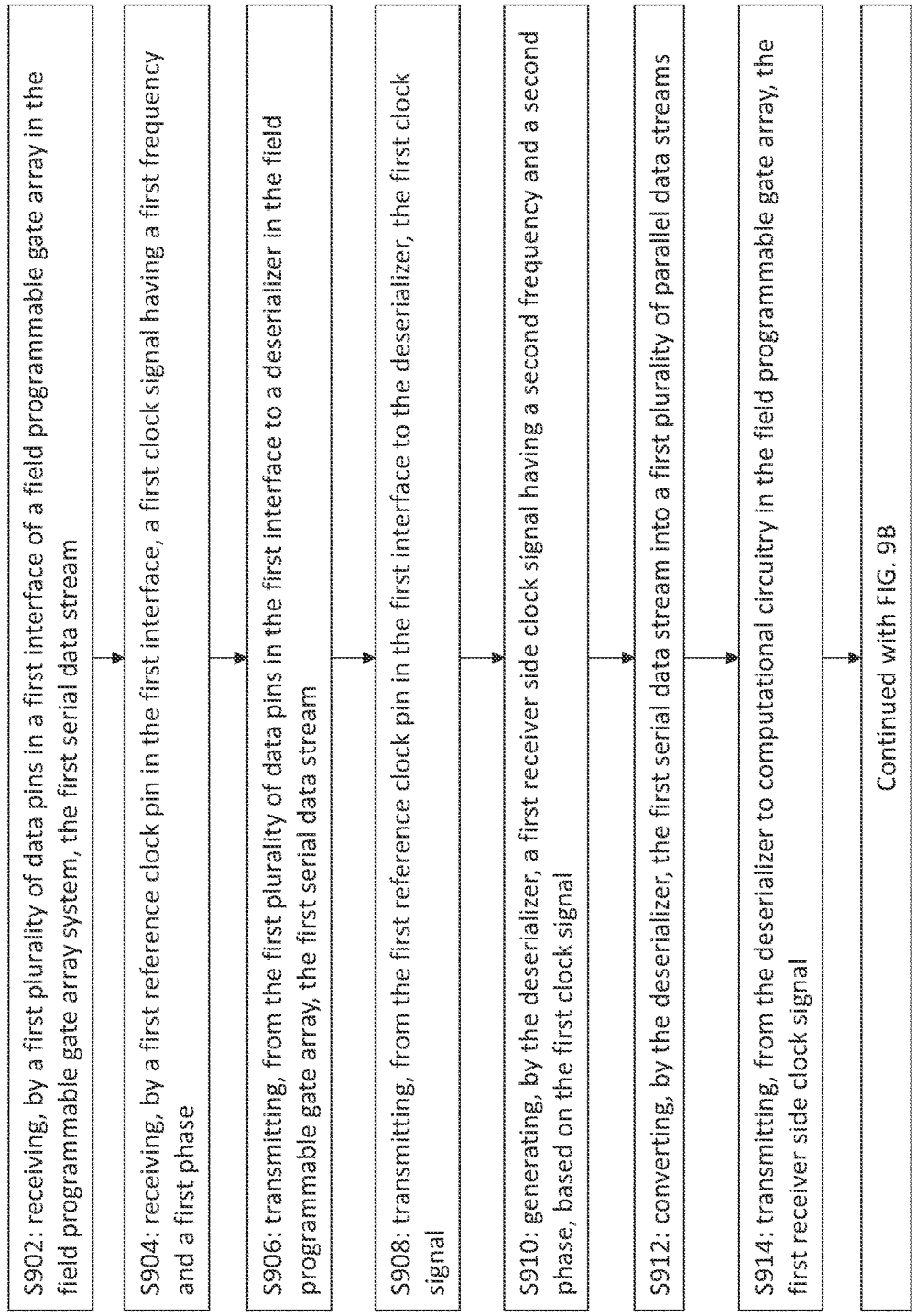
FIGS. 9A-C are flow charts of a process implementing the field programmable gate array system in accordance with an exemplary embodiment of the present invention.
Figure 9B:
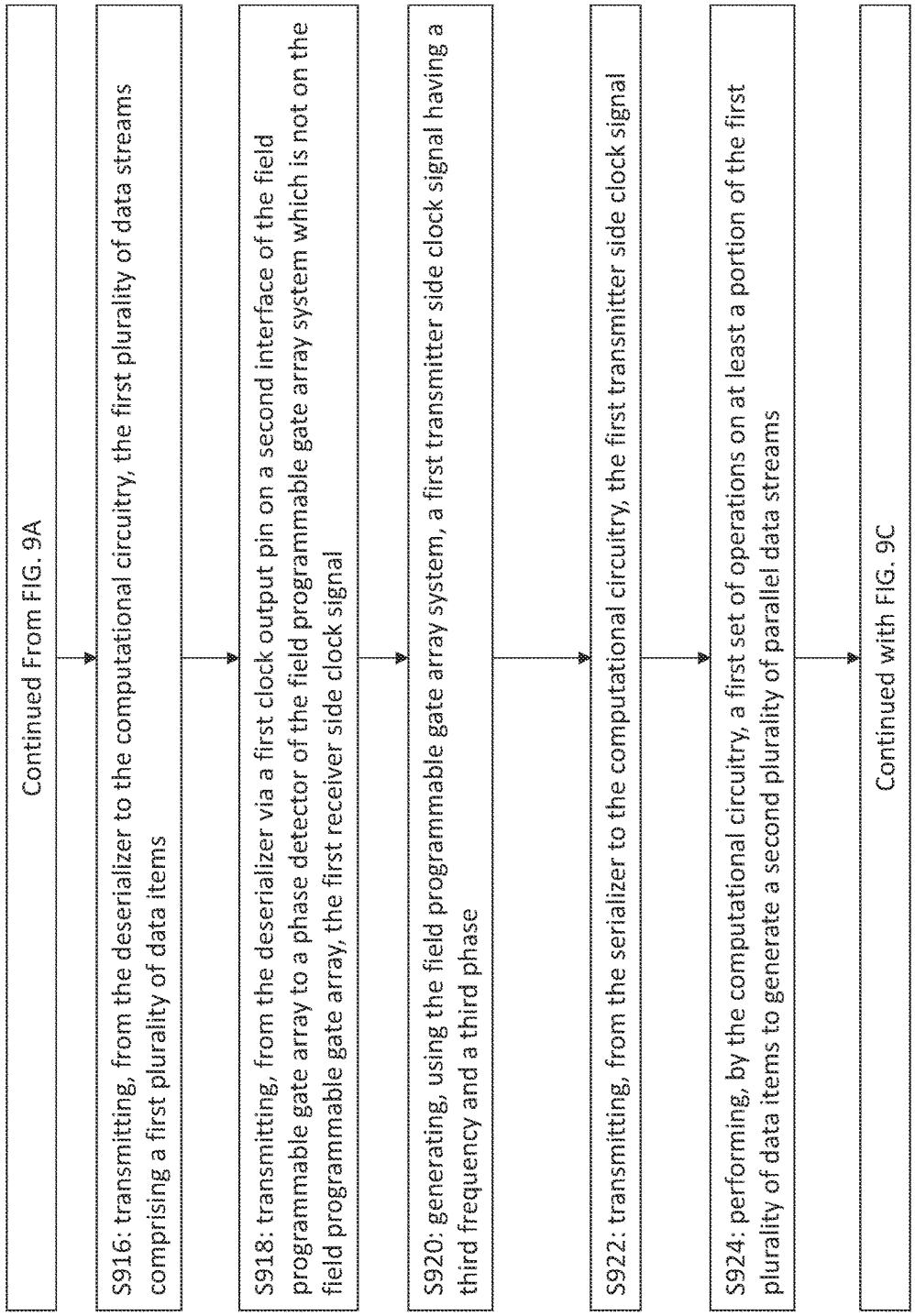
Figure 9C:
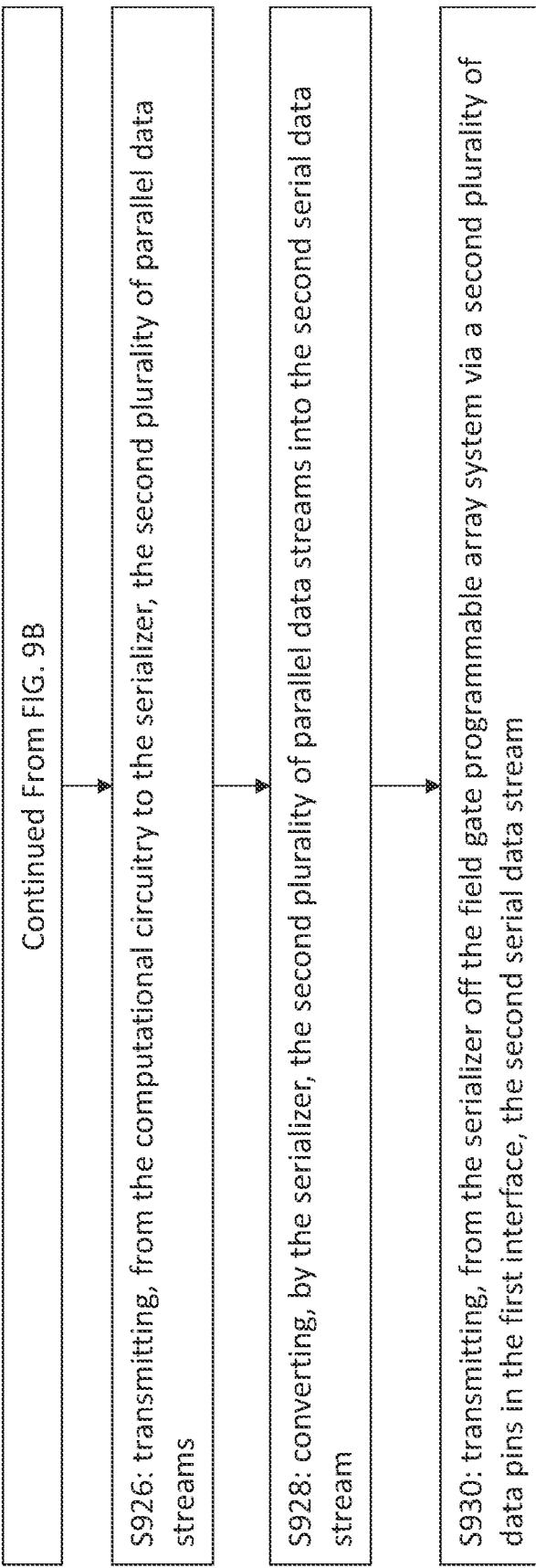

The process of FIGS. 9A-9C may begin at step S902. Referring to FIG. 9A, at step S902, a first serial data stream is received by a first plurality of data pins of a first interface of a field programmable gate array in the field programmable gate array system. In embodiments, the first serial data stream may include market data. In embodiments, market data may be price and trade-related data for a financial instrument reported by a trading venue (i.e., a stock exchange).

At a step S904, a first clock signal having a first frequency and a first phase is received by a first reference clock in in the first interface. In embodiments, step S904 may be performed before step S902. In embodiments step S904 may be performed contemporaneously with step S902.

The process of FIGS. 9A-9C may continue with a step S906. At step S906, the first plurality of data pins of the first interface may transmit the first serial data stream to a deserializer in the field programmable gate array.

At a step S908, the first reference clock pin in the first interface may transmit the first clock signal to the deserializer. In embodiments, step S908 may be performed before step S906. In embodiments step S908 may be performed contemporaneously with step S906.

At a step S910, a first receiver side clock signal may be generated by the deserializer. In embodiments, the first receiver side clock signal may have a second frequency and a second phase. In embodiments, the second frequency is different from the first frequency. In embodiments, the second frequency corresponds to the first frequency. In embodiments, corresponding may refer to the frequencies being the same frequency. In embodiments corresponding may also refer to frequencies being close (e.g., within an acceptable range in the art) to the same frequencies. In embodiments, the first phase and the second phase may not be aligned. In embodiments the first phase and the second phase are aligned. In embodiments, a difference between the first phase and the second phase is below a threshold level. In embodiments, the deserializer generates the first receiver clock signal based at least in part on the first clock signal.

At a step S912, the first serial data stream received by the deserializer may be converted, by the deserializer, into a first plurality of data streams. In embodiments, the first plurality of data streams may include a first amount of data streams. In embodiments, the first amount of data streams is equal to eight (8) data streams. In embodiments, the first amount of data streams is equal to ten (10) data streams. In embodiments, the first amount of data streams is equal to sixteen (16) data streams. In embodiments, the first amount of data streams is equal to twenty (20) data streams. In embodiments, the first amount of data streams is equal to thirty-two (32) data streams. In embodiments, the first amount of data streams is equal to forty (40) data streams. In embodiments, the first amount of data streams is equal to sixty-four (64) data streams. In embodiments, the first amount of data streams is equal to eighty (80) data streams. In embodiments, the first amount of data streams is equal to one hundred twenty-eight (128) data streams. In embodiments, the first amount of data streams is equal to one hundred sixty (160) data streams. In embodiments, the first amount of data streams is equal to two (2) to the power of N, where N is an integer. In embodiments, the first amount of data streams is equal to ten (10) times two (2) to the power of N, where N is an integer. In embodiments the first amount of data streams is equal to thirty-three (33) times two (2) to the power of N, where N is an integer.

At a step S914, the first receiver side clock signal is transmitted from the deserializer to computational circuitry in the field programmable gate array.

At a step S916, the first plurality of data streams is transmitted form the deserializer to the computational circuitry. In embodiments, the first plurality of data streams includes a first plurality of data items. In embodiments, step S916 may be performed before step S914. In embodiments step S916 may be performed contemporaneously with step S914.

At a step S918, the first receiver side clock signal is transmitted from the deserializer via a first clock output pin on a second interface of the field programmable gate array to a phase detector of the field programmable gate array system which is not on the field programmable gate array. In embodiments, the transmission of the first receiver side clock signal is also via a first zero delay buffer phase lock loop of the field programmable gate array before being transmitted via the first clock output pin of the second interface.

At a step S920, a first transmitter side clock signal is generated by the field programmable gate array system. In embodiments, the first transmitter side clock signal has a third frequency and a third phase. In embodiments, the third frequency corresponds to the second frequency. In embodiments the third phase may be aligned with the second phase. In embodiments, the third phase and the second phase may not be aligned. In embodiments, the third phase and the second phase may have a difference in phases that is less than a second threshold level. In embodiments, the first transmitter side clock signal is generated by performing the following steps until a first output of the phase detector is below a first threshold.

Referring to FIG. 10A, generating the first transmitter side clock signal may begin at step S1002. At step S1002, a second clock signal is generated by an adjustable oscillator in the field programmable gate array system. In embodiments, the second clock signal may have a fourth frequency and a fourth phase.

The process of FIGS. 10A-B may continue at a step S1004. At step S1004, a first wire rate clock signal having a fifth phase and a fifth frequency is generated. In embodiments, the generation of the first wire rate clock signal may be based in part on the second clock signal. In embodiments the fifth frequency is a rational multiple of the fourth frequency. In embodiments the fifth frequency is equal to x times the fifth frequency where x is the second amount of data streams. In embodiments the fifth frequency is equal to x times the frequency of the of the transmitter side clock signal where x is half of the second amount of data streams.

Figure 11:
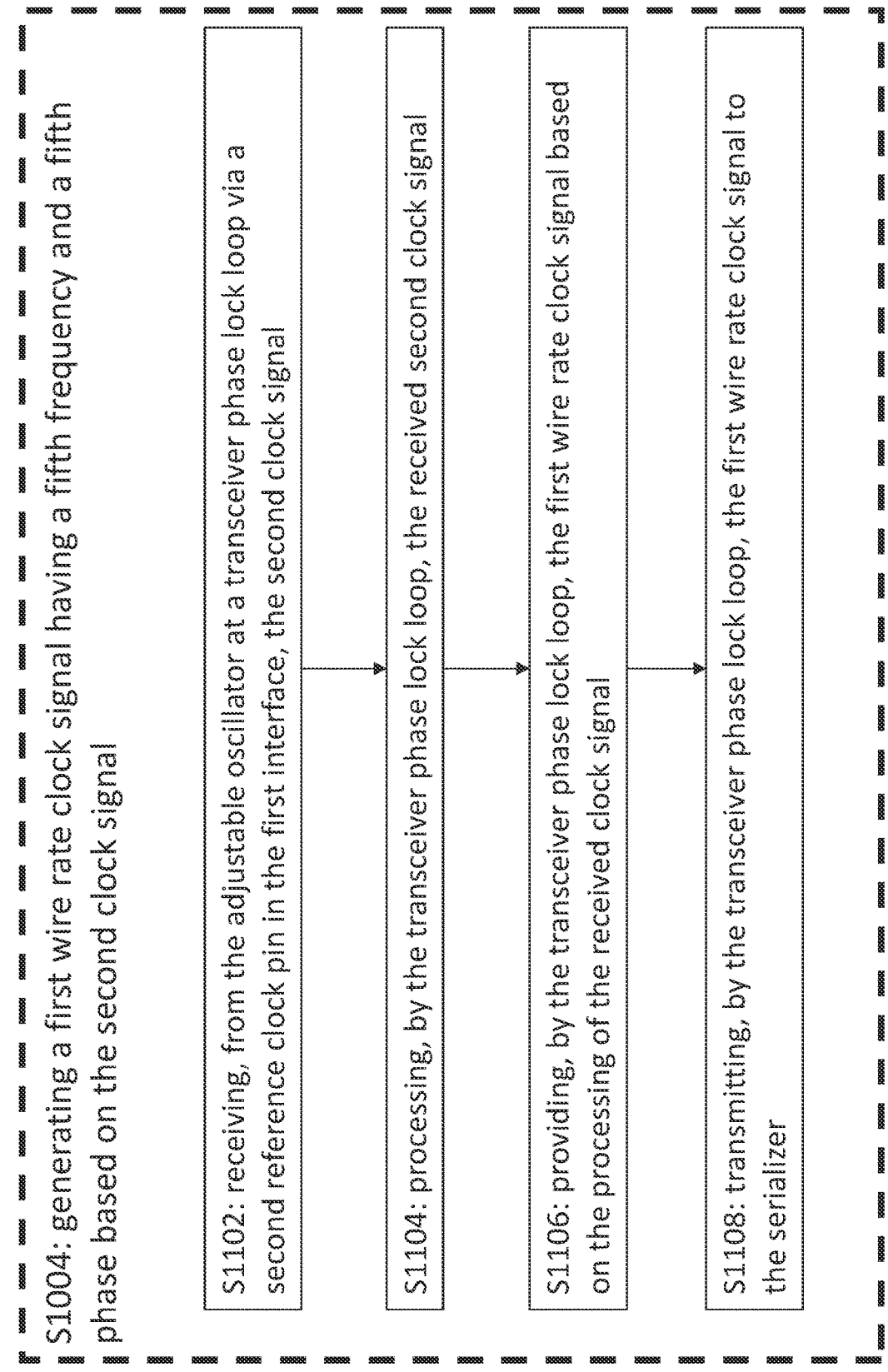
FIG. 11 is a flow chart of a process for generating a wire rate clock signal in accordance with an embodiment of the present invention.

In embodiments, the generation of the first wire rate clock signal may be performed with the following steps. Referring to FIG. 11, at a step S1102, the second clock signal is received from the adjustable oscillator at a transceiver phase lock loop via a second reference clock pin in the first interface. At a step S1104, the second clock signal is processed by the transceiver phase lock loop. As a step S1106, the first wire rate clock signal is provided by the transceiver phase lock look. The providing of the first wire rate clock signal, in embodiments, may be based at least in part on the processing of the received clock signal. Once the first wire rate clock signal is provided, at a step S1108. the first wire rate clock signal is transmitted by the transceiver phase lock loop to a serializer on the field programmable gate array. In embodiments, the first wire rate clock is generated by a phase lock loop. In embodiments, the phase lock loop that generates the first wire rate clock signal is on field programmable gate array. In embodiments, the phase lock loop that generates the first wire rate clock signal is part of the field programmable gate array system and not part of the field programmable gate array.

In embodiments, the generation of the first wire rate clock signal may include processing the second clock signal. Once the second clock signal is processed, the first wire rate clock signal may be provided. The providing of the first wire rate clock signal, in embodiments, is based at least in part on the processing of the second clock signal. After providing the first wire rate clock signal, in embodiments, the first wire rate clock signal may be transmitted to the serializer.

Referring back to FIG. 10A, at a step 1006, an interim transmitter side clock signal having a sixth frequency and a sixth phase is generated by the serializer in the field programmable gate array. In embodiments, the sixth frequency corresponds to the third frequency. In embodiments the sixth phase may be aligned with the third phase. In embodiments, the sixth frequency may correspond to the third frequency and the sixth phase may not be aligned with the third phase. In embodiments, the sixth phase and the third phase may not be aligned. In embodiments, the third phase and the sixth phase may have a difference in phases that is less than a second threshold level.

At a step S1008, the interim transmitter side clock signal is transmitted from the serializer via a second clock output pin of the second interface to the phase detector. In embodiments, the transmission of the interim transmitter side clock is also via a second zero delay buffer phase lock loop of the field programmable gate array before being transmitted via the second clock output in of the second interface.

The process of FIGS. 10A-10B may continue with at a step S1010. Referring to FIG. 10B, at a step S1010, a first output is generated by the phase detector. The first output, in embodiments, is based at least on a comparison of the first receiver side clock signal and the interim side clock signal. The first output, in embodiments, may include information indicating the phase differences (if there is any) between the first receiver side clock and the interim side clock signal. Additionally, in embodiments, the first output may include information indicating a difference (if there is any) of frequencies between the first receiver side clock signal and the interim side clock signal.

At a step S1012, the first output may be transmitted from the phase detector to a phase controller of the field programmable gate array system, which may be placed within the field programmable gate array.

At a step S1014, interim adjustment information is determined by the phase controller. In embodiments, the interim adjustment information may be based at least in part on the first output. For example, the interim adjustment information may indicate necessary adjustments to align the phases of the first receiver side clock signal and the interim side clock signal. As another example, the interim adjustment information may indicate necessary adjustments to align the frequencies of the first receiver side clock signal and the interim side clock signal.

At a step S1016, the interim adjustment information is transmitted from the phase controller to the adjustable oscillator. In embodiments, once the interim adjustment information is received, the adjustable oscillator adjusts the second clock signal based on the interim adjustment information. The adjustment of the second clock signal, in embodiments, may change the phase of the second clock signal. In embodiments, the interim adjustment information indicates a desired phase. In embodiments, the interim adjustment information indicates a desired frequency. In embodiments, the interim adjustment information indicates a change in phase. In embodiments, the interim adjustment information indicates a change in frequency. In embodiments, the adjustment information includes a voltage. In embodiments, the adjustment information includes a digital transmission. For example, the adjustment information may be a command over a serial bus (e.g., I2C or SPI) that adjusts a clock divider or phase rotator. As another example, the adjustment information may trigger a set of parallel digital wires for "frequency/phase up," "frequency/phase down," and/or "frequency/phase step." In embodiments, the adjustment of the second clock signal may change the frequency of the second clock signal.

In embodiments, steps S1002 through steps S1016 are repeated until the first output of the phase detector is below the first threshold level. This threshold level may indicate that the first receiver side clock signal and the interim transmitter side clock signal have phases that are aligned. This threshold level may indicate that the first receiver side clock signal and the interim transmitter side clock signal have frequencies that correspond to one another.

Referring back to FIG. 9B, once the first output of the phase detector is below a first threshold level, at a step S922, the serializer may transmit the first transmitter side clock signal to the computational circuitry. At a step S924, a first set of operations performed by the computational circuitry on at least a portion of the first plurality of data items to generate a second plurality of data streams. In embodiments, the first operation includes a trading algorithm. In embodiments the trading algorithm may include the parsing the market data. Once the market data is parsed, mathematical operations are performed at a portion of the market data. After the mathematical operations are performed, order packets are generated using at least an output of the mathematical operations. In embodiments, the first set of operations includes at least one of the following: (i) an arithmetic operation; (ii) a logical operation; (iii) a pipeline operation; and (iv) a memory access operation.

In embodiments, at least a portion of the first set of operations is performed prior to step S922. In embodiments, at least a portion of the first set of operations is performed after step S922. In embodiments all of the first set of operations is performed after step S922.

In embodiments, the second plurality of data streams may include a second amount of data streams. In embodiments, the second amount of data streams may be the same as the first amount of data streams. In embodiments, the second amount of data streams is equal to eight (8) data streams. In embodiments, the second amount of data streams is equal to ten (10) data streams. In embodiments, the second amount of data streams is equal to sixteen (16) data streams. In embodiments, the second amount of data streams is equal to twenty (20) data streams. In embodiments, the second amount of data streams is equal to thirty-two (32) data streams. In embodiments, the second amount of data streams is equal to forty (40) data streams. In embodiments, the second amount of data streams is equal to sixty-four (64) data streams. In embodiments, the second amount of data streams is equal to eighty (80) data streams. In embodiments, the second amount of data streams is equal to one hundred twenty-eight (128) data streams. In embodiments, the second amount of data streams is equal to one hundred sixty (160) data streams. In embodiments, the second amount of data streams is equal to two (2) to the power of N, where N is an integer. In embodiments, the second amount of data streams is equal to ten (10) times two (2) to the power of N, where N is an integer. In embodiments the second amount of data streams is equal to thirty-three (33) times two (2) to the power of N, where N is an integer.

At a step S926, the second plurality of data streams is transmitted from the computational circuitry to the serializer. Once received by the serializer, at a step S928, the serializer converts the second plurality of parallel data streams into the second serial data stream. The second serial data stream, in embodiments, includes trading data. Trading data, for example, may be any data related to purchasing or selling of stocks, commodities, goods, and/or services.

At a step S930, the second serial data stream may be transmitted from the serializer off the field gate programmable array system via a second plurality of data pins of the first interface. In embodiments, the second serial data stream is transmitted from the serializer on the field programmable gate array to an input/output module of the field gate array system but not on the field gate array. The second serial data stream may then be transmitted from the input/output module off the field gate array system.

FIGS. 12A-C, 13A-B and 14 are exemplary flow charts of a process implementing the field programmable gate array system in accordance with another exemplary embodiment of the present invention. In embodiments, the process described in the flow charts of FIGS. 12A-C, 13A-B and 14 may be implemented by the field programmable gate array system shown in FIG. 3A or FIG. 5A. The field programmable gate array system, including the field programmable gate array and the components thereof, may be similar to the field programmable gate array systems of FIGS. 3A and 5A, the descriptions of which applying herein.

Figure 12A:
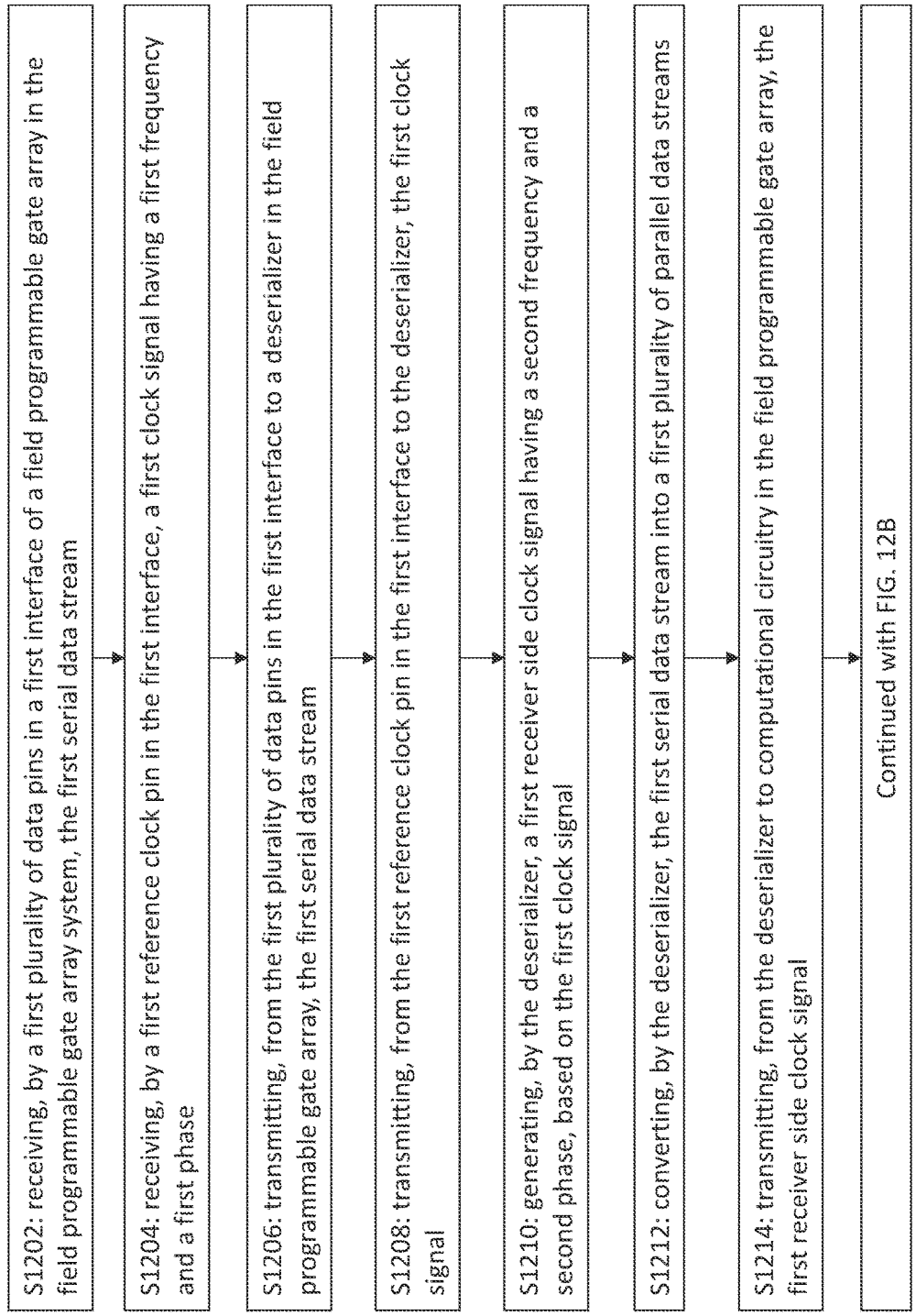
FIGS. 12A-C are flow charts of a process implementing the field programmable gate array system in accordance with an exemplary embodiment of the present invention.
Figure 12B:
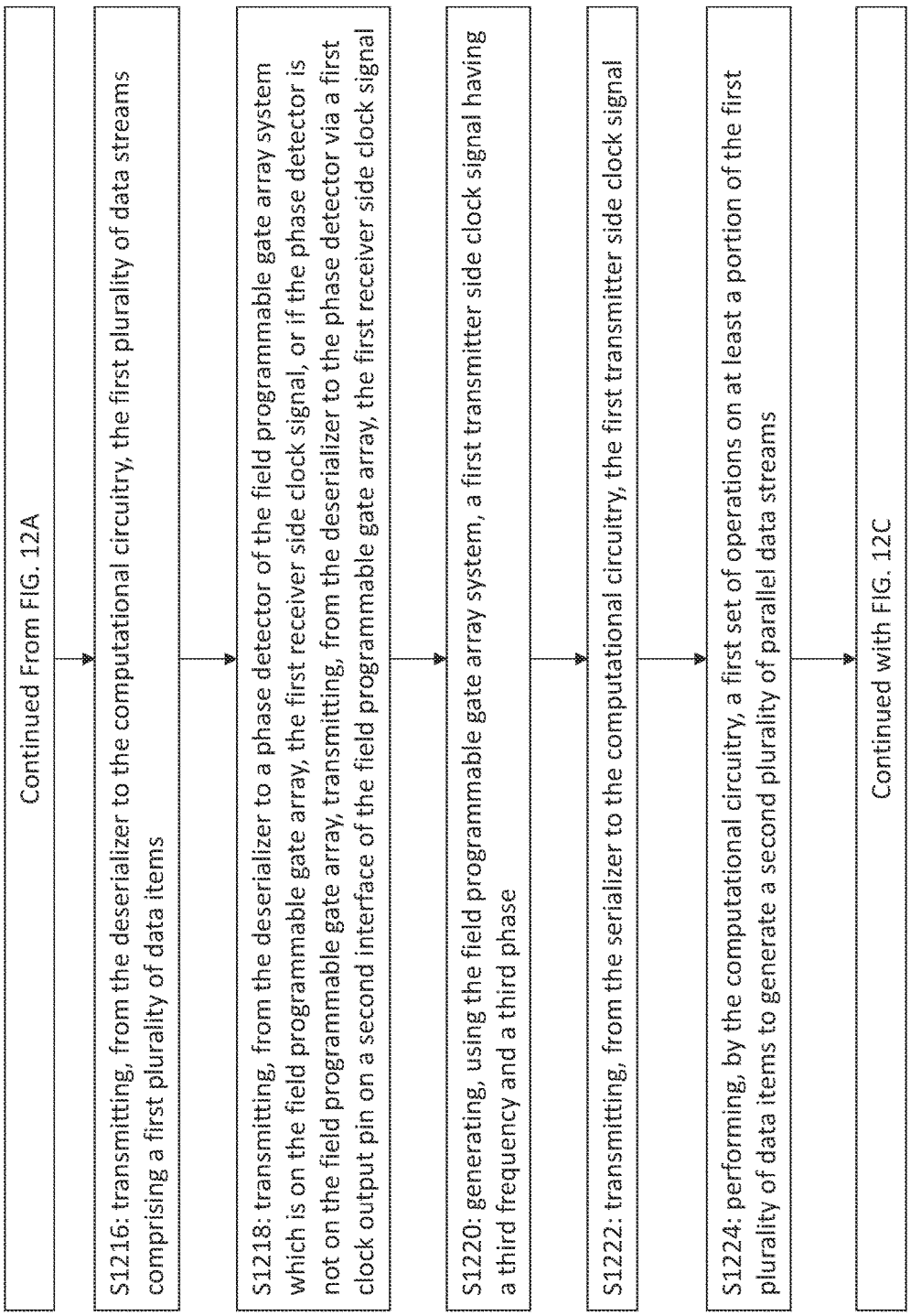
Figure 12C:
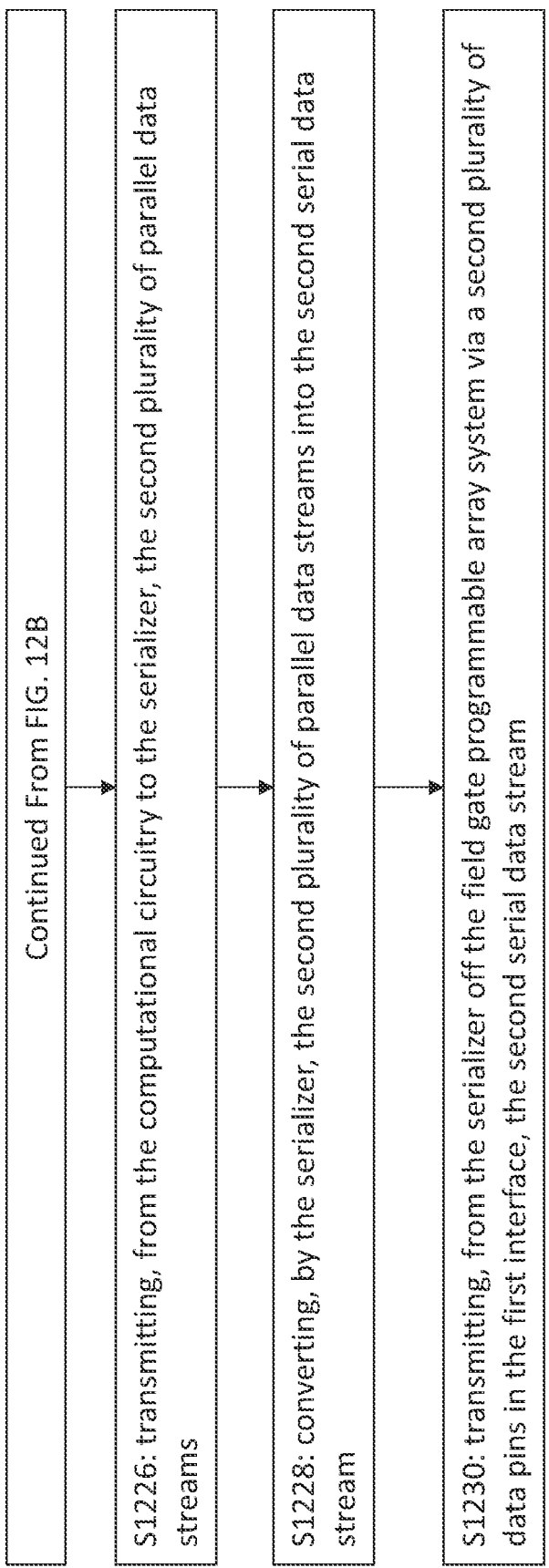

The process of FIGS. 12A-12C may begin at step S1202. Referring to FIG. 12A, at step S1202, a first serial data stream is received by a first plurality of data pins of a first interface of a field programmable gate array in the field programmable gate array system. In embodiments, the first serial data stream may include market data. In embodiments, market data may be price and trade-related data for a financial instrument reported by a trading venue (i.e., a stock exchange).

At a step S1204, a first clock signal having a first frequency and a first phase is received by a first reference clock in in the first interface. In embodiments, step S1204 may be performed before step S1202. In embodiments, step S1204 may be performed contemporaneously with step S1202.

The process of FIGS. 12A-12C may continue with a step S1206. At step S1206, the first plurality of data pins of the first interface may transmit the first serial data stream to a deserializer in the field programmable gate array.

At a step S1208, the first reference clock pin in the first interface may transmit the first clock signal to the deserializer. In embodiments, step S1208 may be performed before step S1206. In embodiments step S1208 may be performed contemporaneously with step S1206.

At a step S1210, a first receiver side clock signal may be generated by the deserializer. In embodiments, the first receiver side clock signal may have a second frequency and a second phase. In embodiments, the second frequency is different from the first frequency. In embodiments, the second frequency corresponds to the first frequency. In embodiments, corresponding may refer to the frequencies being the same frequency. In embodiments corresponding may also refer to frequencies being close (e.g., within an acceptable range in the art) to the same frequencies. In embodiments, the first phase and the second phase may not be aligned. In embodiments the first phase and the second phase are aligned. In embodiments, a difference between the first phase and the second phase is below a threshold level. In embodiments, the deserializer generates the first receiver clock signal based at least in part on the first clock signal.

At a step S1212, the first serial data stream received by the deserializer may be converted, by the deserializer, into a first plurality of data streams. In embodiments, the first plurality of data streams may include a first amount of data streams. In embodiments, the first amount of data streams is equal to eight (8) data streams. In embodiments, the first amount of data streams is equal to ten (10) data streams. In embodiments, the first amount of data streams is equal to sixteen (16) data streams. In embodiments, the first amount of data streams is equal to twenty (20) data streams. In embodiments, the first amount of data streams is equal to thirty-two (32) data streams. In embodiments, the first amount of data streams is equal to forty (40) data streams. In embodiments, the first amount of data streams is equal to sixty-four (64) data streams. In embodiments, the first amount of data streams is equal to eighty (80) data streams. In embodiments, the first amount of data streams is equal to one hundred twenty-eight (128) data streams. In embodiments, the first amount of data streams is equal to one hundred sixty (160) data streams. In embodiments, the first amount of data streams is equal to two (2) to the power of N, where N is an integer. In embodiments, the first amount of data streams is equal to ten (10) times two (2) to the power of N, where N is an integer. In embodiments the first amount of data streams is equal to thirty-three (33) times two (2) to the power of N, where N is an integer.

At a step S1214, the first receiver side clock signal is transmitted from the deserializer to computational circuitry in the field programmable gate array.

At a step S1216, the first plurality of data streams is transmitted form the deserializer to the computational circuitry. In embodiments, the first plurality of data streams includes a first plurality of data items. In embodiments, step S1216 may be performed before step S1214. In embodiments step S1216 may be performed contemporaneously with step S1214.

At a step S1218, the first receiver side clock signal is transmitted from the deserializer to a phase detector of the field programmable gate array system. The phase detector may or may not be placed on the field programmable gate array. If the phase detector is not on the field programmable gate array, the first receiver side clock signal is transmitted from the deserializer to the phase detector via a first clock output pin on a second interface of the field programmable gate array. In embodiments, the transmission of the first receiver side clock signal to the phase detector may also be via a first zero delay buffer phase lock loop of the field programmable gate array before being transmitted via the first clock output pin of the second interface.

At a step S1220, a first transmitter side clock signal is generated by the field programmable gate array system. In embodiments, the first transmitter side clock signal has a third frequency and a third phase. In embodiments, the third frequency corresponds to the second frequency. In embodiments the third phase may be aligned with the second phase. In embodiments, the third phase and the second phase may not be aligned. In embodiments, the third phase and the second phase may have a difference in phases that is less than a second threshold level. In embodiments, the first transmitter side clock signal is generated by performing the following steps until a first output of the phase detector is below a first threshold.

Figure 13A:
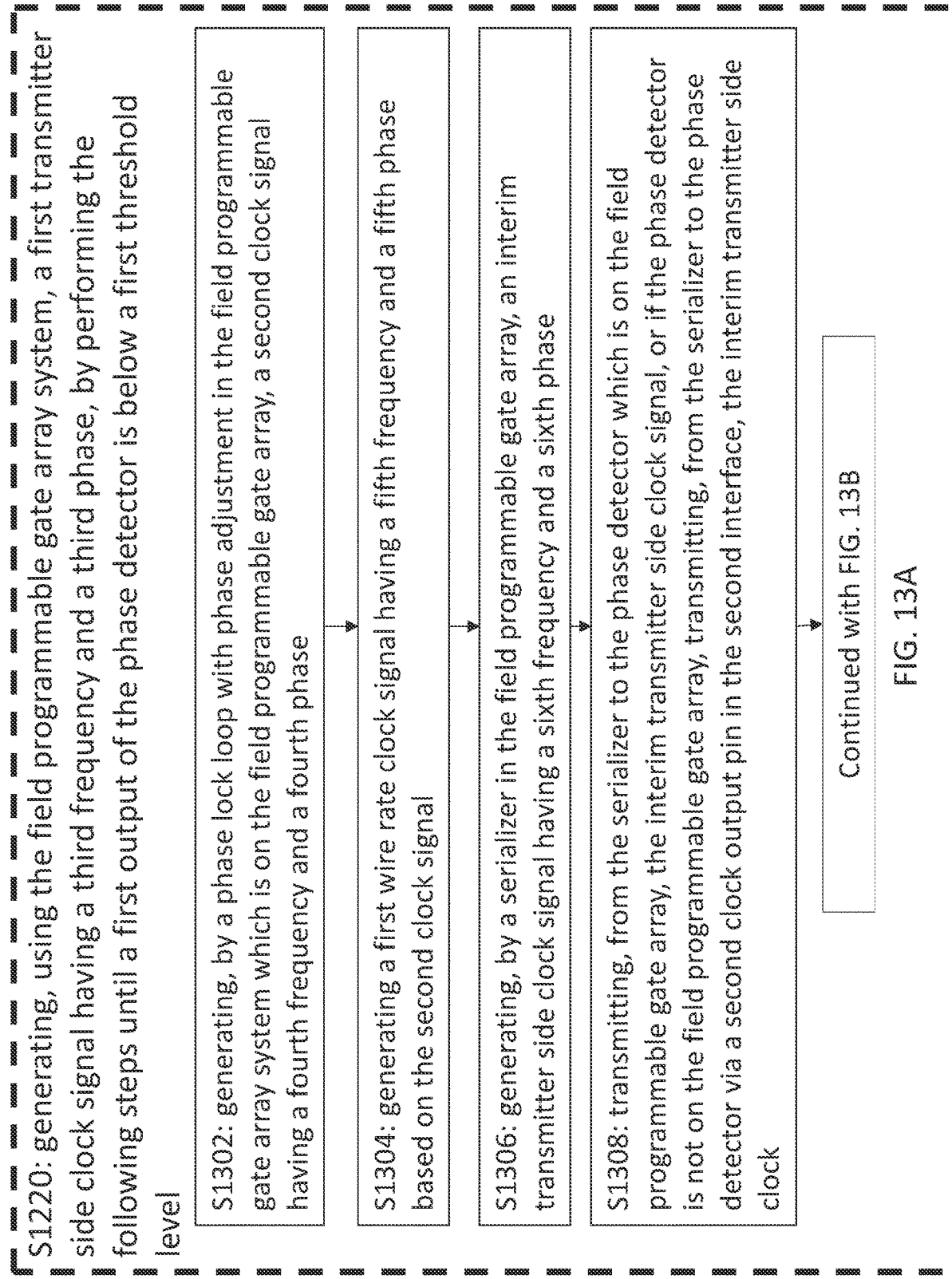

Referring to FIG. 13A, generating the first transmitter side clock signal may begin at step S1302. At step S1302, a second clock signal is generated by a phase lock loop with phase adjustment in the field programmable gate array system. In embodiments, the phase lock loop with phase adjustment is on the field programmable gate array. In embodiments, the phase lock loop with phase adjustment is located within the core of the field programmable gate array. In embodiments, the second clock signal may have a fourth frequency and a fourth phase.

The process of FIGS. 13A-B may continue at a step S1304. At step S1304, a first wire rate clock signal having a fifth phase and a fifth frequency is generated. In embodiments, the generation of the first wire rate clock signal may be based in part on the second clock signal. In embodiments the fifth frequency is a rational multiple of the fourth frequency. In embodiments the fifth frequency is equal to x times the fifth frequency where x is the second amount of data streams. In embodiments the fifth frequency is equal to x times the frequency of the of the transmitter side clock signal where x may be half of the second amount of data streams.

Figure 14:
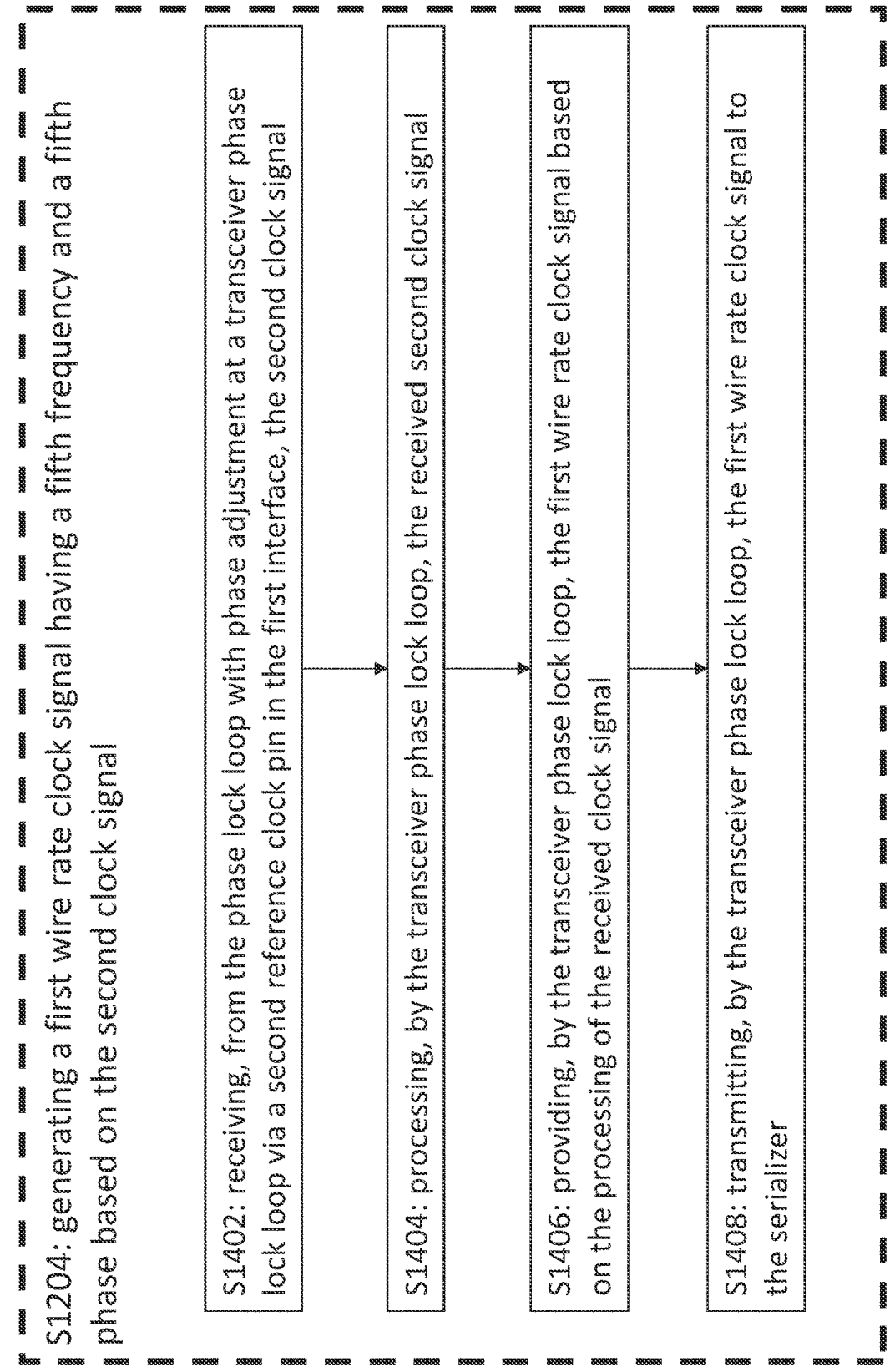
FIG. 14 is a flow chart of a process for generating a wire rate clock signal in accordance with an embodiment of the present invention.

In embodiments, the generation of the first wire rate clock signal may be performed with the following steps. Referring to FIG. 14, at a step S1402, the second clock signal is received from the phase lock loop with phase adjustment at a transceiver phase lock loop via a second reference clock pin in the first interface. At a step S1404, the second clock signal is processed by the transceiver phase lock loop. As a step S1406, the first wire rate clock signal is provided by the transceiver phase lock loop. The providing of the first wire rate clock signal, in embodiments, may be based at least in part on the processing of the received second clock signal. Once the first wire rate clock signal is provided, at a step S1408, the first wire rate clock signal is transmitted by the transceiver phase lock loop to a serializer on the field programmable gate array. In embodiments, the first wire rate clock signal is generated by a phase lock loop. In embodiments, the phase lock loop that generates the first wire rate clock signal is on field programmable gate array. In embodiments, the phase lock loop that generates the first wire rate clock signal may be part of the field programmable gate array system and not part of the field programmable gate array.

In embodiments, the generation of the first wire rate clock signal may include processing the second clock signal. Once the second clock signal is processed, the first wire rate clock signal may be provided. The providing of the first wire rate clock signal, in embodiments, is based at least in part on the processing of the second clock signal. After providing the first wire rate clock signal, in embodiments, the first wire rate clock signal may be transmitted to the serializer.

Referring back to FIG. 13A, at a step 1306, an interim transmitter side clock signal having a sixth frequency and a sixth phase is generated by the serializer in the field programmable gate array. In embodiments, the sixth frequency corresponds to the third frequency. In embodiments the sixth phase may be aligned with the third phase. In embodiments, the sixth frequency may correspond to the third frequency and the sixth phase may not be aligned with the third phase. In embodiments, the sixth phase and the third phase may not be aligned. In embodiments, the third phase and the sixth phase may have a difference in phases that is less than a second threshold level.

At a step S1308, the interim transmitter side clock signal is transmitted from the serializer to the phase detector, which may or may not be on the field programmable gate array. If the phase detector is not on the field programmable gate array, the interim transmitter side clock signal may be transmitted from the serializer to the phase detector via a second clock output pin of the second interface. In embodiments, the interim transmitter side clock signal may also be transmitted via a second zero delay buffer phase lock loop of the field programmable gate array before being transmitted via the second clock output in of the second interface.

The process of FIGS. 13A-13B may continue with at a step S1310. Referring to FIG. 13B, at a step S1310, a first output is generated by the phase detector. The first output, in embodiments, is based at least on a comparison of the first receiver side clock signal and the interim side clock signal. The first output, in embodiments, may include information indicating the phase differences (if there is any) between the first receiver side clock and the interim side clock signal. Additionally, in embodiments, the first output may include information indicating a difference (if there is any) of frequencies between the first receiver side clock signal and the interim side clock signal.

At a step S1312, the first output may be transmitted from the phase detector to a phase controller of the field programmable gate array system, which may be placed within the field programmable gate array.

At a step S1314, interim adjustment information is determined by the phase controller. In embodiments, the interim adjustment information may be based at least in part on the first output. For example, the interim adjustment information may indicate necessary adjustments to align the phases of the first receiver side clock signal and the interim side clock signal. As another example, the interim adjustment information may indicate necessary adjustments to align the frequencies of the first receiver side clock signal and the interim side clock signal.

At a step S1316, the interim adjustment information is transmitted from the phase controller to the phase lock loop with phase adjustment. In embodiments, once the interim adjustment information is received, the phase lock loop with phase adjustment adjusts the second clock signal based on the interim adjustment information. The adjustment of the second clock signal, in embodiments, may change the phase of the second clock signal. In embodiments, the interim adjustment information indicates a desired phase. In embodiments, the interim adjustment information indicates a desired frequency. In embodiments, the interim adjustment information indicates a change in phase. In embodiments, the interim adjustment information indicates a change in frequency. In embodiments, the adjustment information includes a voltage. In embodiments, the adjustment information includes a digital transmission. For example, the adjustment information may be a command over a serial bus (e.g., I2C or SPI) that adjusts a clock divider or phase rotator. As another example, the adjustment information may trigger a set of parallel digital wires for "frequency/phase up," "frequency/phase down," and/or "frequency/phase step." In embodiments, the adjustment of the second clock signal may change the frequency of the second clock signal.

In embodiments, steps S1302 through steps S1316 are repeated until the first output of the phase detector is below the first threshold level. This threshold level may indicate that the first receiver side clock signal and the interim transmitter side clock signal have phases that are aligned. This threshold level may indicate that the first receiver side clock signal and the interim transmitter side clock signal have frequencies that correspond to one another.

Referring back to FIG. 12B, once the first output of the phase detector is below a first threshold level, at a step S1222, the serializer may transmit the first transmitter side clock signal to the computational circuitry. At a step S1224, a first set of operations performed by the computational circuitry on at least a portion of the first plurality of data items to generate a second plurality of data streams. In embodiments, the first operation includes a trading algorithm. In embodiments the trading algorithm may include the parsing the market data. Once the market data is parsed, mathematical operations are performed at a portion of the market data. After the mathematical operations are performed, order packets are generated using at least an output of the mathematical operations. In embodiments, the first set of operations includes at least one of the following: (i) an arithmetic operation; (ii) a logical operation; (iii) a pipeline operation; and (iv) a memory access operation.

In embodiments, at least a portion of the first set of operations is performed prior to step S1222. In embodiments, at least a portion of the first set of operations is performed after step S922. In embodiments all of the first set of operations is performed after step S1222.

In embodiments, the second plurality of data streams may include a second amount of data streams. In embodiments, the second amount of data streams may be the same as the first amount of data streams. In embodiments, the second amount of data streams is equal to eight (8) data streams. In embodiments, the second amount of data streams is equal to ten (10) data streams. In embodiments, the second amount of data streams is equal to sixteen (16) data streams. In embodiments, the second amount of data streams is equal to twenty (20) data streams. In embodiments, the second amount of data streams is equal to thirty-two (32) data streams. In embodiments, the second amount of data streams is equal to forty (40) data streams. In embodiments, the second amount of data streams is equal to sixty-four (64) data streams. In embodiments, the second amount of data streams is equal to eighty (80) data streams. In embodiments, the second amount of data streams is equal to one hundred twenty-eight (128) data streams. In embodiments, the second amount of data streams is equal to one hundred sixty (160) data streams. In embodiments, the second amount of data streams is equal to two (2) to the power of N, where N is an integer. In embodiments, the second amount of data streams is equal to ten (10) times two (2) to the power of N, where N is an integer. In embodiments the second amount of data streams is equal to thirty-three (33) times two (2) to the power of N, where N is an integer.

At a step S1226, the second plurality of data streams is transmitted from the computational circuitry to the serializer. Once received by the serializer, at a step S1228, the serializer converts the second plurality of parallel data streams into the second serial data stream. The second serial data stream, in embodiments, includes trading data. Trading data, for example, may be any data related to purchasing or selling of stocks, commodities, goods, and/or services.

At a step S1230, the second serial data stream may be transmitted from the serializer off the field gate programmable array system via a second plurality of data pins of the first interface. In embodiments, the second serial data stream is transmitted from the serializer on the field programmable gate array to an input/output module of the field gate array system but not on the field gate array. The second serial data stream may then be transmitted from the input/output module off the field gate array system.

FIGS. 15A-C, 16A-B and 17 are exemplary flow charts of a process implementing the field programmable gate array system in accordance with yet another embodiment of the present invention. In embodiments, the process described in the flow charts of FIGS. 15A-C, 16A-B and 17 may be implemented by the field programmable gate array system shown in FIG. 3B or FIG. 5B. The field programmable gate array system, including the field programmable gate array and the components thereof, may be similar to the field programmable gate array systems of FIG. 3B and FIG. 5B, the descriptions of which applying herein.

Figure 15A:
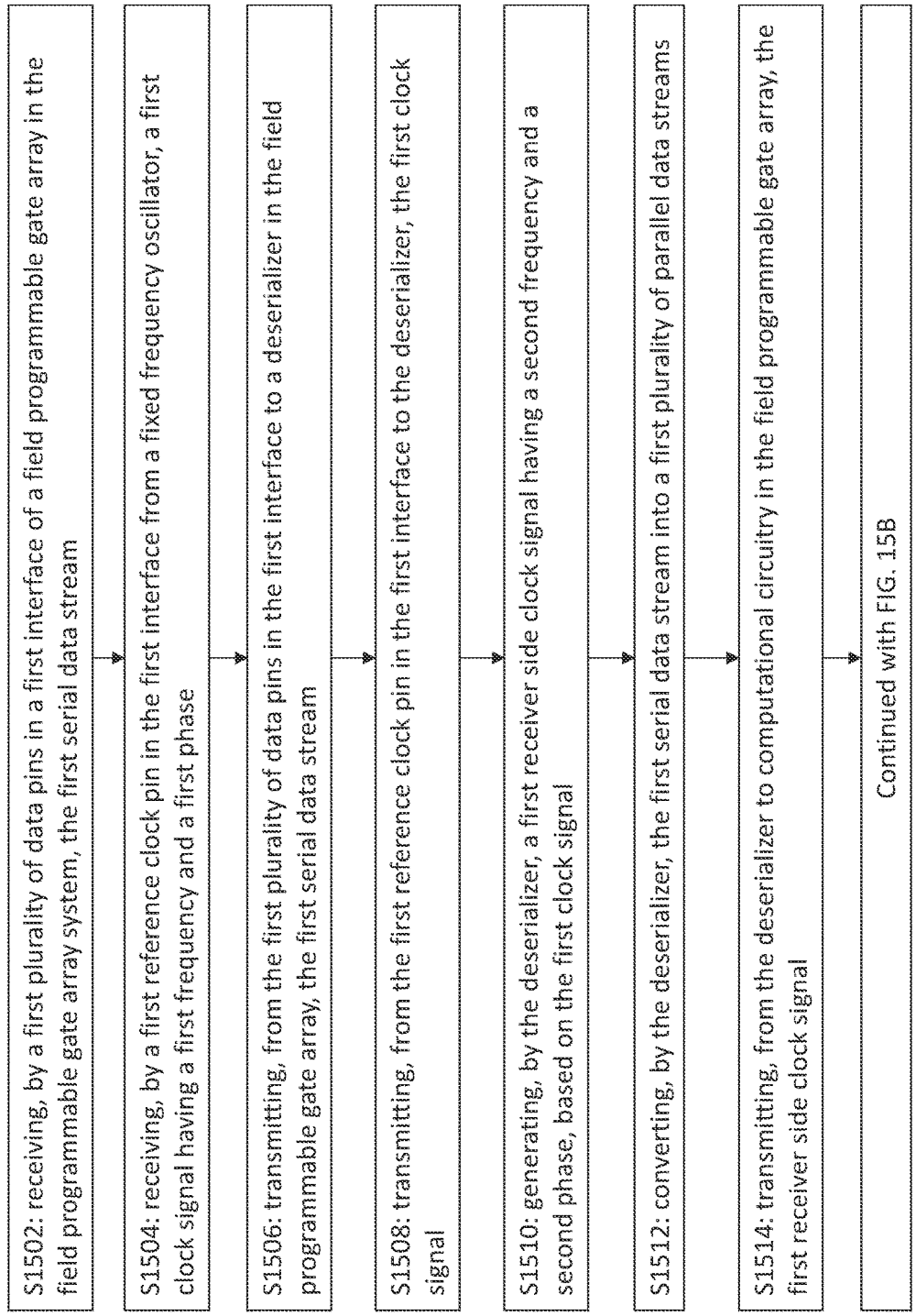
Figure 15C:
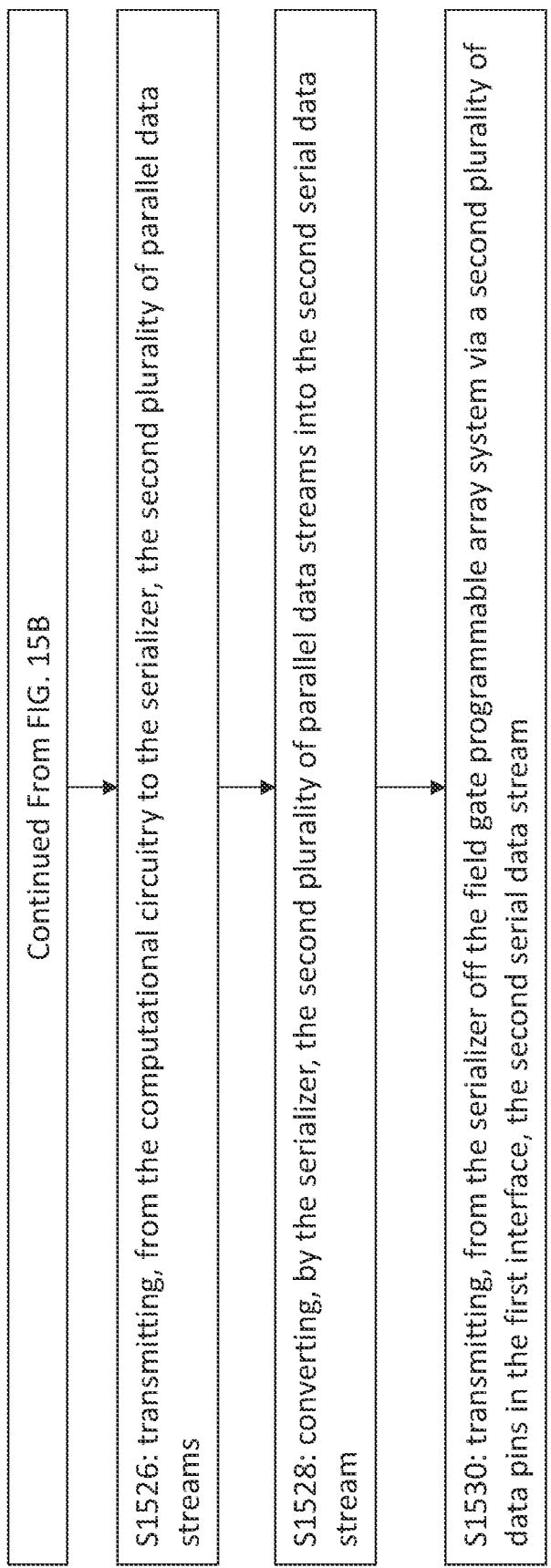

The process of FIGS. 15A-15C may begin at step S1502. Referring to FIG. 15A, at step S1502, a first serial data stream is received by a first plurality of data pins of a first interface of a field programmable gate array in the field programmable gate array system. In embodiments, the first serial data stream may include market data. In embodiments, market data may be price and trade-related data for a financial instrument reported by a trading venue (i.e., a stock exchange).

At a step S1504, a first clock signal having a first frequency and a first phase is received by a first reference clock pin in the first interface from a fixed frequency oscillator. In embodiments, step S1504 may be performed before step S1502. In embodiments, step S1504 may be performed contemporaneously with step S1502.

The process of FIGS. 15A-15C may continue with a step S1506. At step S1506, the first plurality of data pins of the first interface may transmit the first serial data stream to a deserializer in the field programmable gate array.

At a step S1508, the first reference clock pin in the first interface may transmit the first clock signal to the deserializer. In embodiments, step S1508 may be performed before step S1506. In embodiments step S1508 may be performed contemporaneously with step S1506.

At a step S1510, a first receiver side clock signal may be generated by the deserializer. In embodiments, the first receiver side clock signal may have a second frequency and a second phase. In embodiments, the second frequency is different from the first frequency. In embodiments, the second frequency corresponds to the first frequency. In embodiments, corresponding may refer to the frequencies being the same frequency. In embodiments corresponding may also refer to frequencies being close (e.g., within an acceptable range in the art) to the same frequencies. In embodiments, the first phase and the second phase may not be aligned. In embodiments the first phase and the second phase are aligned. In embodiments, a difference between the first phase and the second phase is below a threshold level. In embodiments, the deserializer generates the first receiver clock signal based at least in part on the first clock signal.

At a step S1512, the first serial data stream received by the deserializer may be converted, by the deserializer, into a first plurality of data streams. In embodiments, the first plurality of data streams may include a first amount of data streams. In embodiments, the first amount of data streams is equal to eight (8) data streams. In embodiments, the first amount of data streams is equal to ten (10) data streams. In embodiments, the first amount of data streams is equal to sixteen (16) data streams. In embodiments, the first amount of data streams is equal to twenty (20) data streams. In embodiments, the first amount of data streams is equal to thirty-two (32) data streams. In embodiments, the first amount of data streams is equal to forty (40) data streams. In embodiments, the first amount of data streams is equal to sixty-four (64) data streams. In embodiments, the first amount of data streams is equal to eighty (80) data streams. In embodiments, the first amount of data streams is equal to one hundred twenty-eight (128) data streams. In embodiments, the first amount of data streams is equal to one hundred sixty (160) data streams. In embodiments, the first amount of data streams is equal to two (2) to the power of N, where N is an integer. In embodiments, the first amount of data streams is equal to ten (10) times two (2) to the power of N, where N is an integer. In embodiments the first amount of data streams is equal to thirty-three (33) times two (2) to the power of N, where N is an integer.

At a step S1514, the first receiver side clock signal is transmitted from the deserializer to computational circuitry in the field programmable gate array.

At a step S1516, the first plurality of data streams is transmitted form the deserializer to the computational circuitry. In embodiments, the first plurality of data streams includes a first plurality of data items. In embodiments, step S1516 may be performed before step S1514. In embodiments step S1516 may be performed contemporaneously with step S1514.

At a step S1518, the first receiver side clock signal is transmitted from the deserializer to a phase detector of the field programmable gate array system, which may or may not be one the field programmable gate array. If the phase detector is not on the field programmable gate array, the first receiver side clock signal may be transmitted from the deserializer to the phase detector via a first clock output pin on a second interface of the field programmable gate array. In embodiments, the first receiver side clock signal may also be transmitted via a first zero delay buffer phase lock loop of the field programmable gate array before being transmitted via the first clock output pin of the second interface.

At a step S1520, a first transmitter side clock signal is generated by the field programmable gate array system. In embodiments, the first transmitter side clock signal has a third frequency and a third phase. In embodiments, the third frequency corresponds to the second frequency. In embodiments, the third phase may be aligned with the second phase. In embodiments, the third phase and the second phase may not be aligned. In embodiments, the third phase and the second phase may have a difference in phases that is less than a second threshold level. In embodiments, the first transmitter side clock signal is generated by performing the following steps until a first output of the phase detector is below a first threshold.

Figure 16A:
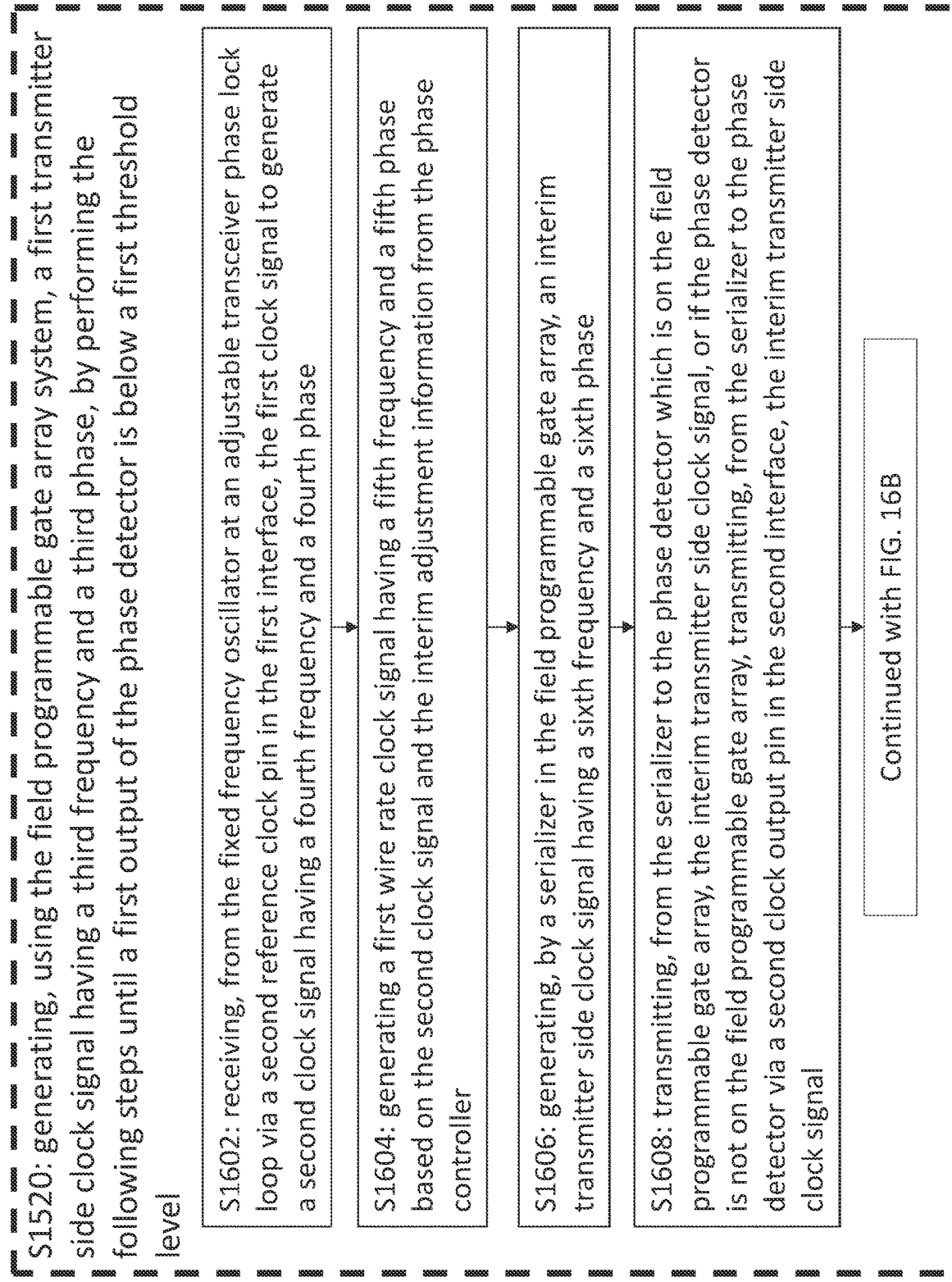

Referring to FIG. 16A, generating the first transmitter side clock signal may begin at step S1602. At step S1602, an adjustable transceiver phase lock loop receives the first clock signal from the fixed frequency oscillator via a second reference clock pin in the first interface. In embodiments, the received first clock signal is used by the adjustable transceiver phase lock loop to generate a second clock signal. In embodiments, the second clock signal may have a fourth frequency and a fourth phase.

The process of FIGS. 16A-B may continue at a step S1604. At step S1604, a first wire rate clock signal having a fifth phase and a fifth frequency is generated. In embodiments, the generation of the first wire rate clock signal may be based in part on the second clock signal. In embodiments the fifth frequency is a rational multiple of the fourth frequency. In embodiments the fifth frequency is equal to x times the fifth frequency where x is the second amount of data streams. In embodiments the fifth frequency is equal to x times the frequency of the of the transmitter side clock signal where x may be half of the second amount of data streams.

Figure 17:
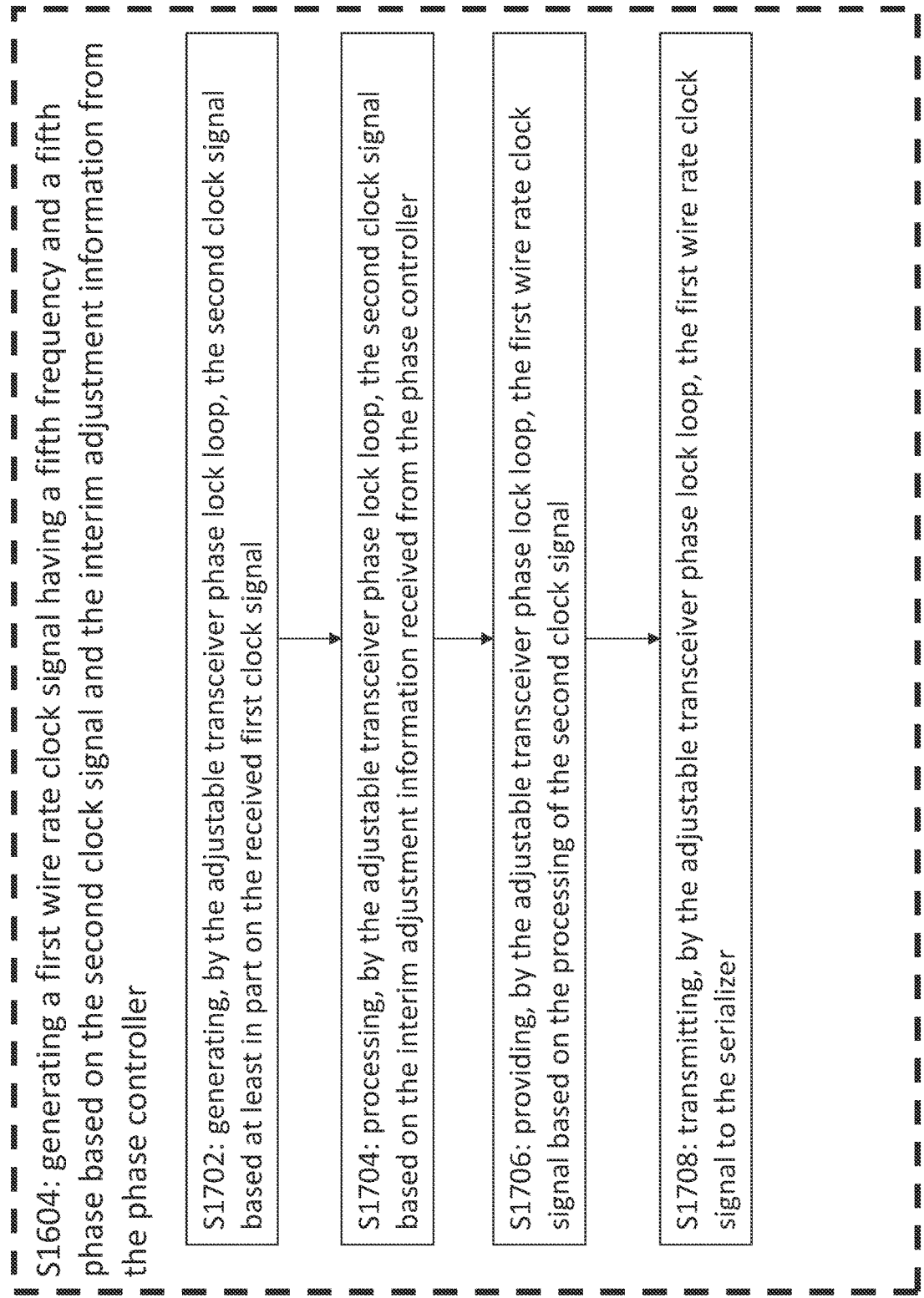
FIG. 17 is a flow chart of a process for generating a wire rate clock signal in accordance with an exemplary embodiment of the present invention.

In embodiments, the generation of the first wire rate clock signal may be performed with the following steps. Referring to FIG. 17, at a step S1702, the second clock signal is generated by the adjustable transceiver phase lock loop based at least in part on the received first clock signal. At a step S1704, the second clock signal is processed by the adjustable transceiver phase lock loop based on the interim adjustment information received from the phase controller (see S1614 and S1616). As a step S1706, the first wire rate clock signal is provided by the adjustable transceiver phase lock look. The providing of the first wire rate clock signal, in embodiments, may be based at least in part on the processing of the second clock signal. Once the first wire rate clock signal is provided, at a step S1708. the first wire rate clock signal is transmitted by the adjustable transceiver phase lock loop to a serializer on the field programmable gate array. In embodiments, the first wire rate clock signal is generated by a phase lock loop. In embodiments, the phase lock loop that generates the first wire rate clock signal is on field programmable gate array. In embodiments, the phase lock loop that generates the first wire rate clock signal is part of the field programmable gate array system and not part of the field programmable gate array.

In embodiments, the generation of the first wire rate clock signal may include processing the second clock signal. Once the second clock signal is processed, the first wire rate clock signal may be provided. The providing of the first wire rate clock signal, in embodiments, is based at least in part on the processing of the second clock signal. After providing the first wire rate clock signal, in embodiments, the first wire rate clock signal may be transmitted to the serializer.

Referring back to FIG. 16A, at a step 1606, an interim transmitter side clock signal having a sixth frequency and a sixth phase is generated by the serializer in the field programmable gate array. In embodiments, the sixth frequency corresponds to the third frequency. In embodiments the sixth phase may be aligned with the third phase. In embodiments, the sixth frequency may correspond to the third frequency and the sixth phase may not be aligned with the third phase. In embodiments, the sixth phase and the third phase may not be aligned. In embodiments, the third phase and the sixth phase may have a difference in phases that is less than a second threshold level.

At a step S1608, the interim transmitter side clock signal is transmitted from the serializer to the phase detector, which may or may not be on the field programmable gate array. If the phase detector is not on the field programmable gate array, the interim transmitter side clock signal may be transmitted from the serializer to the phase detector via a second clock output pin of the second interface. In embodiments, the interim transmitter side clock signal may also be transmitted a second zero delay buffer phase lock loop of the field programmable gate array before being transmitted via the second clock output in of the second interface.

The process of FIGS. 16A-16B may continue with at a step S1610. Referring to FIG. 16B, at a step S1610, a first output is generated by the phase detector. The first output, in embodiments, is based at least on a comparison of the first receiver side clock signal and the interim side clock signal. The first output, in embodiments, may include information indicating the phase differences (if there is any) between the first receiver side clock and the interim side clock signal. Additionally, in embodiments, the first output may include information indicating a difference (if there is any) of frequencies between the first receiver side clock signal and the interim side clock signal.

At a step S1612, the first output may be transmitted from the phase detector to a phase controller of the field programmable gate array system, which may be placed within the field programmable gate array.

At a step S1614, interim adjustment information is determined by the phase controller. In embodiments, the interim adjustment information may be based at least in part on the first output. For example, the interim adjustment information may indicate necessary adjustments to align the phases of the first receiver side clock signal and the interim side clock signal. As another example, the interim adjustment information may indicate necessary adjustments to align the frequencies of the first receiver side clock signal and the interim side clock signal.

At a step S1616, the interim adjustment information is transmitted from the phase controller to the adjustable transceiver phase lock loop. In embodiments, once the interim adjustment information is received, the adjustable transceiver phase lock loop adjusts the second clock signal based on the interim adjustment information. The adjustment of the second clock signal, in embodiments, may change the phase of the second clock signal. In embodiments, the interim adjustment information indicates a desired phase. In embodiments, the interim adjustment information indicates a desired frequency. In embodiments, the interim adjustment information indicates a change in phase. In embodiments, the interim adjustment information indicates a change in frequency. In embodiments, the adjustment information includes a voltage. In embodiments, the adjustment information includes a digital transmission. For example, the adjustment information may be a command over a serial bus (e.g., I2C or SPI) that adjusts a clock divider or phase rotator. As another example, the adjustment information may trigger a set of parallel digital wires for "frequency/phase up," "frequency/phase down," and/or "frequency/phase step." In embodiments, the adjustment of the second clock signal may change the frequency of the second clock signal.

In embodiments, steps S1602 through steps S1016 are repeated until the first output of the phase detector is below the first threshold level. This threshold level may indicate that the first receiver side clock signal and the interim transmitter side clock signal have phases that are aligned. This threshold level may indicate that the first receiver side clock signal and the interim transmitter side clock signal have frequencies that correspond to one another.

Referring back to FIG. 15B, once the first output of the phase detector is below a first threshold level, at a step S1522, the serializer may transmit the first transmitter side clock signal to the computational circuitry. At a step S1524, a first set of operations is performed by the computational circuitry on at least a portion of the first plurality of data items to generate a second plurality of data streams. In embodiments, the first operation includes a trading algorithm. In embodiments the trading algorithm may include the parsing the market data. Once the market data is parsed, mathematical operations are performed at a portion of the market data. After the mathematical operations are performed, order packets are generated using at least an output of the mathematical operations. In embodiments, the first set of operations includes at least one of the following: (i) an arithmetic operation; (ii) a logical operation; (iii) a pipeline operation; and (iv) a memory access operation.

In embodiments, at least a portion of the first set of operations is performed prior to step S1522. In embodiments, at least a portion of the first set of operations is performed after step S1522. In embodiments, all of the first set of operations is performed after step S1522.

In embodiments, the second plurality of data streams may include a second amount of data streams. In embodiments, the second amount of data streams may be the same as the first amount of data streams. In embodiments, the second amount of data streams is equal to eight (8) data streams. In embodiments, the second amount of data streams is equal to ten (10) data streams. In embodiments, the second amount of data streams is equal to sixteen (16) data streams. In embodiments, the second amount of data streams is equal to twenty (20) data streams. In embodiments, the second amount of data streams is equal to thirty-two (32) data streams. In embodiments, the second amount of data streams is equal to forty (40) data streams. In embodiments, the second amount of data streams is equal to sixty-four (64) data streams. In embodiments, the second amount of data streams is equal to eighty (80) data streams. In embodiments, the second amount of data streams is equal to one hundred twenty-eight (128) data streams. In embodiments, the second amount of data streams is equal to one hundred sixty (160) data streams. In embodiments, the second amount of data streams is equal to two (2) to the power of N, where N is an integer. In embodiments, the second amount of data streams is equal to ten (10) times two (2) to the power of N, where N is an integer. In embodiments the second amount of data streams is equal to thirty-three (33) times two (2) to the power of N, where N is an integer.

At a step S1526, the second plurality of data streams is transmitted from the computational circuitry to the serializer. Once received by the serializer, at a step S1528, the serializer converts the second plurality of parallel data streams into the second serial data stream. The second serial data stream, in embodiments, includes trading data. Trading data, for example, may be any data related to purchasing or selling of stocks, commodities, goods, and/or services.

At a step S1530, the second serial data stream may be transmitted from the serializer off the field gate programmable array system via a second plurality of data pins of the first interface. In embodiments, the second serial data stream is transmitted from the serializer on the field programmable gate array to an input/output module of the field gate array system but not on the field gate array. The second serial data stream may then be transmitted from the input/output module off the field gate array system.

EXAMPLES

The following examples may be used to illustrate embodiments of the present invention. They are meant solely for illustration and not intended to be limiting.

Example 1

In embodiments a trading algorithm may be applied in a crossing auction on an option exchange. In embodiments, a third serial data stream including target price information on a set of options contracts is provided as in input to the FPGA. In embodiments, the first serial stream includes market data includes bid, asks, trades and auction notifications. When an auction is announced, as indicated in the market data, the FPGA compares the announced auction price to its target price. In embodiments, the target price is stored in the FPGA and is provided via the third serial data stream. In embodiments, the target price may be generated using a suitable pricing model, e.g., Black Scholes model. When there is some overlap, the field programmable gate array generates and sends an order at its target price which is transmitted out of the FPGA in the second serial data stream. In embodiments, the target price information on a set of options contracts is streamed into the field programmable gate array as a simple set of triggers in the third serial data stream. The target price information, may include a linearization of the result of the Black Scholes computation or some other model. The field programmable gate array may implement Black Scholes, and instead receive market data on the underlying a et as a secondary data stream.

Example 2

Another example of a trading algorithm is "signal based". In embodiments, signals refer to a trigger that is activated when certain events happen. In embodiments, a signal may simply track a sale price which changes every time the market information indicates a sale has taken place. In embodiments, a signal may be used as a measure of book pressure to determine whether prices are likely to rise or fall. Some signals may be calculated quickly while others are calculated more slowly because they require more data over a longer period of time. In embodiments, order information may be based on a single signal or based on a plurality of signals. Signals depending on the historical behavior of a financial instrument are programmed into the field programmable gate array. A few simple and well-known examples of a signal here are moving averages of past prices or book pressure signals (looking for an imbalance in the order book). Signal-based trading involves receiving market data on the financial instrument, constructing the order book for that instrument, calculating a predicted price based on a pre-defined collection of signals, and sending an order if the signals indicate that the signal indicates that it is a favorable time to trade. A secondary data stream here could be used to enable or disable signals or to change signal parameter values. In embodiments, the secondary data stream may be omitted. An example of a signal-based trading system might be a system that updates the quotes for a market maker when a set of signals indicates that a large directional move in the price of a stock is coming. The parallel processing advantage shows up here more so than in the first example.

Now that embodiments of the present invention have been shown and described in detail, various modifications and improvements thereon can become readily apparent to those skilled in the art. Accordingly, the exemplary embodiments of the present invention, as set forth above, are intended to be illustrative, not limiting. The spirit and scope of the present invention is to be construed broadly.

What is claimed is:

1. A method for processing a first serial data stream, using a field programmable gate array system, to generate a second serial data stream, wherein the method comprises the steps of:
(a) receiving, by a deserializer via a first reference clock pin in a first interface of a field programmable array in the field programmable gate array system, a first clock signal having a first frequency and a first phase;
(b) receiving, by the deserializer via a first plurality of data pins of the first interface of the field programmable gate array in the field programmable gate array system, the first serial data stream to generate a first receiver side clock signal having a second frequency and a second phase based on the first clock signal, and to convert the first serial data stream into a first plurality of parallel data streams comprising a first plurality of data items and a first amount of data streams;
(c) transmitting, from the deserializer to computational circuitry in the field programmable gate array, the first receiver side clock signal and the first plurality of data streams;
(d) transmitting, from the deserializer to a phase detector of the field programmable gate array system, the first receiver side clock signal;

(e) generating, using the field programmable gate array system, a first transmitter side clock signal having a third frequency and a third phase, by performing at least the following steps until a first output of the phase detector is below a first threshold level:
  (i) receiving, by an adjustable transceiver phase lock loop the first clock signal to generate a second clock signal having a fourth frequency and a fourth phase based on the first clock signal;
  (ii) generating a first wire rate clock signal having a fifth frequency and a fifth phase based on the second clock signal and the adjustment information;
  (iii) generating, by a serializer in the field programmable gate array, an interim transmitter side clock signal having a sixth frequency and a sixth phase;
  (iv) transmitting, from the serializer to the phase detector, the interim transmitter side clock signal;
  (v) generating, by the phase detector, the first output based on a comparison of the first receiver side clock signal and the interim transmitter side clock signal;
  (vi) transmitting, from the phase detector to a phase controller of the field programmable gate array system which is placed within the field programmable gate array, the first output;
  (vii) determining, by the phase controller, interim adjustment information based on the first output; and
  (viii) transmitting, from the phase controller to the adjustable transceiver phase lock loop, the interim adjustment information, wherein, the adjustable transceiver phase lock loop adjusts the second clock signal based on the interim adjustment information and steps (i) through (viii) are repeated until the first output of the phase detector is below the first threshold level;
(f) transmitting, from the serializer to the computational circuitry, the first transmitter side clock signal;
(g) performing, by the computational circuitry, a first set of operations on at least a portion of the first plurality of data items to generate a second plurality of parallel data streams comprising a second amount of data streams, wherein the first set of operations does not include clock domain crossing operations that delay processing of the first set of parallel data streams; and
(h) transmitting off the field programmable gate array system via a second plurality of data pins of the first interface using a serializer a second serial data stream based on the second plurality of parallel data streams.

2. The method of claim 1, wherein the second frequency corresponds to the first frequency.

3. The method of claim 2, wherein the second phase is not aligned with the first phase.

4. The method of claim 1, wherein the second frequency is different than the first frequency.

5. The method of claim 1, wherein the second frequency corresponds to the third frequency.

6. The method of claim 5, wherein the second phase is aligned with the third phase.

7. The method of claim 1, wherein the first set of operations includes at least one of the following:
  (i) an arithmetic operation;
  (ii) a logical operation;
  (iii) a pipeline operation; and
  (iv) a memory access operation.

8. The method of claim 1, wherein the first amount of data streams is the same as the second amount of data streams.

9. The method of claim 8, wherein the first amount of data streams and the second amount of data streams are equal to one of the following:
  (i) eight (8) data streams;
  (ii) ten (10) data streams;
  (iii) sixteen (16) data streams;
  (iv) twenty (20) data streams;
  (v) thirty-two (32) data streams;
  (vi) forty (40) data streams;
  (vii) sixty-four (64) data streams;
  (viii) eighty (80) data streams;
  (ix) one hundred twenty-eight (128) data streams; and
  (x) one hundred sixty (160) data streams.

10. The method of claim 8, wherein the first amount of data streams and the second amount of data streams are equal to two (2) to the power of N, where N is an integer.

11. The method of claim 8, wherein the first amount of data streams and the second amount of data streams are equal to ten (10) times two (2) to the power of N, where N is an integer.

12. The method of claim 8, wherein the first amount of data streams and the second amount of data streams are equal to thirty-three (33) times two (2) to the power of N, where N is an integer.

13. The method of claim 1, wherein at least a portion of the first set of operations is performed prior to step (f).

14. The method of claim 1, wherein at least a portion of the first set of operations is performed after step (f).

15. The method of claim 1, wherein all of the first set of operations is performed after step (f).

16. The method of claim 1, wherein the fourth frequency is equal to x times the fifth frequency, where x is the second amount of data streams.

17. The method of claim 1, wherein the fourth frequency is equal to x times the fifth frequency, where x is half of the second amount of data streams.

18. The method of claim 1, wherein the fourth frequency is a rational multiple of the second frequency.

19. The method of claim 1, wherein the phase difference indicator signal is a pulse signal.

20. The method of claim 1, wherein adjustment information indicates at least one of the following:
  (A) a desired phase;
  (B) a desired frequency;
  (C) a change in phase; and
  (D) a change in frequency.

21. The method of claim 20, wherein adjustment information comprises a voltage.

22. The method of claim 21, wherein adjustment information comprises a digital transmission.

23. The method of claim 1, wherein the adjustment information is used to do at least one of the following:
  (i) set a bias to an oscillator;
  (ii) set a divider ratio; and
  (iii) set a delay.

24. The method of claim 1, wherein the first serial data stream comprises market data, the second serial data stream comprises order entry data, and the first operation comprises a trading algorithm.

25. The method of claim 1, wherein the first serial data stream includes market data and the second serial data stream includes trading data.

26. The method of claim 1, wherein the first clock output pin is operationally connected to the deserializer and the second clock output pin is operationally connected to the serializer; and wherein the phase detector is not on the field programmable gate array and is operationally connected to the first clock output pin and the second clock output pin of the second interface of the field programmable gate array.

27. The method of claim 1, wherein the step of generating the first wire rate clock signal further comprises:
   (A) generating, by the adjustable transceiver phase lock loop, the second clock signal based on the received first clock signal;
   (B) processing, by the adjustable transceiver phase lock loop, the second clock signal based on the interim adjustment information received from the phase controller;
   (C) providing, by the adjustable transceiver phase locked loop, the first wire rate clock signal based on the processing of the second clock signal; and
   (D) transmitting, by the adjustable transceiver phase lock loop, the first wire rate clock signal to the serializer.

28. The method of claim 1, wherein the second clock signal is generated further based on the adjustment information and the second clock signal is the first wire rate clock signal.

29. The method of claim 1, wherein step (b) further comprises:
   (i) receiving, by the first plurality of data pins of the first interface of a field programmable gate array in the field programmable gate array system, the first serial data stream;
   (ii) transmitting, from the first plurality of data pins of the first interface to the deserializer in the field programmable gate array, the first serial data stream;
   (iii) transmitting, from the first reference clock pin in the first interface to the deserializer, the first clock signal;
   (iv) generating, by the deserializer, the first receiver side clock signal, based on the first clock signal; and
   (v) converting, by the deserializer, the first serial data stream into the first plurality of parallel data streams.

30. The method of claim 1, wherein step (h) further comprises:
   (i) transmitting, from the computational circuitry to the serializer, the second plurality of parallel data streams;
   (ii) converting, by the serializer, the second plurality of parallel data streams into the second serial data stream; and
   (iii) transmitting, from the serializer off the field programmable array system via the second plurality of data pins of the first interface, the second serial data stream.

* * * * *